US008089353B2

(12) United States Patent
Tarng et al.

(10) Patent No.: US 8,089,353 B2
(45) Date of Patent: Jan. 3, 2012

(54) 4LESS—XTALESS, CAPLESS, INDLESS, DIOLESS TSOC DESIGN OF SOC OR 4FREE—XTALFREE, CAPFREE, INDFREE, DIOFREE TSOC DESIGN OF SOC

(76) Inventors: Min Ming Tarng, San Jose, CA (US);
Mei Jech Lin, San Jose, CA (US); Eric Yu-Shiao Tarng, San Jose, CA (US);
Alfred Yu-Chi Tarng, San Jose, CA (US); Angela Yu-Shiu Tarng, San Jose, CA (US); Jwu-Ing Nieh, San Jose, CA (US); Huang-Chang Tarng, San Jose, CA (US); Shun-Yu Nieh, San Jose, CA (US)

( * ) Notice: Subject to any disclaimer, the term of this patent is extended or adjusted under 35 U.S.C. 154(b) by 588 days.

(21) Appl. No.: 12/079,179

(22) Filed: Mar. 25, 2008

(65) Prior Publication Data
US 2009/0002085 A1 Jan. 1, 2009

Related U.S. Application Data

(63) Continuation-in-part of application No. 11/500,125, filed on Aug. 5, 2006, now Pat. No. 7,525,392, and a continuation-in-part of application No. 11/593,271, filed on Nov. 6, 2006.

(51) Int. Cl.
*G08B 19/00* (2006.01)
(52) U.S. Cl. .. 340/521; 311/84 M; 311/167; 331/108 C; 331/108 D; 340/531; 379/42
(58) Field of Classification Search .............. 331/108 C, 331/108 D; 379/42; 348/241, 311; 311/84 M, 311/167
See application file for complete search history.

(56) References Cited

U.S. PATENT DOCUMENTS

| | | | | |
|---|---|---|---|---|
| 6,191,468 B1 * | 2/2001 | Forbes et al. | ................ | 257/531 |
| 7,061,337 B2 * | 6/2006 | Partovi et al. | ................ | 331/109 |
| 7,289,881 B2 * | 10/2007 | Ota et al. | .................... | 700/245 |
| 7,307,486 B2 * | 12/2007 | Pernia et al. | ................ | 331/173 |
| 2004/0119590 A1 * | 6/2004 | Wang | ................... | 340/539.22 |
| 2004/0135913 A1 * | 7/2004 | Shinotsuka et al. | ......... | 348/308 |
| 2005/0212611 A1 * | 9/2005 | Muthali et al. | ........... | 331/117 R |
| 2005/0231297 A1 * | 10/2005 | Aparin et al. | ............. | 331/177 V |
| 2006/0092010 A1 * | 5/2006 | Simon et al. | ................ | 340/521 |
| 2007/0256105 A1 * | 11/2007 | Tabe | ............................ | 725/78 |
| 2008/0094271 A1 * | 4/2008 | Tooyama et al. | ........... | 341/155 |
| 2009/0146751 A1 * | 6/2009 | Pernia et al. | ............. | 331/117 R |
| 2009/0310007 A1 * | 12/2009 | Matsui et al. | ................ | 348/311 |
| 2010/0106029 A1 * | 4/2010 | Fraden | ........................ | 600/493 |

* cited by examiner

*Primary Examiner* — Robert Pascal
*Assistant Examiner* — Jeffrey Shin

(57) ABSTRACT

4Less-Xtaless, Capless, Indless, Dioless TSOC Design of SOC or 4Free-Xtafree, Capfree, Indfree, Diofree TSOC Design of SOC is the True System On Chip Design of Smart Mobile Sensort(SMS) for Sevice Of Community(SOC). Xtaless is Xtaless Clock Generator. Capless has the Capless Toggle and Capless LDVR. Capless Toggle is the de-bouncing circuit. Capless LDVR is the Low Drop Voltage Regulator. The Indless SM adopts the PHM of Pulse Hybrid Modulation of the PWM and PFM. The LDVR and SM can share the same driver. Dioless is the Dioless TRNG which the True Random Number Generator. The Xtaless Clock Generator adopt the PVTNAH design which is Process. Voltage, Temperature, Noise. Aging and Humidity compensation design. The Xtaless Clock using LC resonator of which LC resonator is self-compensation LC resonator over the temperature and humidity. The smart USB switch for SOC design can save the portable battery power. The Triple-Mode Camera for SOC design has the ultra-wide dynamic range for the still camera mode, video camera mode and surveillance camera mode.

12 Claims, 47 Drawing Sheets

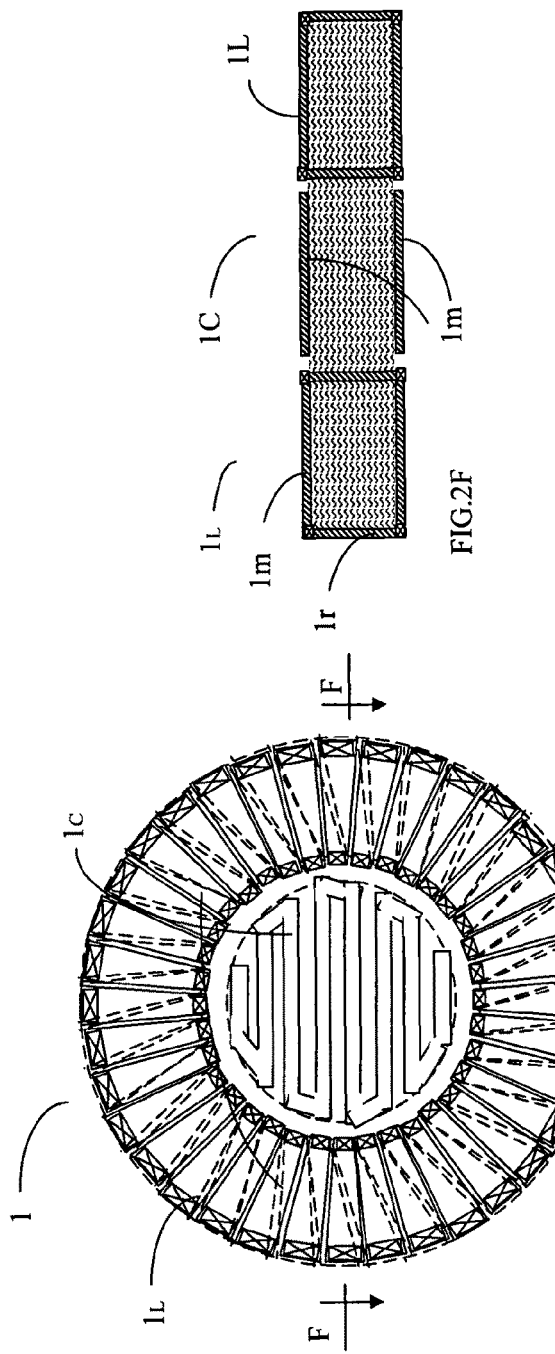
FIG.2E
FIG.2F
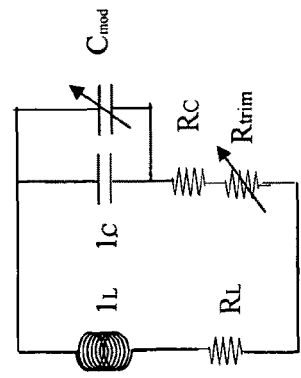
FIG.2G
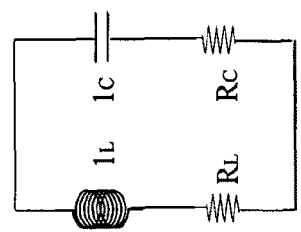
FIG.2H
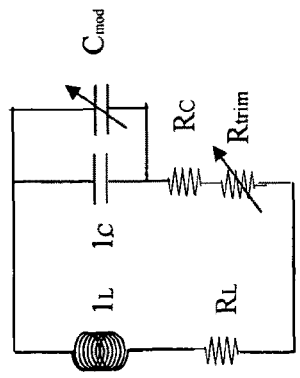
FIG.2I

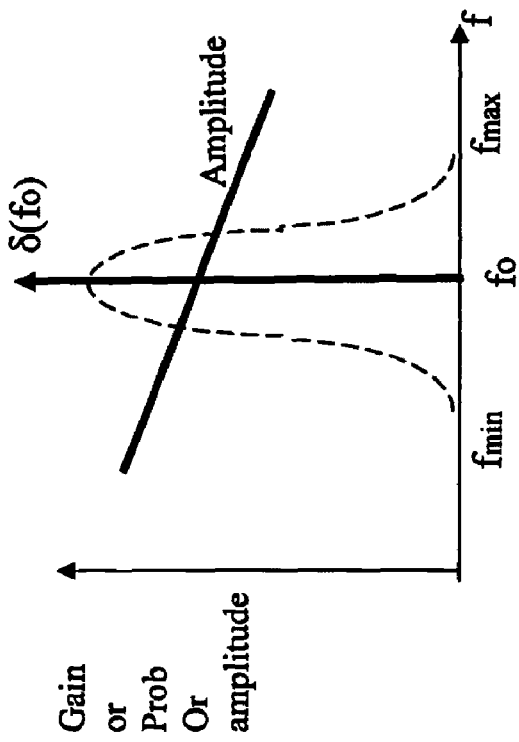
FIG.3G
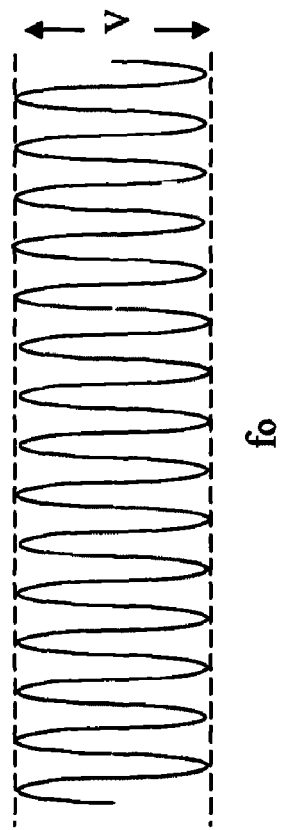
FIG.3E
$$A_u \xrightarrow{} I_u$$
$$\xrightarrow{G_{max}} G = \frac{V}{I} \xrightarrow{} \delta(f_o)$$
$$A_v \xrightarrow{} I_v$$
FIG.3F

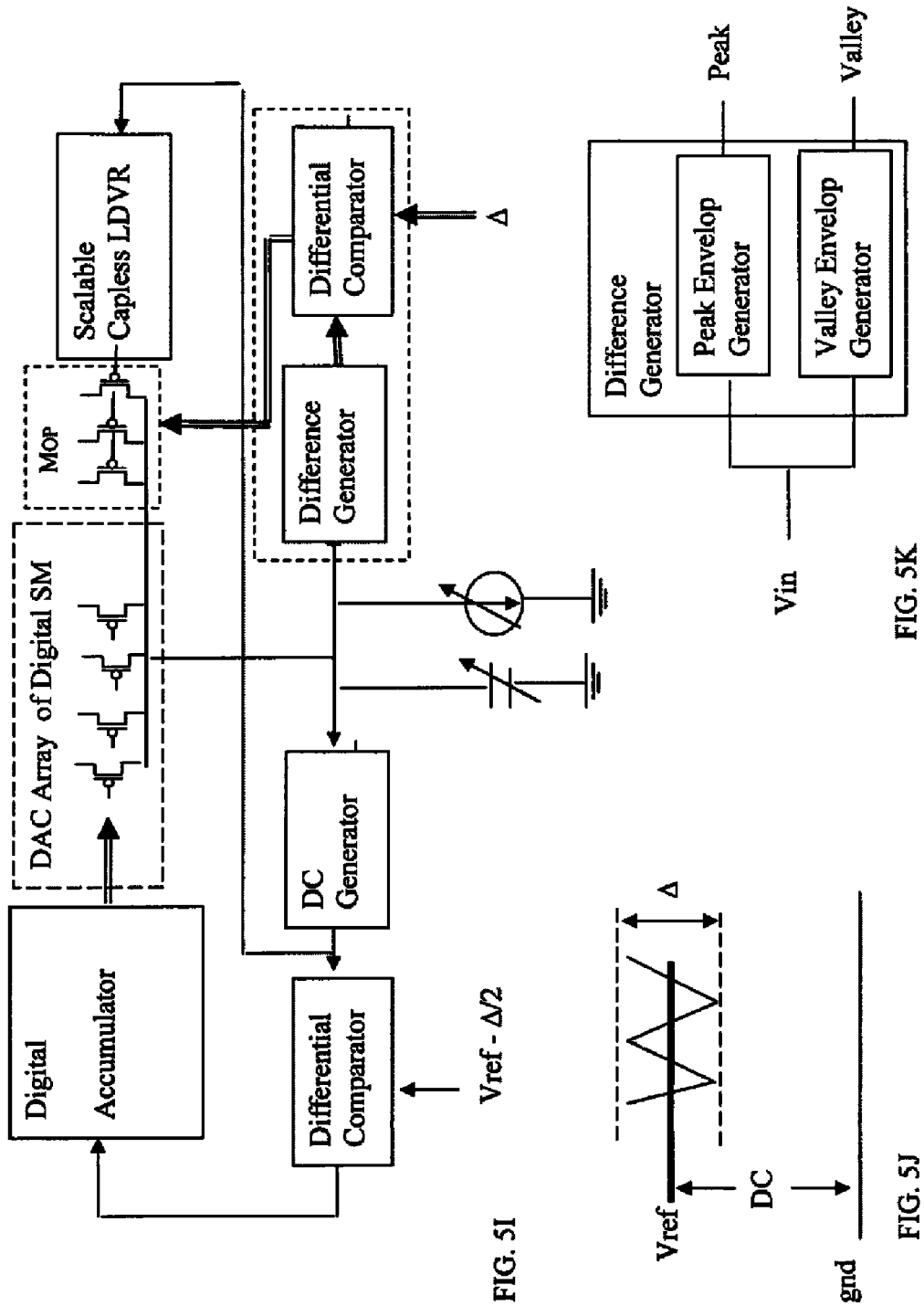

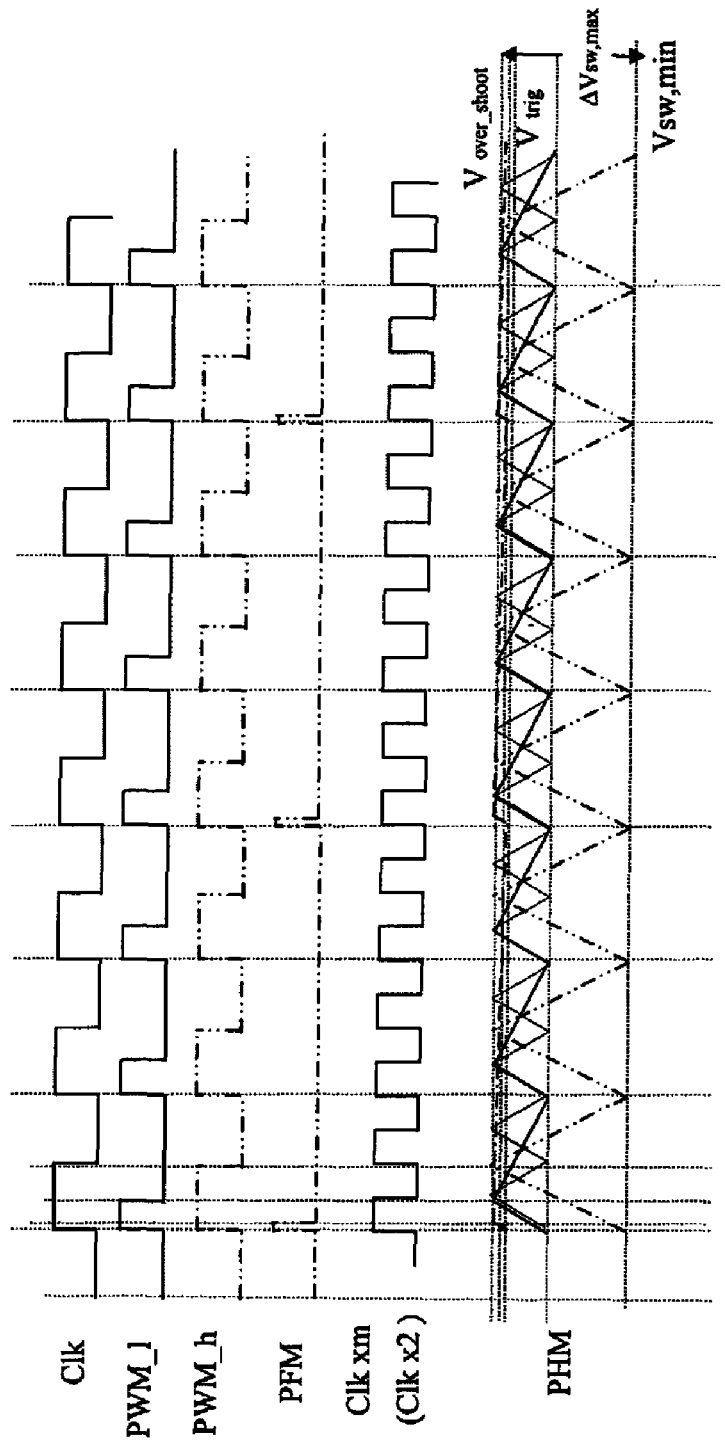
FIG. 6E
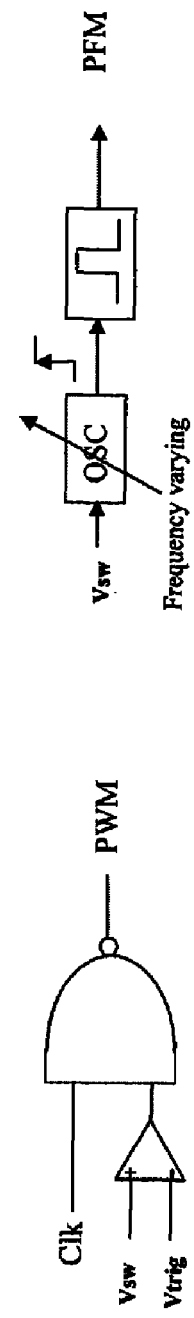
FIG. 6F
FIG. 6G a: Vpeak;  b:Valley;  $\Delta Vsup = (Vpeak - Valley)$ $(a-b) > (c-d) = \Delta Vref$ : $(a-b)-(c-d)$ : $(a+d) > (b+c)$
$(a-b) < (c-d) = \Delta Vref$ : $= \Delta Vref$ : 0

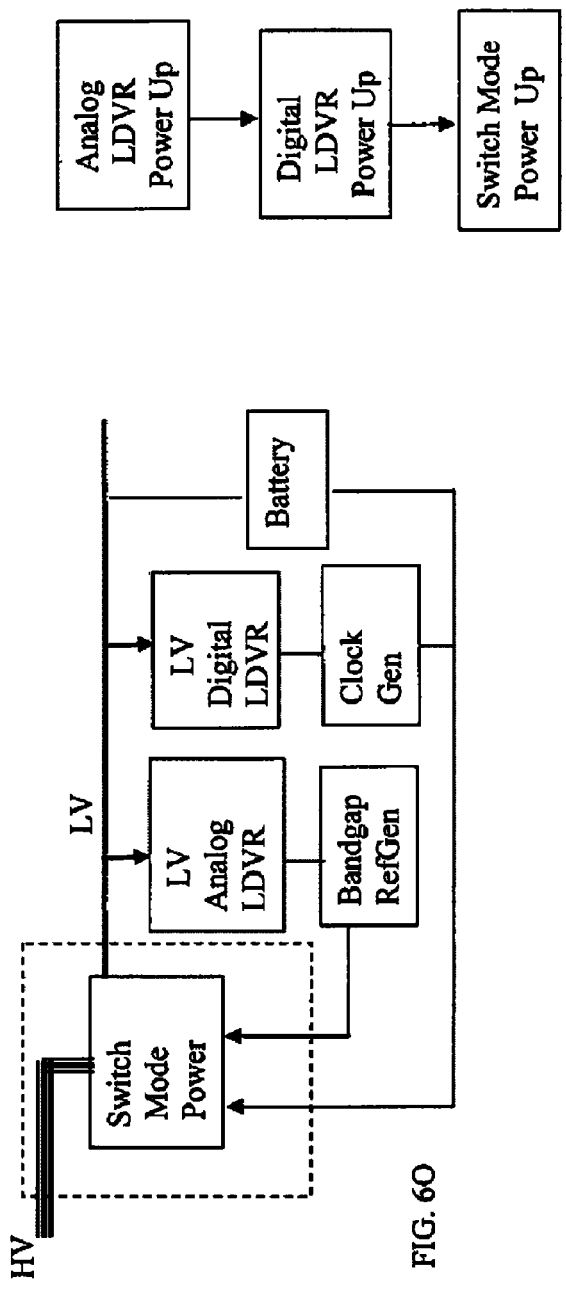
FIG. 6O
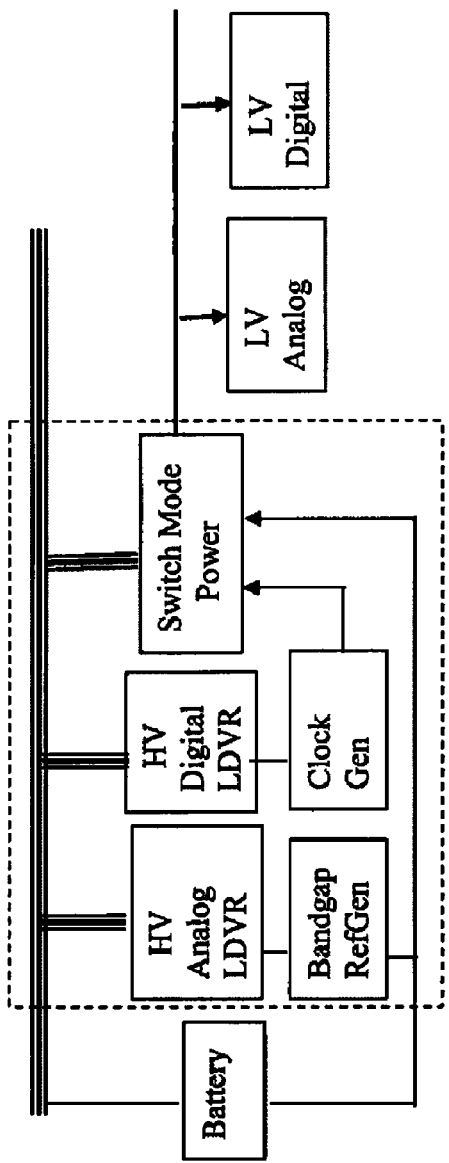
FIG. 6P
FIG. 6Q

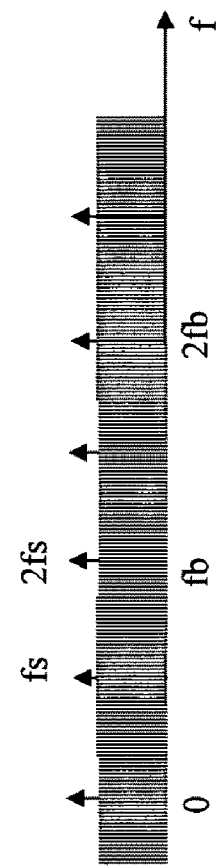
FIG. 7H
FIG. 7I
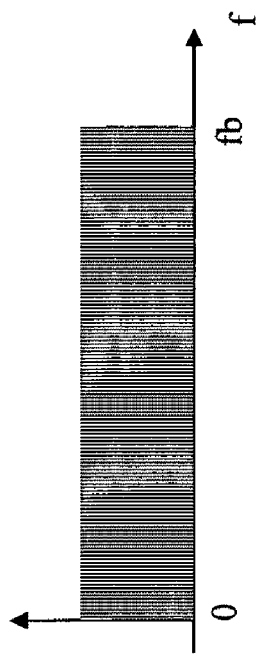
FIG. 7J
FIG. 7K
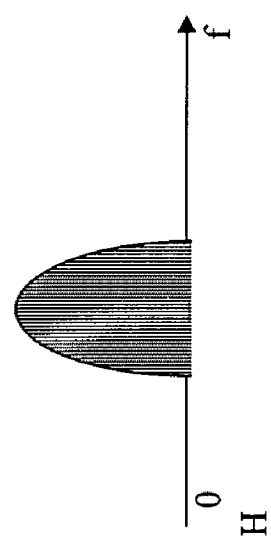
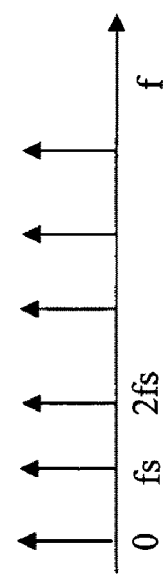

Nquantize, Nground,
Nthermal, Ndiode, Nbipolar,

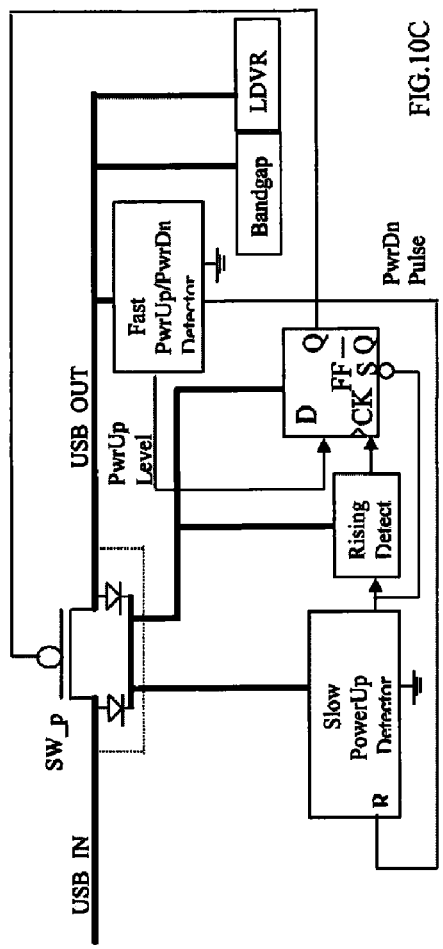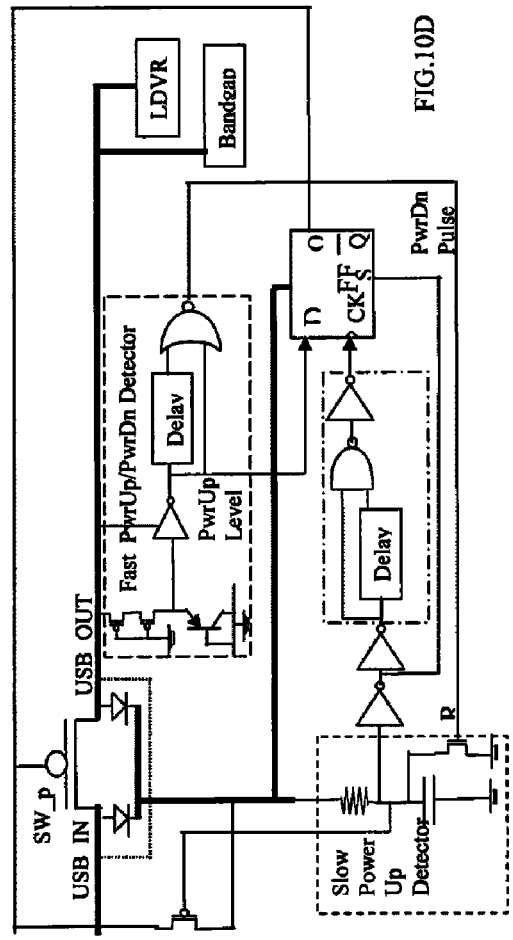

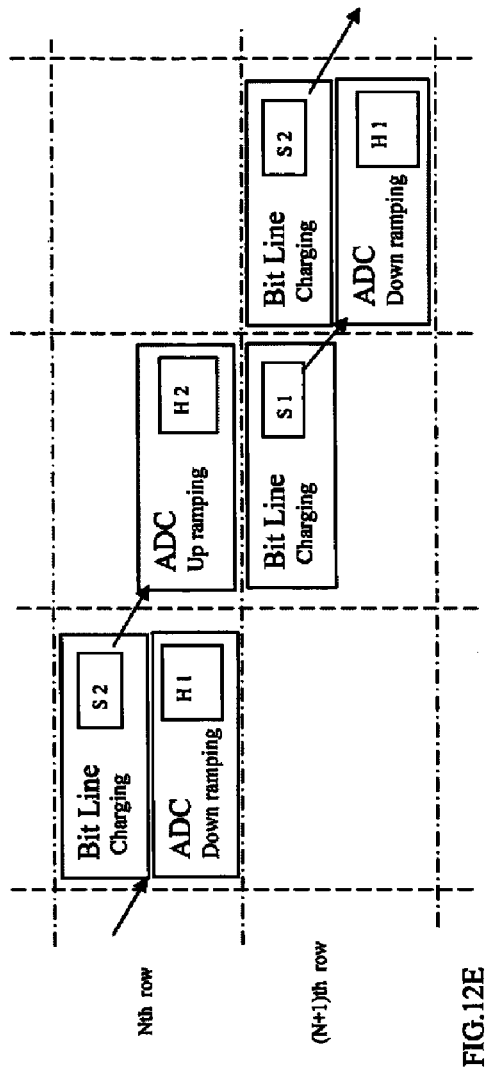
FIG.12E
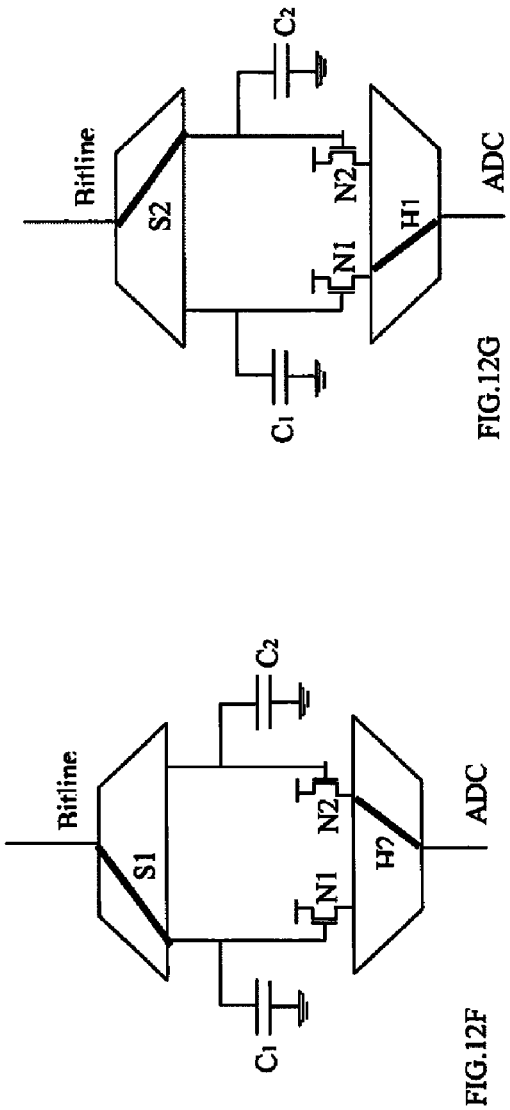
FIG.12G
FIG.12F

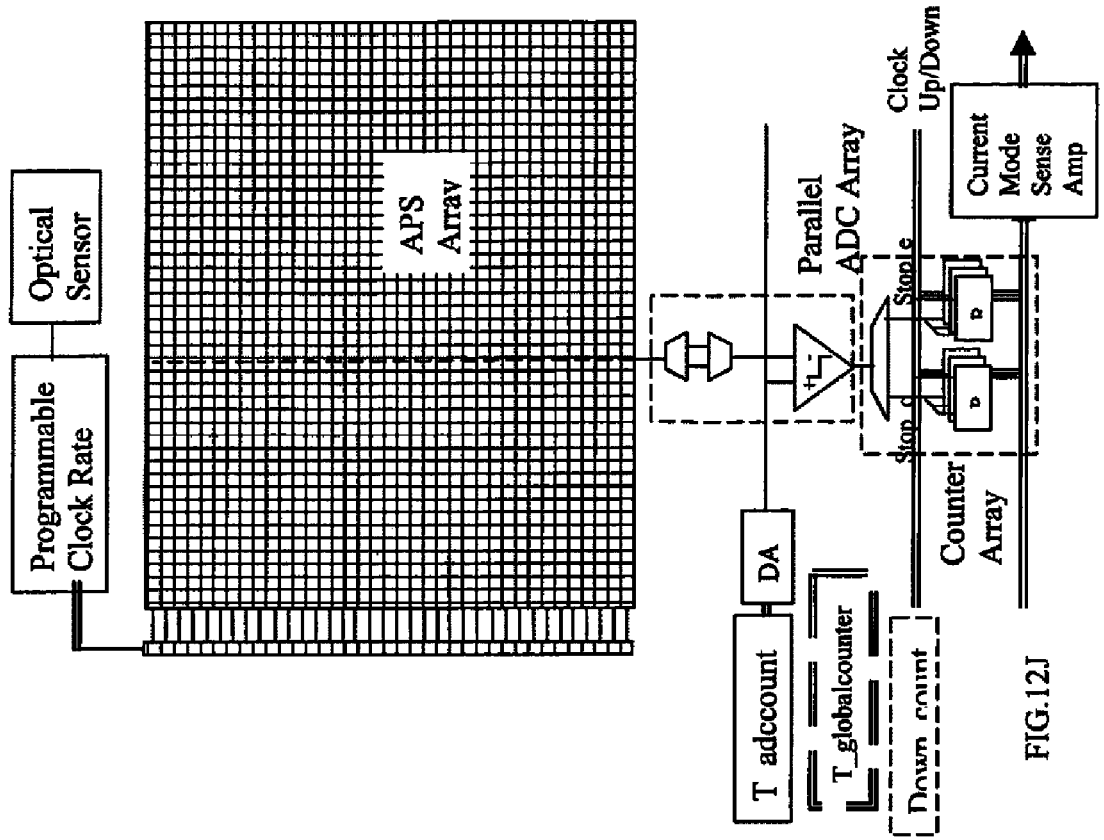
FIG.12J
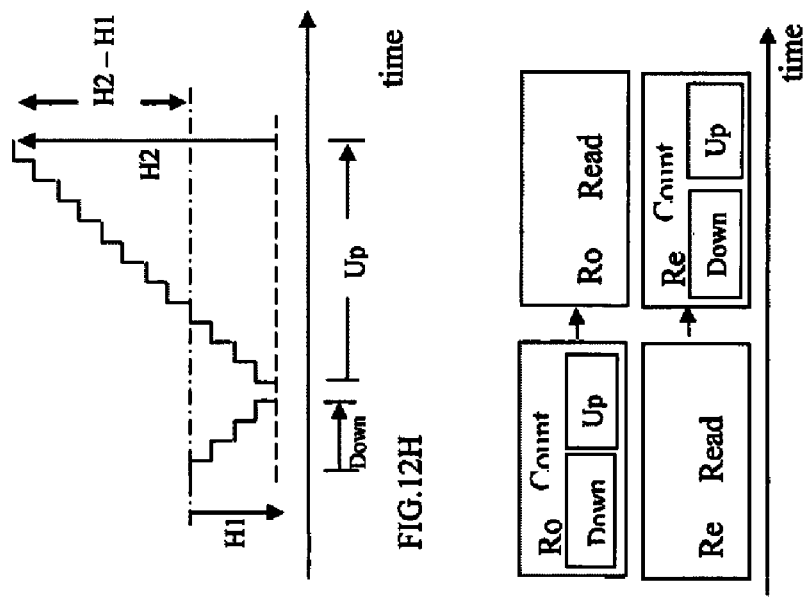
FIG.12H
FIG.12I

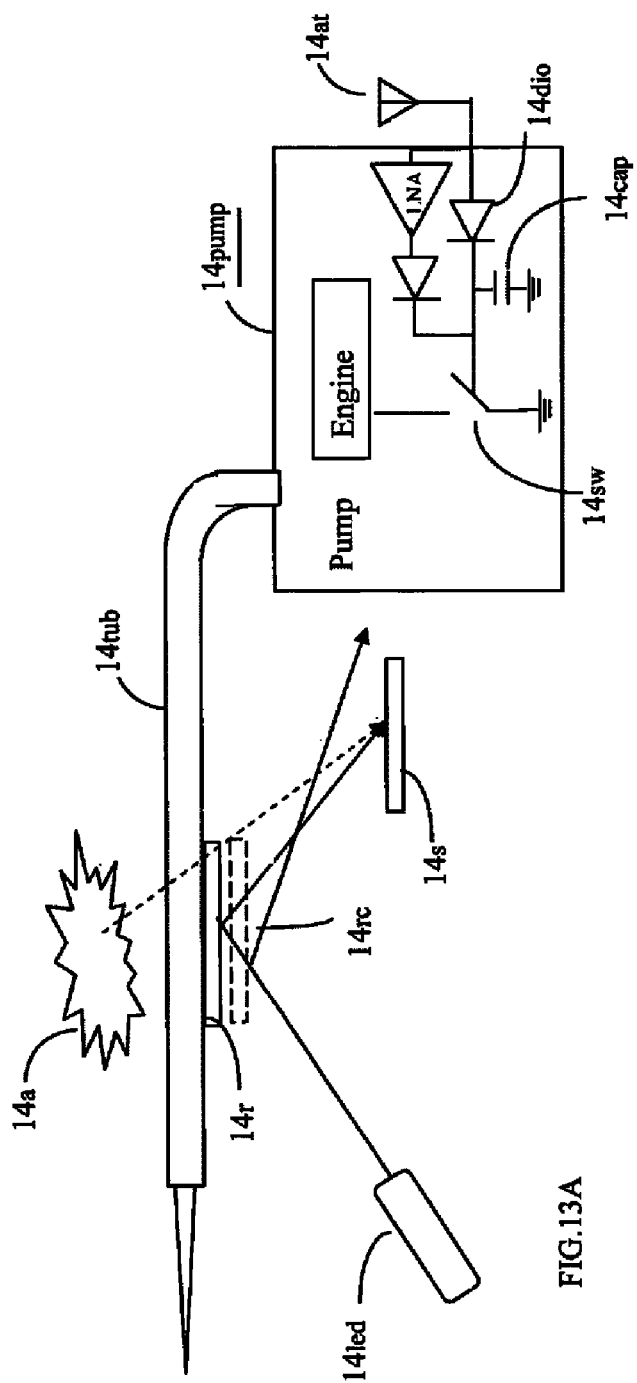
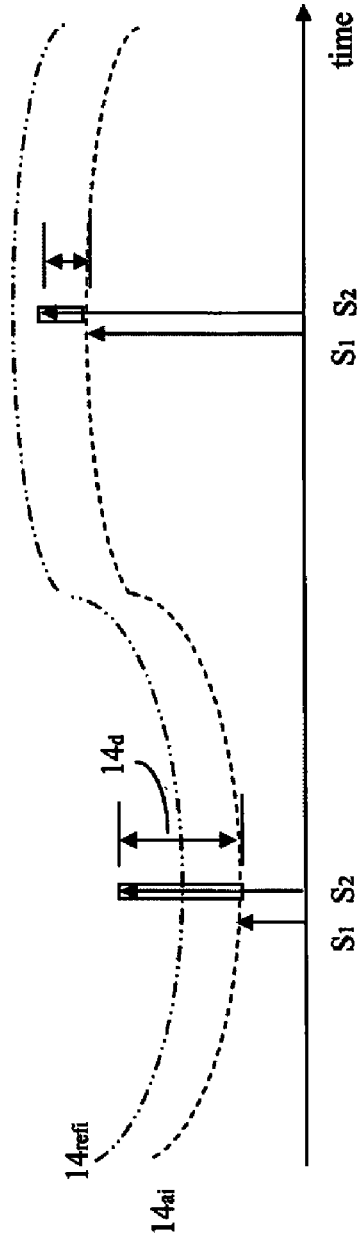
FIG.13A
FIG.13 B

4LESS—XTALESS, CAPLESS, INDLESS, DIOLESS TSOC DESIGN OF SOC OR 4FREE—XTALFREE, CAPFREE, INDFREE, DIOFREE TSOC DESIGN OF SOC

This is a Continuation in Part application claims priority of U.S. patent application Ser. No. 11/500,125, filed Aug. 5, 2006 now U.S. Pat. No. 7,525,392 and U.S. patent application Ser. No. 11/593,271, filed Nov. 6, 2006 which are herein incorporated by reference in their entirety.

BACKGROUND

1. Field of Invention

The project of TSOC Design of SOC is to develop the Security-Of-Community with the True-System-On-Chip technology. Due to the cost issue, we need the highly integrated and commercialized System-On-Chip SOC design to develop for the Security-Of-Community SOC.

NL-SOC Design has the Clock Chip, Radio Chip, Camera Chip, TV Chip, and Optical Mouse Chip. To save power, the power management has the modes has power down, sleep, dose, normal, turbo. The power sequence has POR, POS, and PDS. The mixed modes design has the mixed Signal, mixed voltage and mixed power. For the power sequence of the mixed mode circuits, it has the mixed voltage POS and PDS. Before, the electronic circuit is system-on-board. In the True-System-On-Chip (TSOC) era, all the components of the board should also implemented on the CMOS chip. However, due to the incompatibility of the component and the CMOS, not all the components and circuits can be integrated on the same CMOS chip. There are still having the crystal of the crystal clock circuit (Xtal Clock), the inductor of the switch mode (SM) power supply, the capacitor of the low drop voltage regulator (LDVR), the capacitor of the de-bounce circuit and the avalanche diode of the true random number generator cannot be integrated in the same CMOS chip.

The 4Less-Xtaless, Capless, Indless, Dioless SOC Design or 4Free-Xtafree, Capfree, Indfree, and Diofree SOC Design is to get rid of all the on-board external components of the SOC design. In other words, the Xtaless Clock chip has no crystal to be the reference. It can generate the accurate reference clocks itself. The Capless LDVR is the low drop voltage regulator having no external on-board capacitor. The Indless SM is the switch-mode power supply having no external on-board inductor. The Dioless TRNG is the true random number generator has no external avalanche diode and it still can generate the true random number. Since all the 4Less-Xtaless, Capless, Indless, Dioless SOC Design or 4Free-Xtafree, Capfree, Indfree, Diofree SOC Design has no external on-board components, all the 4Less-Xtaless, Capless, Indless, Dioless SOC Design or 4Free-Xtafree, Capfree, Indfree, Diofree SOC Design can be system integrated on one single chip to be the true SOC, TSOC. For the 4-less TSOC design, we develop the innovative Self-Compensated SC-PVTANH design methodology. In PVTANH, P is the Process variation; V is the Voltage variation; T is the Temperature variation; A is Aging variation; N is the Noise variation; H is the Humidity variation. There are two type resonators, LC resonator and RC resonator. Both need the Self-Compensated SC-PVTANH to compensate the temperature and humidity variations at the same time. For the SC-PVTANH design methodology, the BGR Bandgap Reference needs to provide the Vbg, Vptat, Vctat,Ibg, Iptat, and Ictat. The bandgap reference is the Vbg & Ibg Bandgap Reference Generator.

In Xtaless Clockchip, the LC resonator is no more to be the free-running architecture. It adopts the constant-gain-boost-Q architecture. In Xtaless Clockchip, the RC resonator is no more to be the fixed triggering architecture that doesn't include the PVT compensation in the feedback loop. It adopts the constant-period-delay-adaptive-triggering architecture to have the PVT compensation in the feedback loop. NL-SOC is Noiseless System On Chip design. P&N Management is the Power & Noise Management of NL-SOC design in the TSOC. It is the 3M design of mixed signal, mixed voltage and mixed power. There are power transient problems of POS (Power On Sequence), POR (Power On Reset) and PDS (Power Down Sequence). For the NL-SOC Noiseless System On Chip design, there is P&N Power and Noise Management. P&N is the abbreviation of Power & Noise. The formalization of P&N Management Problem is the Capless LDVR problem and Indless SM problem, etc.

Capless LDR has the Hybrid Capless-Capfree LDVR (Low Drop Voltage Regulator) and LDIR (Low Drop Current Regulator). The CF-LDVR Capacitor-Free Low Drop Voltage Regulator is for P&N Management.

PHM-SMR is Pulse Hybrid Modulation Adaptive Switch Mode Regulator. The PHM-SBKR is the Pulse Hybrid Modulation Adaptive Switch Mode Buck Regulator. The hybrid mode PHM Controller is one single controller with the unified approach of PWM and PFM. PHM (Adaptive Pulse Hybrid Modulation) is load adaptive to always have the optimum operation. The PHM adopts the sliding control, which is continuous control, no ADC, no DAC. From zero frequency to maximum frequency, PHM has the full range working capability. The PHM Pulse Hybrid Modulation has both the clock period TCK varies and the duty cycle TD varies. PHM is duty-cycle-less. PHM is always at the optimum working condition to have the maximum power efficiency. One Cycle in one clock. PHM can work for both heavy load and light load. PHM is load adaptive. It has no gearshift, and no arbitrator.

Dual Mode SM is the Switch Mode Power Supply having both PWM and PFM controllers. Hybrid Mode APHM-SMR Adaptive Pulse Hybrid Modulation Switch Mode Regulator having only one PHM controller. PHM has both Boost and Buck types SM power supply. For the Buck type APHM-SBKR Adaptive Pulse Hybrid Modulation Switch Mode Buck Regulator, it has both the VCBR (Voltage Controlled Buck Regulator) and ICBR (Current Controlled Buck Regulator).

P&N SOC Design Platform needs the Power Noise Calibration & Simulation & Test. It needs to recognize the P&N Management Problem and make the design evaluation for existed LDO, etc. The laboratory test setup needs to differentiate the ground noise and the oscillation of the LDO 2. Description of Prior Art Since the SOC of the FSOC (False-System-On-Chip) concept is introduced, the digital circuit and analog circuit even the RF circuit are integrated on one single chip. There are the CameraChip, RadioChip, (Optical) MouseChip and Clock-Chip, etc. The design methodologies have the mixed-signal design, mixed-mode design, mixed-voltage design, CoSim and CoEm, etc. However, in the lower level of the circuit itself, there is no innovation to make the design to be the TSOC (True-System-On-Chip). Further, in the upper level of system integration doesn't consider the SOC of the Security Of Community, either. The traditional system integration uses the segmental approach. Now, we use the vertical integration approach.

For the Xtaless Clock problem, the traditional xtal clock circuit has one external crystal. The crystal cannot be integrated in the CMOS chip. The high Q resonator needs the high-Q inductor L component such as the crystal has Q=1, 000,000. For the on-chip inductor, the inductor has Q=10 only. It is impossible to make the clock chip with the on-chip inductor. Later, there are a lot of efforts trying to use MEM to replace the crystal. However, for the MEM type Xtaless clock chip, not to mention the addition of the process steps, there are the aging of the mechanical stress problem. So, the smarter companies abandons the mechanical MEM approach and adopt no mechanical parts LC resonator type electronic circuit approach. However, they meet the fundamental problems of the low Q of the on-chip inductor problem. Even the interpretation of the papers were not correct, however, it works and proves to be a correct way to approach the Xtaless Clock Chip. But, there are the problems of (1) the inaccuracy of the modeling the inductance, (2) the inaccuracy due to the humidity variation. So far, they fail to recognize the problem that they don't know how to handle these problems.

Since the LC oscillator needs the special RF design techniques. Having only the analog design experience, a lot of companies adopt the traditional RC or IC resonator. However, the traditional RC resonator architecture is for the slow clock being less than 1 MHz. The architecture completely neglects the PVT variations of the digital switching delay circuit in the feedback loop. Today, the company tries to use the same architecture for the 250 MHz to have the less than 4% period variation over PVT variation. They burned a lot of power and barely marginally meet the requirement of the specification. Now the customer asked for 1% variation over 250 MHz, they just don't know how to satisfy the requirement of the customers. Not to mention that they don't know the humidity also playing the important role in the high accurate clock accuracy. They still have far way to go.

The LDR (Low Drop Regulator) has the problem of In-Rush Current, Slew-Rate Voltage, Over-Voltage Protection, etc. The LDVR (Low Drop Voltage Regulator) has the stability problem. The existed capfree LDVR research has (1) NMC: Nested Miller Compensation, GBW=0.4 MHz Phase Margin=61 degrees; (2) DFCFC: Damping Factor Control Frequency Compensation GBW=2.6 MHz Phase Margin=43 degrees; (3) PFC: Positive Feedback Compensation GBW=2.7 MHz Phase Margin=52 degrees; (4) AFFC: Active Feedback Frequency Compensation GBW=4.5 MHz Phase Margin=65 degrees; (5) DLPC: Dual Loop Parallel Compensation GBW=7 MHz Phase Margin=46 degrees; (6) SMC: Single Miller Capacitor Compensation GBW=4.6 MHz Phase Margin=57 degrees; (7) SMFFC: Single Miller Capacitor Feed Forward Compensation GBW=9 MHz Phase Margin=57 degrees. However, all of them still have the similar stability problems to work in the varying loading conditions.

The Switch Cap Power Supply includes the Charge Pump, Voltage Doubler, Voltage Multiplier and Voltage Fractional, etc. The power efficiency is low. So, for the battery efficiency, it must adopt the SM (Switch Mode) power supply. The SM has two kinds, PWM and PFM.

The PWM Pulse Width Modulation has TCK=const and TCK=Tref. The TD varies and Duty Cycle=TD/TCK. The PWM is one cycle having multiple clocks and work for heavy load. The PFM Pulse Frequency Modulation has the TCK varies as TCK=n*Tref and TD=const. PFM is one Cycle with one clock and work for light load. To meet the dynamic varying power requirements of the different modes, it has the dual mode. The Dual Mode is PWM+PFM. It has the dual controllers of PWM and PFM. The PWM controller is for heavy load. The PFM Controller is for light load. It has to add another arbitrator to arbitrate which modes will be used.

SUMMARY

The 4-less or 4-Free TSOC technology for the SOC application is designed with the most advanced SC-PVTANH methodologies. It is the first true Green Chip Design. The Green Chip of the SOC is designed with the TSOC. The TSOC is the true system-on-chip. All the components are merged in the chip. The Xtaless Clock doesn't need to have the external crystal. It saves pins and system cost with the reliability. The Capless LDVR doesn't need the external capacitor. The Indless SM doesn't need the external inductor. The Dioless TRNG doesn't need the external Avalanche diode. The TSOC can provide the surveillance capacity for the SOC security of community.

BRIEF DESCRIPTION OF THE DRAWINGS

FIG. 13 is the emergency pumping system for the SOC security of community; (A) the wireless toggle activating and clogging detectable smart pumping system; (B) is correlated double sampling in the open environment for the detection for clogs.

DETAILED DESCRIPTION

As shown in FIG. 1, the SOC (Security Of Community) is implemented with the 4Less TSOC (True System On Chip) technology. The TSOC has all the on board components been eliminated and the on-board circuits been replaced with the different implementations of the on-chip innovative new circuits. In contrast to the PSOC (Pseudo System On Chip) still having a lot of on-board components, the TSOC is referred to be True-SOC. The TSOC has the completely different circuit implementations for the same functions of the PSOC. To prevail the SOC, the system cost must be cheap. However, the cost of the on-board components is much higher than the chip itself. So, the only solution is the TSOC to have the entire on-board component been eliminated. Without the TSOC technology, the SOC (Security Of Community) is just a dream.

Figure 1A:
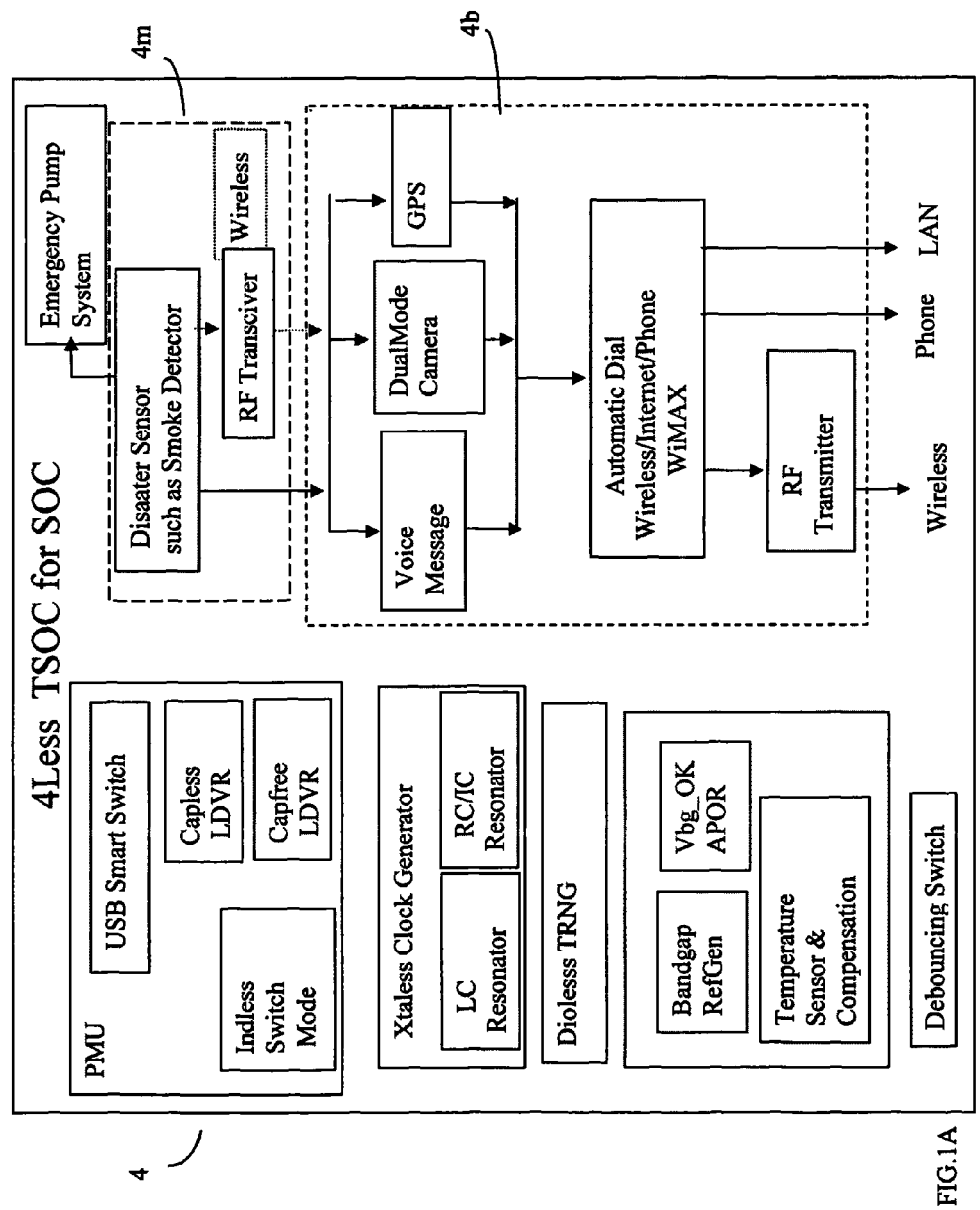
FIG. 1 (A) is the top-level block diagram of the 4Less/4Free TSOC design for SOC Security of Community; (B) is signal flow block diagram of SOC, Security of Community; (C) is the illustrative diagram of the SOC, Security of Community.

For the SOC, all the supporting circuits are as shown in FIG. 1A. The Xtaless Clock is the on-chip clock generator having no external crystal to generate the accurate reference clock having the quality of the crystal clock. The PMU (Power Management Unit) has the Capless LDVR (Low Drop Voltage Regulator), the Capfree LDVR and Indless SM (Switch Mode Power Supply). The Capless LDVR and Capfree LDVR are the LDVRs having no external on-board capacitor. The Indless SM is the switch mode power supply having no external on-board inductor. The Dioless TRNG is the True Random Number Generator having no external Avalanche diode. The VbgOK and APOR generator is the APOR (Analog Power On Reset) signal being generated by the Vbg_OK signal.

Figures 1B, 1C:
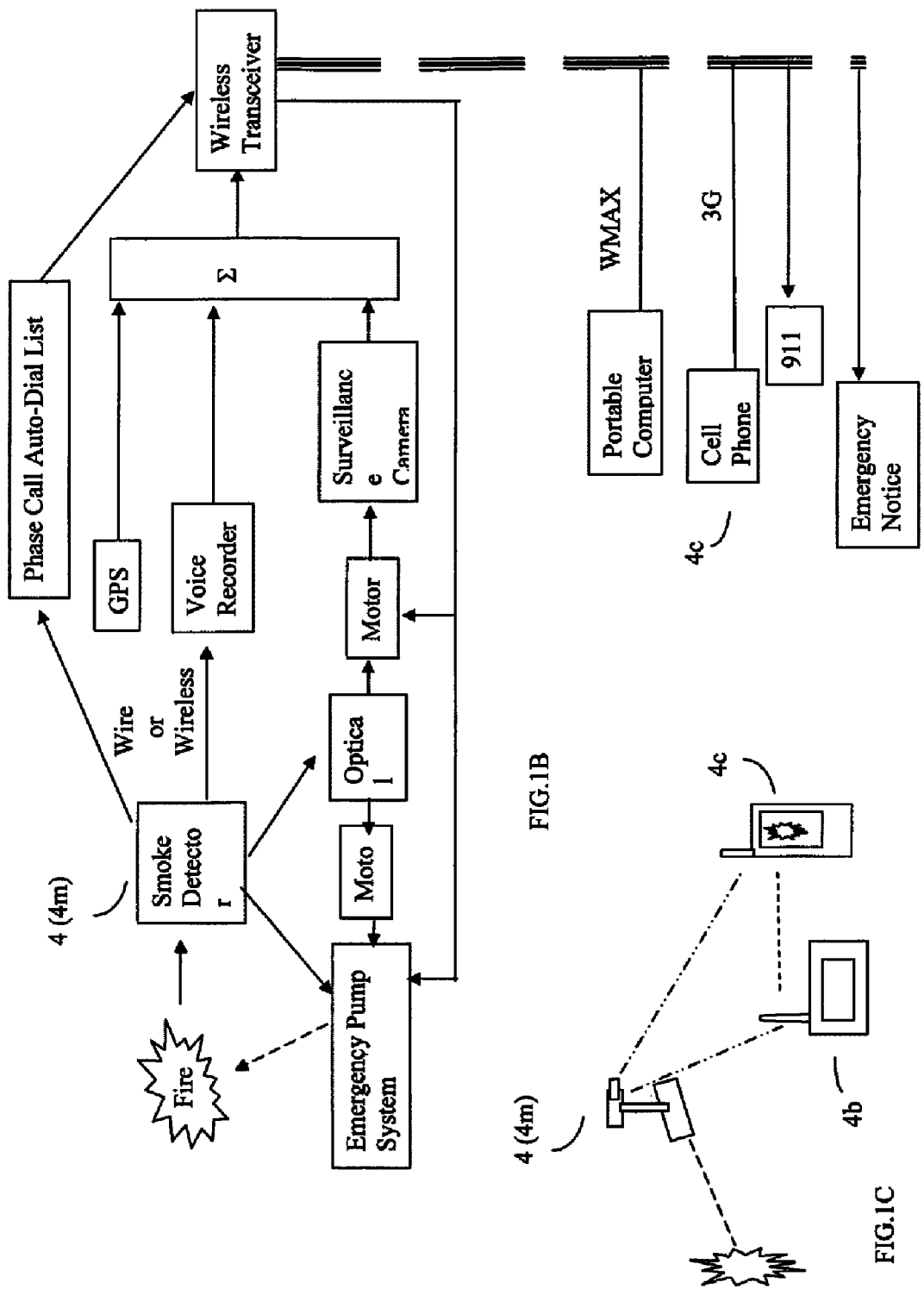

The disaster sensor can be any monitoring disaster sensor. Here we use the fire disaster monitoring sensor, smoke sensor, as one illustrative example. As shown in FIG. 1B, the smoke sensor detects the smoke of the fire. The mobile smoke detector uses the wire or wireless to command the communicative base to activate the voice message, dual mode camera and GPS and the automatic dial, etc to report where the disaster and what the disaster to the emergency center, the house owner, 911, etc which has been programmed in the autodial list. The house owner, etc also can issue the command to the SOC to drive the motors to point the triple-mode Surveillance camera and the emergency-pumping extinguisher to the firing disastrous place. FIG. 1C is the illustrative view of the SOC system. The smoke sensor can be either a mobile station 4m or an entire independent workstation 4. The cellular phone 4c shows the disaster scene. The house owner can use the keyboard to issues the command to the surveillance camera to take the views at the entire scene and the emergency pump to eject the extinguisher on the fire.

Now, we make the analysis of the individual components in the SOC. The oscillator has the LC and RC/IC oscillators. Today's accurate reference clock circuit is the crystal clock circuit. It is high Q mechanical oscillator to operate between the 25 MHz to 75 MHz. It cannot run in GHz that it needs PLL to boost up the frequency that it induces the phase noises to reduce the performance. However, the crystal cannot be integrated on the CMOS chip. So, the design trend is to design the clock circuit without the crystal to be Xtaless. The Xtaless clock is the clock circuit has no crystal that it can be integrated on CMOS.

Figure 2A:
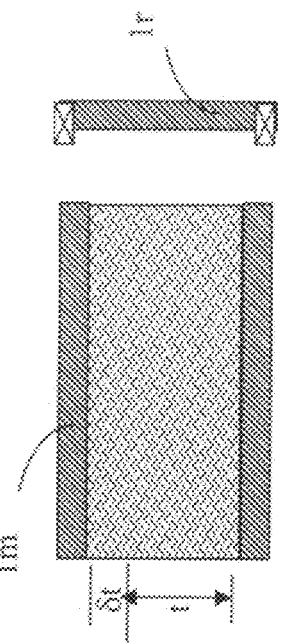
FIG. 2 shows the self-compensated design principles; (A) (B) shows the self compensated for the L, R, and C; (A) is the section view of the basic components of the capacitor, inductor and resistor; (B) is the section view of the basic components of the capacitor, inductor and resistor having the temperature variance and humidity variance combinatory effect; (C) is the two dimensional temperature and humidity combinatory variances effect curves; (D) is the SC (Self-Compensated) design of the resistor; (E) The SC design of the inductor having the closed toroid shape and resistor layout style resistive capacitor; (F) is the sectional view of the SC design of the inductor having the toroid closed shape and resistor type capacitor taken along the line F-F in FIG. 2E; (G) is the schematics of the fundamental SC-LC resonator; (H) is the SC-LC resonator with the self-compensated SC-R type resistors RL and RC; (I) is the self-compensated SC-LC resonator having the trimming bits for adjustment of the minor deviation after the self-compensation.
Figure 2B:
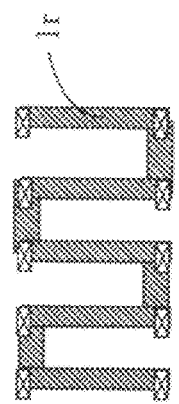
Figure 2C:
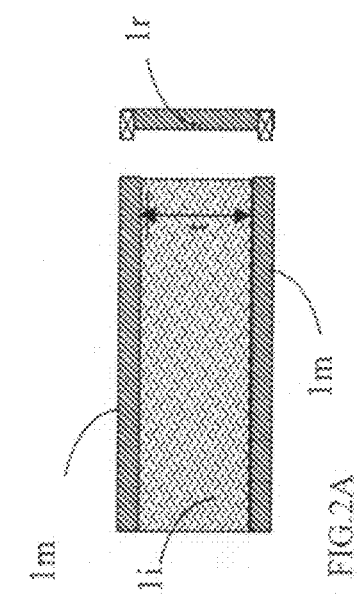

Both the temperature and humidity will change the electronic characters of the chip. As shown in FIG. 2A, before the variation of the temperature and/or the humidity, the thickness of the isolation is t. As shown in FIG. 2B, the temperature increases and/or the humidity increases, the thickness of the insulation increases to be t+δt. As we apply the fundamental principle of the thickness variation of the temperature and humidity to the R, L and C, as shown in FIG. 2C, δt/t causes the variance of increase the inductance of δL/L and the increase of the resistance of δR/R and decrease the capacitance to be −δC/C. It is noted that the δC/C decreases and both the δL/L and δR/R increase. It is the fundamental of the self-compensation of the RC resonator and LC resonator. Furthermore, it is very complex 2-D temperature-humidity that it is impossible for the temperature trimming bits and the humidity trimming bits to make the temperature-Humidity (TH) compensation. It must use the self-compensation techniques for the RC and LC.

Figure 2D:
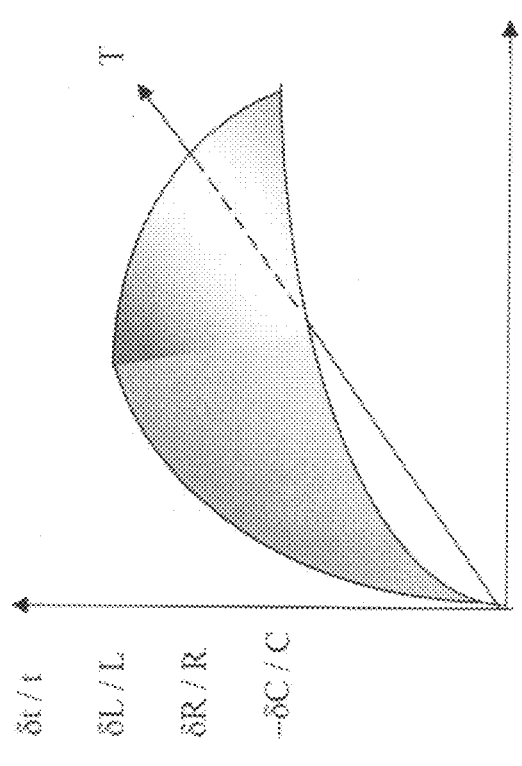

For the RC resonator, the RC constant after the increase of the temperature and/or humidity is $(R+\delta R)(C+\delta C)=RC(1+\delta R/R)(1+\delta C/C)=RC[1+(\delta R/R+\delta C/C)+(\delta R/R)(\delta C/C)]$ $\delta R/R \sim \delta t/t; \delta C/C \sim -\delta t/t$ $(R+\delta R)(C+\delta C) \sim RC[1+(\delta t/t - \delta t/t)] \sim RC =$ constant As shown in FIG. 2D is the self-compensated resistor design.

For the LC resonator, the LC constant after the increase of the temperature and/or humidity, $(L+\delta L)(C+\delta C)=LC(1+\delta L/L)(1+\delta C/C)=LC[1+(\delta L/L+\delta C/C)+(\delta L/L)(\delta C/C)]$ $\delta L/L \sim \delta t/t; \delta C/C \sim -\delta t/t$ $(L+\delta L)(C+\delta C) \sim LC[1+(\delta t/t - \delta t/t)] \sim LC =$ constant As shown in FIG. 2E and FIG. 2F, it is the self-compensated LC resonator design. As shown in FIG. 2F, it is the cross-section of the LC resonator. The inductor 1L has the cross section area to be proportional to the variance of δt/t. The inductance of the inductor 1L is proportional to the cross section area that the inductance of the inductor 1L is proportional to (t+δt/t). On the contrary, the capacitance Ic is reverse proportional to the variance of the δt/t. For the small variance of δt, the variance of the inductance 8L and the variance of the capacitance 8C are mutually compensated to have the self-compensation of the LC resonator, it uses the self-compensated LC resonator to have the self-compensation. As shown in FIG. 2E, the inductor 1L having the self-compensated capability is in the shape of toroid. The toroid is in the ring type closed shape. Actually it can be any closed shape as long as it is the vertical section coil. However, it must be the closed form such that all the magnetic streamline is confined in the coil of the toroid and the external circuits will not have any impact or the impact is minimized on the inductance of the inductor.

It is very important that the magnetic line to be confined in the toroid coil. If the magnetic streamlines go out the coil, there is no way to terminate it. The magnetic of the inductor will interfere with the surrounding circuits and induce a lot of noise to the LC resonator. For the LC resonator, such kind noise incurred by the open domain magnetic streamline is not acceptable. It will generate the excess phase noise and clock jitters. So the on-chip toroid coil is invented for the self-compensated LC resonator. The closed magnetic streamline to have less noise induced by the surrounding circuit. For the open-space flat inductor, the surrounding circuit modifies the inductance. For the toroid shape inductor, the inductor has the inductance that is independent of the surrounding circuit. However, the inductor of toroid still varies according to the variance of the temperature and humidity.

FIG. 2G is the ideal LC resonator. However, the inductor has the long string in the coil. So, the coil has the parasitic resistance RL. To have the fo to be independent of the temperature, RL=RC. To have RC for the capacitor in FIG. 2H, as shown in FIG. 2E, the capacitor Ic is in the shape of the strips. As shown in FIG. 2F, the strips Im of the capacitor Ic are overlapping with each other to constitute the capacitor. To have the fine tune of the resistor to have RL=RC, as shown in FIG. 2I, the trimming resistor Rtrim is added in series with the capacitor resistor RC.

To make the on-chip LC resonator type clock, we need to make the breakthrough in the LC resonator design. There is one wrong concept that the clock chip needs to have high-Q resonator made of the high-Q components. The formal golden rule is the Q of the component must be 4 times larger than the Q of the resonator. For the crystal, the Q is 1,000,000. For the on-chip spiral winding inductor, the Q is only 10. For the previous wrong concept, it is impossible to use Q=10 inductor to make the high Q clock reference. However, the previous concept on the LC resonator is completely wrong. It is based on the implicit assumption on-board design style free-running oscillator. It is not the on-chip gain-boost-Q circuit design.

Figure 3A:
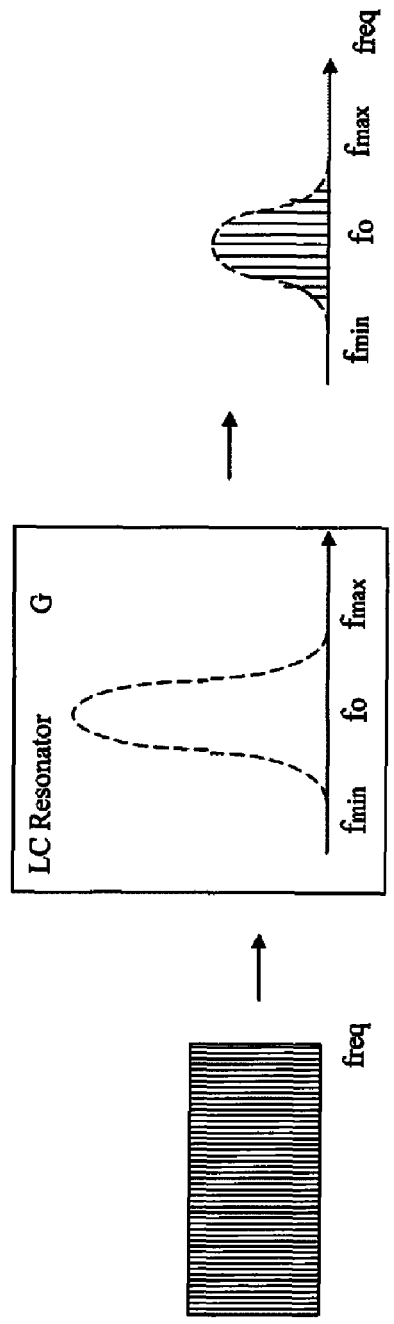
FIGS. 3 (A) and (B) are the comparisons between the free-running LC resonator and the gain-boost-Q LC resonator; (A) is the input, LC transfer function and output of the free-running resonator; (B) is the input, LC transfer function and output of the gain-boost-Q LC resonator; (C) to (J) shows the anti-sea-tide-breezing LC resonator design; (C) shows the sea-tide-breezing power supply chaos causes the chaotic behavior of the power supply; (D) is the flow block diagram, phase diagram and frequency spectrum of the noise generated chaotic behavior in the parametric chaotic circuit of power supply; (E) is the ideal oscillatory behavior of the anti-sea-tide-breezing LC resonator after the chaos in FIG. 3C being removed; (F) is the flow block diagram of the fundamental mechanism for the anti-sea-tide-breezing LC resonator; (G) is the frequency spectrum of the anti-sea-tide-breezing LC resonator design corresponding to FIG. 3F; (H) is the amplitude control and common-mode control for the LC resonator design; (I) is the anti-sea-tide-breezing LC resonator design; (J) is the circuit of the anti-sea-tide-breezing LC resonator design; (K) is the direct conversion RF front architecture with the conventional LC resonator; (L) is the direct modulation architecture with the anti-sea-tide-breezing LC resonator; (M) is the PFLL having both the phase lock loop and the frequency lock loop; (N) is the 3-CHPH charging pump and control voltage holding circuit; (0) is the timing waveform and state diagram of the frequency lock loop.

However, as shown in FIG. 3A, the wrong concept has one implicit assumption that the LC resonator is free-running LC resonator. As the free running is the old-fashioned on-board design style does, the LC resonator is one block diagram of bandpass filter. The LC resonator circuit has white noise as input and the LC resonator is a bandpass filter.

Figure 3B:
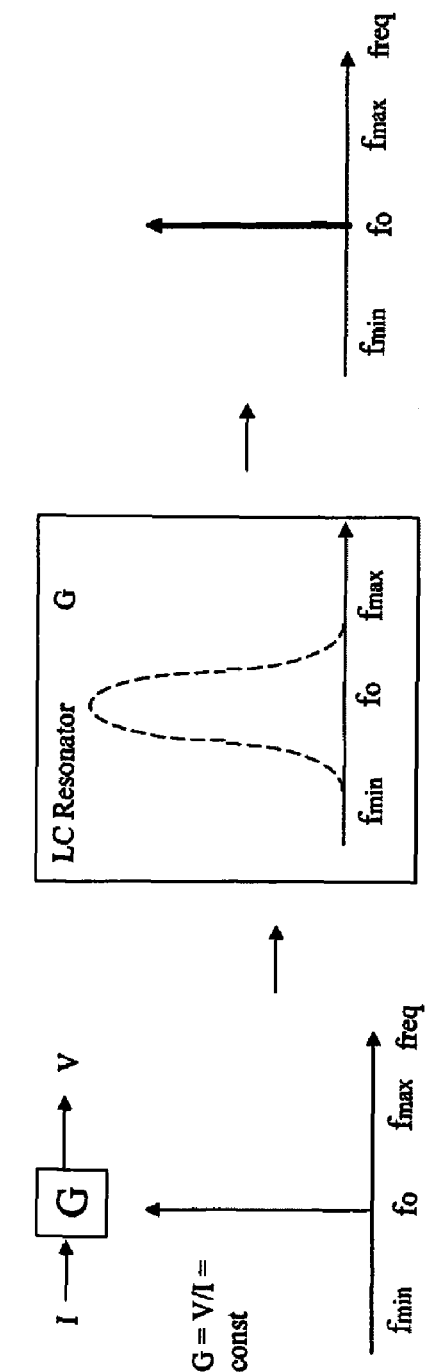

At the system-on-board time, the controlling circuit costs a lot money. So it is reasonable to have the resonator free running. However, in the system-on-chip SOC design style, the controlling circuit cost means nothing. So, as shown in FIG. 3B, we use the gain-boost-Q and anti-sea-tide-breezing circuit to boost the Q of the on-chip LC resonator.

The fundamental breakthrough of the gain-boost-Q is to have the different interpretation of the basic gain function of the LC resonator. We re-investigate the basic gain function G for the RLC resonator is:

$$G=Vii=1/[1/R+j(\omega C-1/\omega L)]$$

It is noted that this equation doesn't put the constraint for the low-Q LC resonator cannot generate the high-Q oscillatory signal. As shown in FIG. 3B, on the contract, this equation does say, even at low-Q, the LC resonator still can generate the high Q signal as long as we can fix the gain G to be a constant. As G=Gmax, it has only one frequency oscillate which is oscillate at ($\omega=\omega o$. Now, the key issue for the LC resonator to generate the high Q oscillatory is to keep the gain G to be constant all the time.

$$\text{Fixing } G=G\text{max} => \text{keep oscillation at } \omega=\omega o$$

The traditional free-running LC resonator actually is free-wandering LC resonator. The oscillations wandering in the LC resonator have the possibility to be any gain. Now, in the reverse process, we fix the gain of the oscillation to have the pure frequency oscillation to become the high-Q LC resonator to have all the oscillation oscillates at the frequency co=coo. So, we refer the new LC resonator to be the gain-boost-Q LC resonator. So the gain-boost-Q LC resonator is no more a free-wandering bandpass filter circuit. All the previous Q concepts and conclusions fail to apply to the gain-boost-Q LC resonator circuit.

We have one explanation why we can use low-Q LC resonator to generate the high-Q oscillation with the gain-boost-Q technique. The high-Q crystal oscillator is a doghouse. The dog in the doghouse cannot run randomly that you can locate the dog easily. The dog is in the high-Q oscillation mode. The low-Q LC oscillator is a big house. The dog in the big house can run randomly and free wandering that you cannot find out the dog easily. The dog is in the low-Q oscillation mode. However, as we use one belt to tight the dog to the door. The dog even cannot move. So, even the dog in the big house, we still can locate the dog exactly. The dog is in the gain-boost-Q superior high-Q oscillation mode now. The problem is what is the belt is. The belt is Gmax=V/I. We need to control G(t)=Gmax=const all the time. Then, the LC oscillation oscillates at f(t)=fo, always and exactly. This is the gain-boost-Q superior high-Q you can get even with the low-Q LC resonator.

Figure 3C:
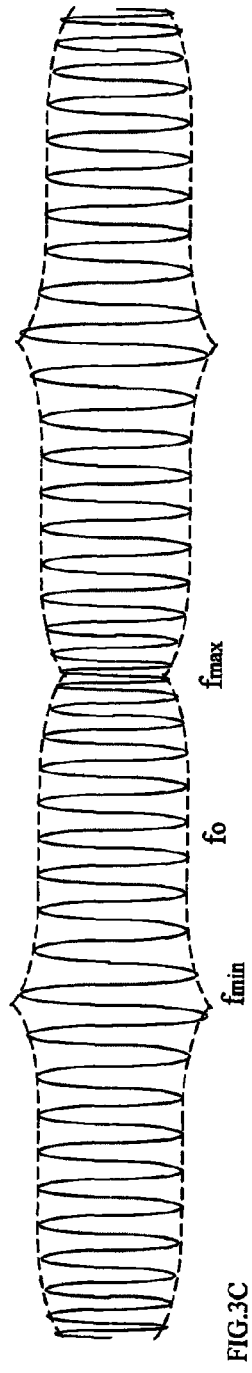
Figure 3D:
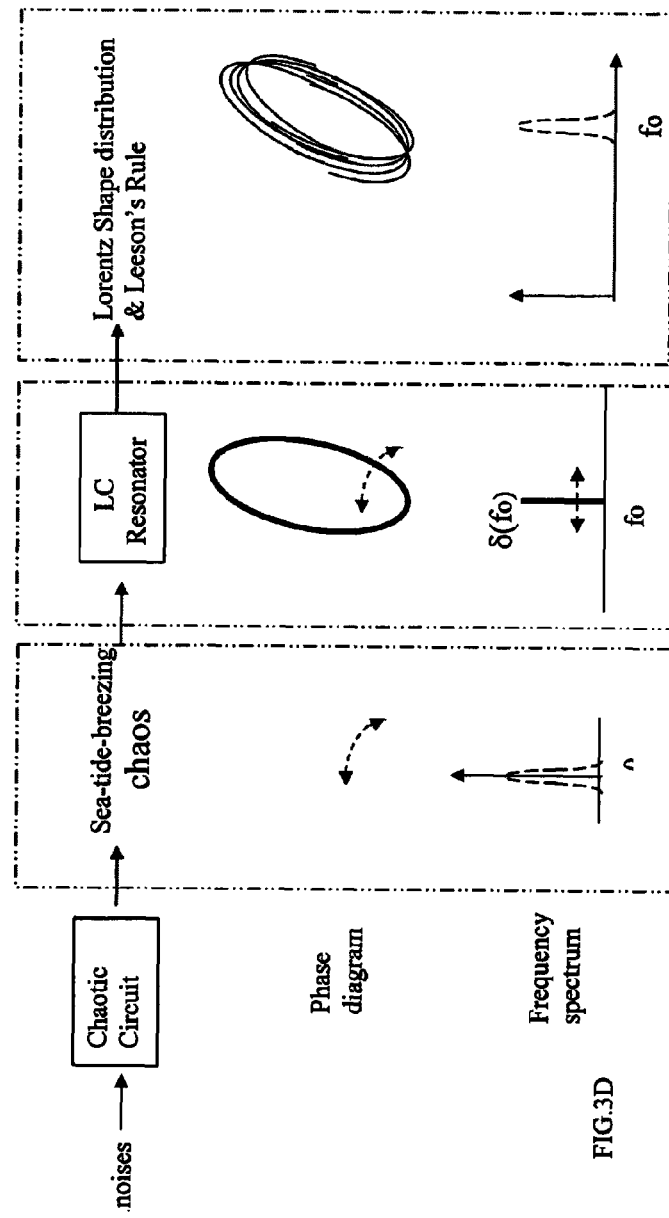

Furthermore, as shown in FIG. 3C and FIG. 3D, as we inspect the spectrum of the free-running/free-wandering output oscillation, it shows there is the universal Lorentz curve. We make analysis of the spectrum with the histogram view. There is famous golden rule between the amplitude and frequency for the analog signal. As shown in FIG. 3G, as the amplitude of the oscillation is large, the oscillation frequency is small. As the amplitude of the oscillation is small, the oscillation frequency is large. As shown in FIG. 3C, we reconstruct the free-running/free-wandering oscillation in time domain from the Lorentz curve in FIG. 3G. As shown in FIG. 3D, the bandwidth is very narrow that the modulation frequency of the sea-tide-breezing waveform is very slow long period modulation. The envelop of the peaks of the oscillation shows a sea-tide-breezing waveform. The sea-tide-breezing mechanism is a natural generic phenomenon of the chaos. The chaotic mechanism of the free-wandering LC resonator is shown in FIG. 3D. The noises of the LC resonator input the parametric chaotic circuit in the LC resonator and generate the sea-tide-breezing waveform which is overlapping on the DC voltage power supply.

To study the gain-boost-Q LC oscillator, we need to have the multi-disciplinary of the chaos, RNG and oscillator. From the chaotic research on the RNG (Random Number Generator) as shown in FIG. 7D and FIG. 7E, the noise will not causes the problem unless there is a chaotic mechanism or chaotic circuit. The noise is fuel; the chaotic circuit is engine. If it has only the fuel without engine, the working power cannot be generated. If it has only the noise without the chaotic circuit, the random number cannot be generated. Before, it uses the ring oscillator pulsing the noise, the RNG (Random Number Generator) circuit just quenched and stopped to work. It has noises, but it does have the chaotic circuit engine. However, with the chaotic circuit as shown in FIG. 7B and FIG. 7C, the chaotic circuit engine starts to cranking, the fuel noise adds up to randomized the chaos to generate the random number. Another practical case is the crystal oscillator circuit. The conventional crystal oscillator circuit can be consider to be the single stage ring oscillator. With the addition of the resistor to set the operating point at the biasing point, the crystal oscillation is actually is a random number generator circuit. However, the crystal circuit works. The thermal noise of the resistor doesn't create the random number. Instead of the crystal oscillator generates a high-Q oscillator curve. The reason is the feedback of the crystal circuit can suppress the thermal noise to generate the high-Q oscillation. The same principle can be applied to the LC resonator. We can use the feedback circuit to suppress the noise to generate the high-Q oscillation.

For the LC resonator, the noise suppression circuit is the AC type feedback loop anti-sea-breathing circuit; the high Q boosting circuit is the DC type feedback loop gain-boosting-Q circuit.

Figure 3H:
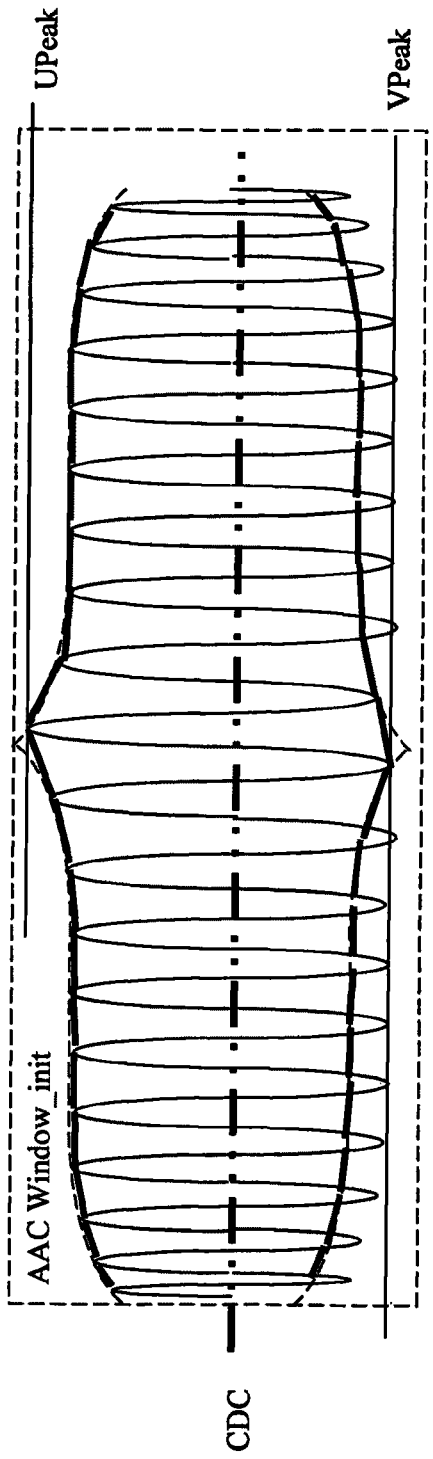
Figure 3I:
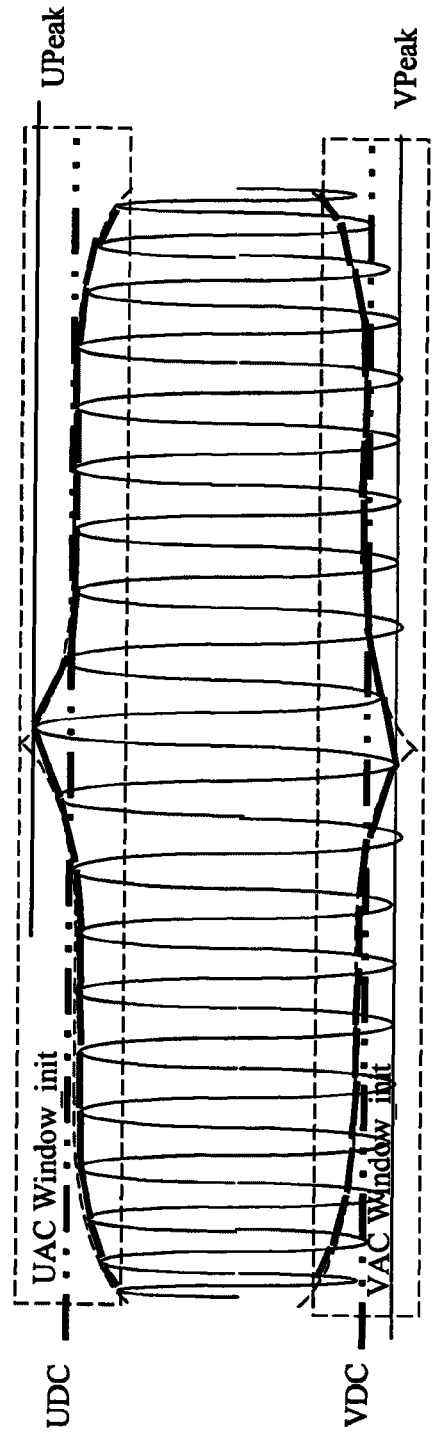

As shown in FIG. 3C and FIG. 3D, the sea-tide-breezing power supply inputs into the LC resonator, generate the free-running/free-wandering oscillation having the Lorentz shape spectrum. For the high-Q LC resonator, the bandwidth of the Lorentz shape spectrum, it means the sea-tide-breezing waveform is in very low frequency. For the low-Q LC resonator, the sea-tide-breezing waveform has higher bandwidth and higher frequency. But in either high-Q LC resonator or the low-Q LC resonator, the sea-tide-breezing waveform frequency is very low and it is very easy to clean out with today high-speed high gain OPAMP. As shown in FIG. 3C and FIG. 3E, as the sea-tide-breezing waveform is cleaned out, the waveform in FIG. 3C becomes the waveform in FIG. 3E to be the high purity waveform oscillating at the frequency fo. As shown in FIG. 3H and FIG. 3I, there are two anti-sea-tide-breezing ways to clean out the sea-tide-breezing waveform. As shown in FIG. 3H, it is the common-mode-voltage control working together with the amplitude-control to get rid of the sea-tide-breezing in the LC resonator. CDC is the common mode DC voltage. AAC represent the amplitude AC window. It was the our prior application and had reduce the jitter of free-running/free-wandering LC oscillator from 400 ppm to be 90 ppm at 1 GHz oscillation frequency. To make the further improvement, the new anti-sea-tide-breezing circuit configuration/architecture is invented.

As shown in FIG. 3F and FIG. 3I, the upper power sea-tide-breezing waveform and the valley ground sea-tide-breezing waveform are cleaned out separately. UDC is the upper DC voltage; VDC is the valley DC voltage. UAC is the upper AC amplitude window; VAC is the valley AC amplitude window.

Comparing FIG. 3I with FIG. 3H, the amplitude AC window is much narrow range that it is much easier to clean out the sea-tide-breezing waveform. The difference of the UDC and VDC is the amplitude. The middle point of the UDC and VDC is the CDC. So, the feedback control of FIG. 3I is equivalent to the amplitude control and commode-mode control. However, it has much better control scheme. It can differentiate between the upper sea-tide-breezing waveform disturbance and the valley sea-tide-breezing waveform disturbance and clean out them much efficiently. So, the clock jitter will be further reduced down to be less 10 ppm.

Figure 3J:
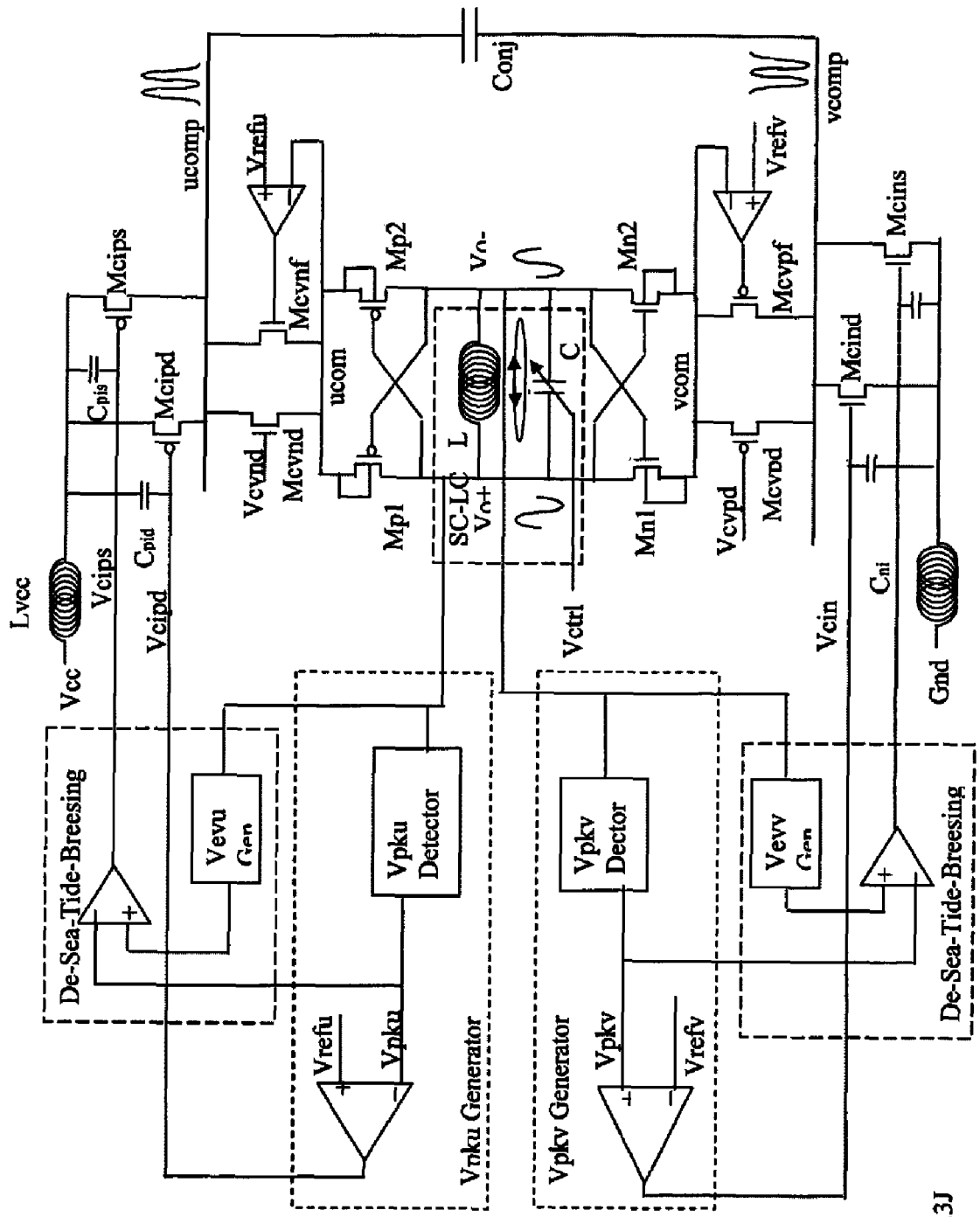

FIG. 3F shows the signal flow block diagram of the anti-sea-tide-breezing circuit configuration and architecture. From the upper peak of the amplitude Au, the supply current Iu is injected into the LC resonator. From the valley peak of the amplitude Av, the supply current Iv is discharged form the LC resonator. Actually, Iu=Iv=I . The cooperation of Iu and Iv will control the amplitude Au, Av and keep the CDC=(UDC+VDC)/2. FIG. 3I shows the anti-sea-tide-breezing circuit. Furthermore, the UAC and VAC will shrink down as the sea-tide-breezing waveform is cleaned out. As shown in FIG. 3I and FIG. 3J, the circuit is to detect the Upeak and Vpeak. Finally, the Upeak=UDC and Vpeak=VDC. However, the AAC window still keeps the same.

As shown in FIG. 3J, the SC-LC is the self-LC-compensated, gain-boost-Q, anti-sea-breathing LC resonator for the principle illustrated in FIG. 3I. The upper Vpku peak detector generates the peak value Vpku. The Vpku is compared with the upper amplitude setting reference value Vrefu. If Vpku<Vrefu, the MOS device Mcipd will inject the current into the LC resonator. It is to control the UDC voltage level in FIG. 3I to be the DC level adjustment. The Vevu is to generate the envelop of the peaks of the oscillation which is the UAC curve in FIG. 3I. The UAC is compared with Vpku to adjust MOS Mcips to inject the AC current into the LC resonator to compensate to clean out the UAC upper sea-tide-breezing waveform to be a straight line.

Similarly, The valley Vpkv valley detector generates the valley value Vpkv. The Vpkv is compared with the valley amplitude setting reference value Vrefv. If Vpkv>Vrefv, the MOS device Mcind will discharge more current from the LC resonator. It is to control the VDC voltage level in FIG. 3I to be the DC level adjustment.

The Vevv is to generate the envelop of the valleys of the oscillation which is the VAC curve in FIG. 3I. The VAC is compared with Vpkv to adjust MOS Mcins to discharge the AC current from the LC resonator to compensate to clean out the VAC valley sea-tide-breezing waveform to be a straight line.

To have the control of G=V/I to have the gain-boost-Q for any LC resonator, we are not only to control the current I but also to Control the voltage V. The above-discussed circuits are for the current, we need more circuit to Control the variance of voltage V. During the switching of the MP1 and MP2, the peak value of the oscillation is to follow the ucom node voltage. During the switching of the Mn1 and Mn2, the peak value of the oscillation is to follow the vcom node voltage. To minimize the variation V in G=V/I, it is equivalent to minimize the variance of the voltages at nodes ucom and vcom.

The feedback loop for Mcvnf and Mcvpf are single stage feedback look. It is not only fast but also unconditionally stable. To speed up the response of the feedback loop control, we further separate the DC current from the AC current. The large MOS Mcvnd is biased with the DC voltage Vcvnd; the large MOS Mcvpd is biased with DC voltage Vcvpd. The AC variation of the ucom node voltage is suppressed with the feedback of the MOS Mcvnf. The AC variation of the vcom node voltage is suppressed with the feedback of the MOS Mcvpf. As both Mp1 and Mn1 are on or both Mp2 and Mn2 are on, there is crowbar short current. The node ucom voltage decreases instantly and the node vcom voltage will increase instantly. The source follower of Mcvnd and the feedback loop of Mcvnf will push the variance to the node ucomp. The source follower of Mcvpd and the feedback loop of Mcvpf will push the variance to the node vcomp. The voltage of ucomp and vcomp are conjugate with each other. There is a big capacitor Conj to adapt the instant conjugate voltage variance efficiently.

So, the ucom and vcom are kept to be almost constant voltage that the amplitude of the oscillation of V0+ and Vo− are kept to be constant, too. The current is almost to be constant and the amplitude is almost const that the Gain G is almost to be constant. So, the gain-boost-Q has very pure oscillation. With the Mcipd, Mcips, Mcind and Mcins, the current I in G=V/I equation is under well control to keep to be constant. With the Mcvnd, Mcvnf, Mcvpd and Mcvpf, the voltage V in G=V/I equation is under well control to keep to be constant. So, the gain G of the LC resonator is to keep to be the constant.

It is noted that from the oscillation amplitude to control the inject current, the LC resonator automatically put the G=Gmax to operate at the oscillation frequency fo automatically. The control circuits control the gain G to be constant to make the oscillation at the same condition all the time to have the same oscillation all the time. The oscillation is pure. It is equivalent to have the high-Q. So we refer this circuit to be the gain-boost-Q LC resonator.

Figure 3L:
Figure 3K:
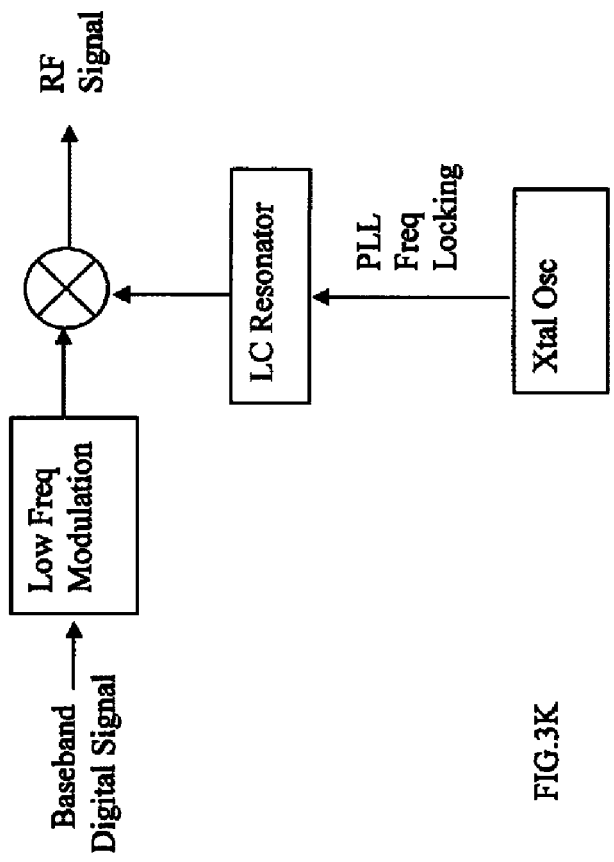

This gain-boost-Q LC resonator is not only use for the Xtaless Clockgen circuit but also has very important application in the RF transceiver circuit design. It can make the revolution in the RF transceiver design. As shown in FIG. 3K, it is today's most efficient direct conversion transceiver architecture. The digital baseband signal goes through the low frequency modulation to generate the baseband analog signal. For the signal side, the low frequency modulation includes a lot of circuits such as the preprocessor of the up sampling and down sampling of the baseband signal, then follows the digital low pass filter serving the pulsing shaping, then DAC. For the carrier side, the LC resonator use PLL to lock with the Xtal Oscillator as the frequency reference. Then the baseband analog signal is mixed with the carrier with the multiplier of mixer to generate the RF signal. Why the traditional transceiver has to use such complex architecture and circuit configuration to generate the RF signal? It comes back the essential problem of the oscillation problem: the oscillation frequency cannot generate accurately. It has to lock with the Xtal Clock as the frequency reference. Furthermore, the Xtal Clock is actually a mechanical oscillator. For the mechanical oscillator, it only oscillates at the low frequency. It cannot be directly use in the RF transceiver.

Now, for the Xtaless clock generator, it means that we have the capability to control the oscillation frequency accurately for the LC resonator as Xtal Clock does. However, the LC resonator is an electronic resonator. It has the high frequency to use in the RF transceiver directly. With such kind accurate control resonator frequency operating at high frequency, the new generation RF transceiver architecture is generated. It is the direct-modulation architecture. As shown in FIG. 3L and FIG. 3I, the baseband digital signal applies to the tunable capacitor Cmod directly to vary the oscillation frequency of the LC resonator to generate the. It is DFC—Digital to Frequency Conversion. Comparing the new architecture with the traditional architecture, it saves a lot of power and chip area. Furthermore, if the Baseband Digital Signal in FIG. 3L is the random number output RN as shown in FIG. 7B and FIG. 7C, the output clock is the clock having the spread spectrum effect to get rid of the electric magnetic wave emission problem.

Figure 3M:
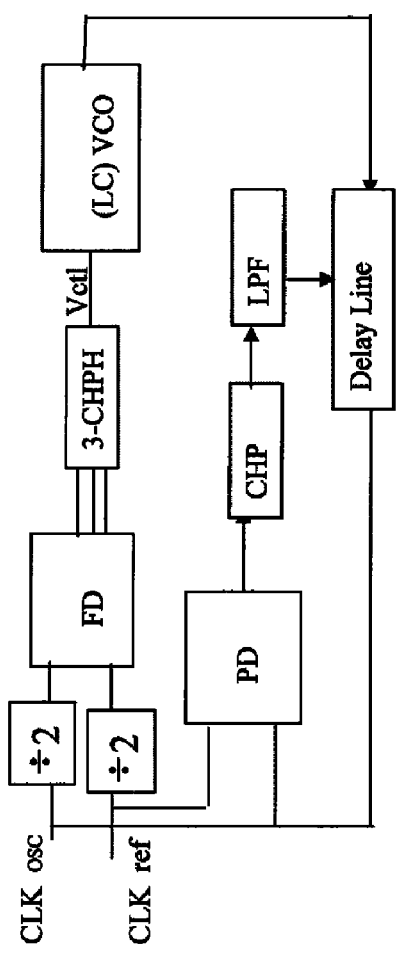

For the LC resonator to lock with the other reference clock, as shown in FIG. 3M, the frequency synthesizer has phase detector (PD) and frequency detector (FD) to work separately. Frequency detector FD is to detect the frequency deviation with the period of the clock. Phase detector PD is to detect the deviation of the phase and adjust the delay "line of the oscillation clock to match with the phase of the input reference clock. CHP is charge pump for the phase detector loop and LPF is the low pass filter for the phase detector loop. 3-CHPH is the 3-way charging pump and the holding capacitor to hold the control voltage for the VCO.

Figure 3O:
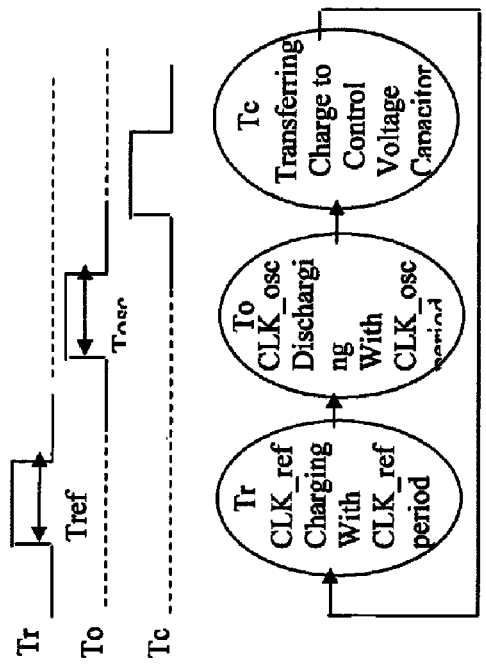
Figure 3N:
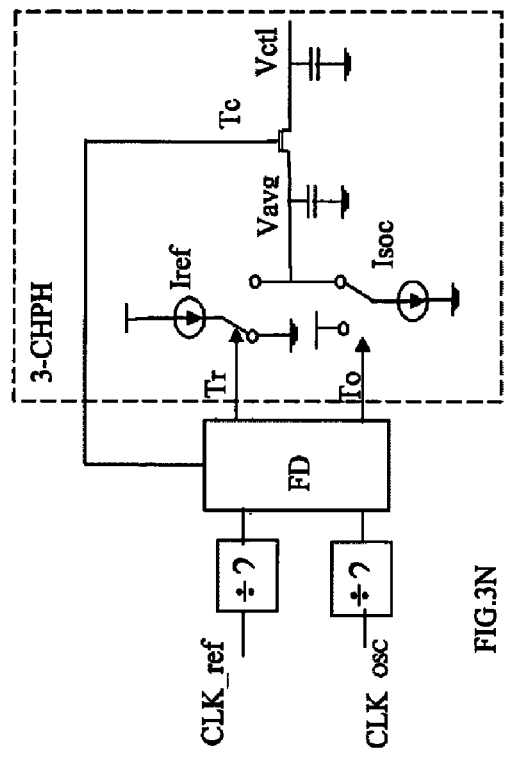

Referring to FIG. 3M, FIG. 3N and FIG. 3O, 2 divide the clock, the "on" time Tref, Tsoc become the periods of the CLK_ref and CLK_osc. Tr signal switches on the Iref for the time Tref. To signal switches on the discharging current for Tosc. Then Tc signal switching on to transfer the charge to the control voltage Vctrl. It is noted that the ratio of Iref/Iosc is the frequency ratio of the CL, K_osc and CLK_ref. As Iref=Iosc, at equilibrium, Tref=Tosc. It means that the CLK_ref and CLK_osc have the same frequency, fref=fosc. FIG. 3O shows the state diagram of the frequency detector. The switch on time of Tr, To and Tc signals have no overlapping time. The charging state, discharging state and charge sharing state have to follow in sequence.

FIG. 4 shows the Xtaless RC/IC resonator. As shown in FIG. 4A, the concept is very simple. It uses the constant current to charge a capacitor, the capacitor voltage increases linearly. As the capacitor is equal to and larger than the reference voltage Vref, the comparator is flip to the other state. The reference voltage Vref is the trigger voltage Vtrig. As shown in FIG. 4A, the conventional RC/IC oscillator is to charge and discharge periodically to generate a triangle voltage wave. A reference voltage slices the triangle voltage wave to generate the periodic clock.

Figure 4B:
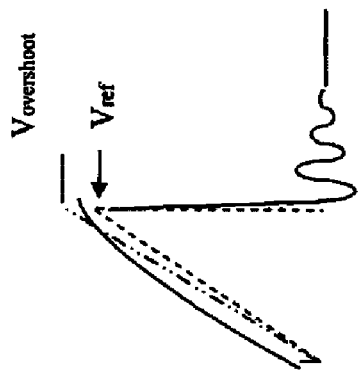
FIG. 4 is RC/IC resonator; (A) is the idealized RC/IC resonator operation; (B) is the real nonlinear behavior waveform of the RC/C resonator; (C) is the timing waveform of the RC/IC resonator operation in the real noisy chip; (D) is the idealized interleave charging and discharging RC/IC architecture; (E) is the interleave RC/IC resonator operation in the real noisy chip; (F) is the conventional RC/IC resonator timing chart, the trigger point is fixed and the Tperiod is varying; (G) is our innovative RC/IC resonator timing chart; the trigger point varies and the Tperiod is fixed; (H) is the conventional toggling switch mechanism which has the hang-up problem is the high-speed operation; (I) is timing diagram of the conventional toggling switch mechanism; (J) is the modified conventional toggling switch mechanism to avoid the hang-up problem in high speed operation; (K) is timing diagram of the modified conventional toggling switch mechanism; (L) is the algorithm and architecture of the synchronize toggling switch; (M) is the circuit configuration of the synchronize toggling switch; (N) is timing diagram of the synchronize toggling switch; (O) is the circuit of the synchronize toggling switch. (P) is the wide dynamic Swing current source circuit for the RC/IC resonator; (Q) is the single loop type basic architecture of the Xtaless RC/IC resonator; (R) is the basic interleaved loops type basic Xtaless RC/IC resonator; (S) is the complete circuit of the interleaved loops type Xtaless RC/IC resonator.

However, as shown in FIG. 4B, the real circuit has the nonlinear effects. Before, the RC/IC oscillator is used as low performance oscillator in KHz range. Now due to a lot of company having no RF design experience to design LC resonator, so they want to push the RC/IC to the 200 MHz range. For the specification of the RC/IC oscillator, the clock jitter is less than the 4% or clock period, i.e., 200 ps. It is a high performance requirement for the RC/IC resonator having the nonlinear curve as shown in FIG. 4B. It is a tremendous challenge for the circuit design of RC/IC resonator. So, we make the review of the limit on the performance of IC/RC oscillator and make the fundamental breakthroughs for the RC/IC algorithm, architecture and circuit configuration.

Figure 4A:
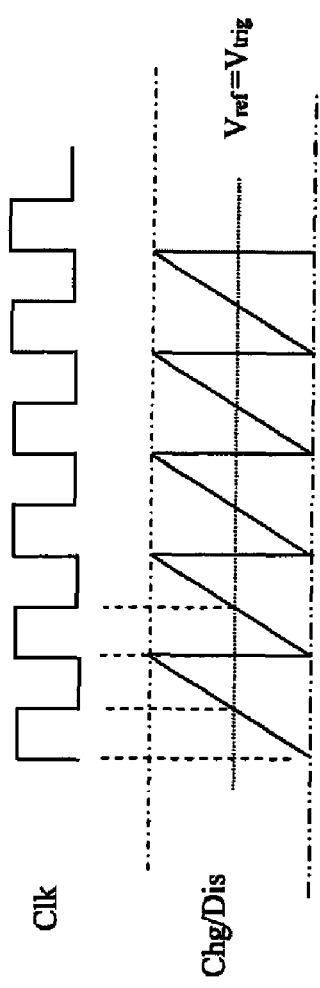
Figure 4C:
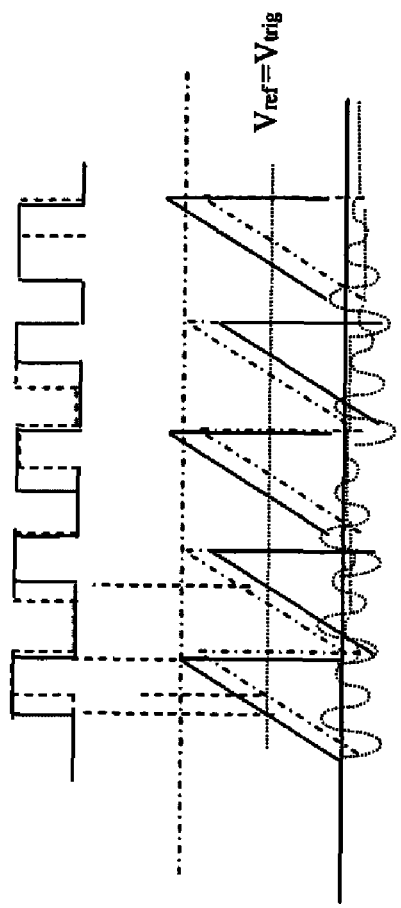

As shown in FIG. 4B, in the realistic chip, the charge and discharge curve of RC/IC oscillator is never ideal as FIG. 4A. They cause the degrade of the RC/IC oscillator. First, the charging curve of the charge of the RC/IC oscillator is not a ideal straight line as specified in the original RC resonator specification. It is a nonlinear curve. At low voltage, the charging rate is higher. At high voltage, there is the saturation phenomenon that the charging rate is slower. For the discharging curve, the discharging rate is higher at high voltage and the discharging rate is slower at low voltage. As shown in FIG. 4P, the nonlinear curve is due to the charge sharing between the node Vp and Vc.

Even worse, as shown in FIG. 4B, there is oscillation due to the ground bounce being caused the parametric inductance of the bonding wire and pin. The oscillation needs settling time to settle down to a finite value. As shown in FIG. 4C, in the real chip, the charging curve and discharging curve has the all the above three factors, nonlinear charging, voltage bouncing and settling time, to destroy the performance of the RC/IC resonator. The oscillation curve for the RC/IC resonator is an up and down wandering curves. Accordingly, the corresponding clock has the serious jitter problems. That is the reason why the RC/IC oscillator was restricted to be the low performance and low clock frequency application before.

However, under the requirement of the on-chip Xtaless oscillator, we make the innovation of the technology breakthrough for the RC/IC oscillator. As shown in FIG. 4D, to solve the voltage bouncing and settling time problem, there are two banks of oscillator. The two banks are charged and discharged alternatively. As shown in FIG. 4E, the voltage bouncing effect in the discharging process has enough time to damp out that all the charging processes can start with exactly the same initial voltage level. The jitter of the clock is mainly due to there is no enough settling time in the oscillator loop. Comparing with the jitter caused by the settling problem, the thermal noise is just a minor issue.

Figure 4F:
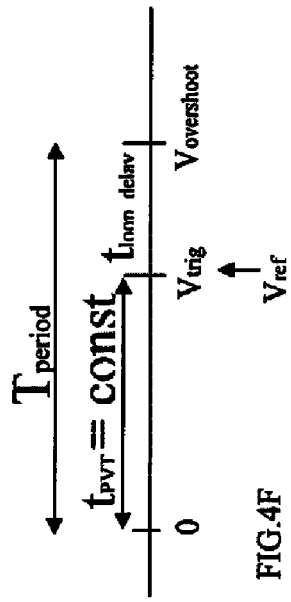

As shown in FIG. 4F, it is the algorithm of the conventional RC/IC oscillator. The conventional RC/IC oscillator has the slicing voltage Vtrig to be the reference voltage to control the clock period. After the triggering at the Vref voltage, there is a free running time of loop delay $T\_loopdelay$ for the switching off process of the RC/IC oscillator. So the actual time period of the RC/IC oscillator is $$T\_period=C(Vref/I)+T\_loopdelay=Ck(Vbg/Ibg)+ T\_loopdelay=t\,pvt+T\_loopdelay$$

The t pvt is C(Vref/I) to be controlled by the Vref. Both Vref and I are derived from the bandgap reference circuit. Vref, I, Vbg and Ibg are constant over process, voltage and temperature variations, So the tpvt is compensated to be the constant over process, voltage and temperature. However, the T_loopdelay still varies over process, voltage and temperature. So, there is the fundamental mistakes in the conventional RC/IC oscillator. For low frequency and low performance RC/IC oscillator, the loop delay T_loopdelay is only a small portion of clock period to be neglected. However, for the high frequency oscillation, the T_loopdelay is a big portion of the T_period. It cannot be neglected any more. So, we make innovation of the new algorithm for the RC/IC oscillator.

Figure 4G:
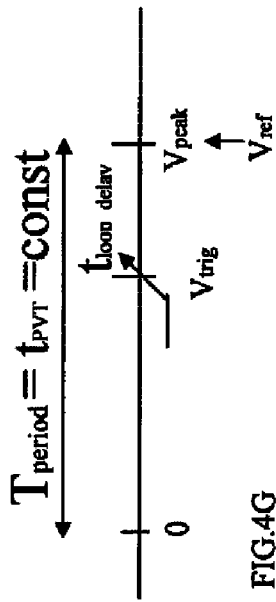
Figure 4D:
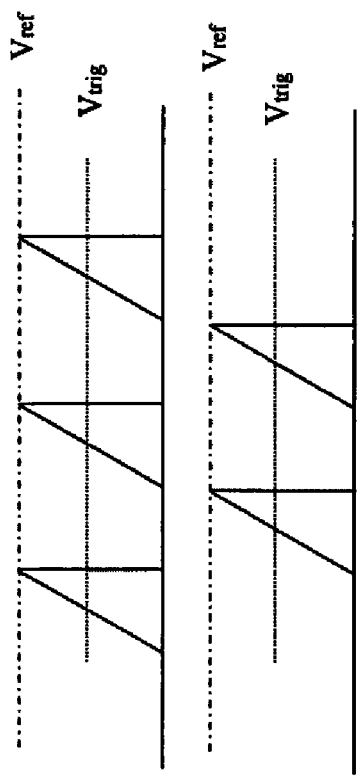
Figure 4E:
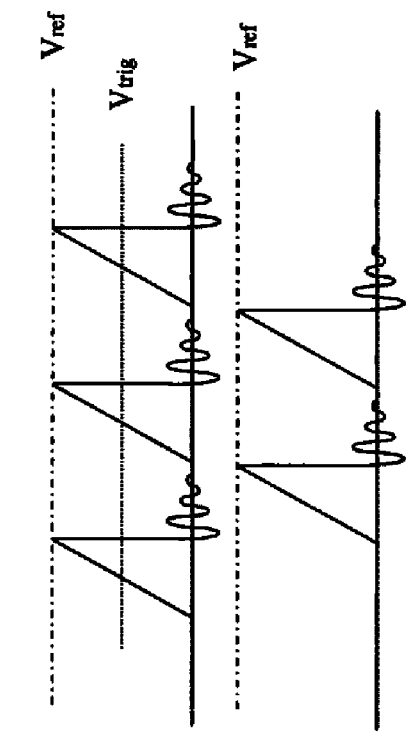

As shown in FIG. 4G, we set the Vpeak to be the $V_{ref}$. The T_loopdelay is included in the t pvt. To compensate for the variance of the loop delay $T_{\_loopdelay}$, the triggering voltage Vtrig is adjusted to keep the Vpeak to be the constant of reference voltage Vref.

$$T\_period = C(Vtrig/Iref) + T\_loopdelay = C(Vref/Iref) = t\ pvt$$

For the innovation of this new algorithm and architecture, we need the peak detector to detect the peak voltage Vpeak first, then comparing the Vpeak with the reference voltage Vref to adjust the Vtrig to keep the clock period T_period to be constant.

Figure 4I:
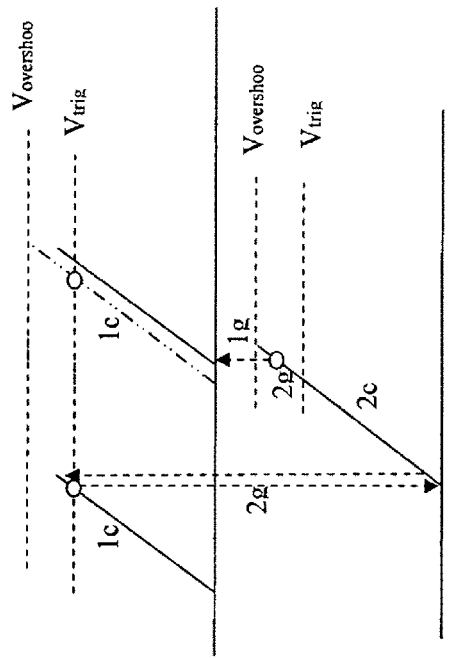
Figure 4K:
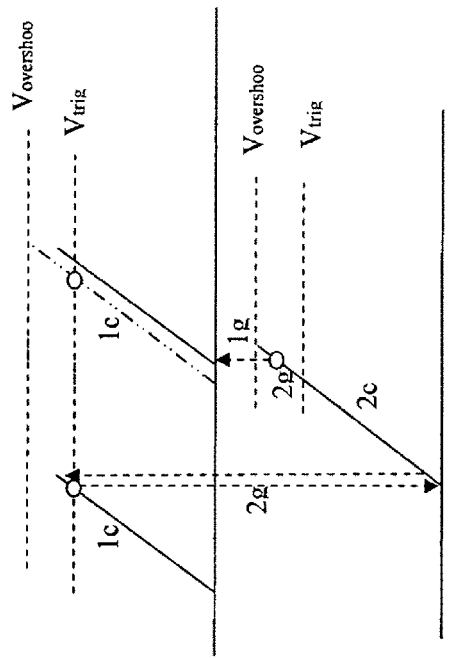
Figure 4H:
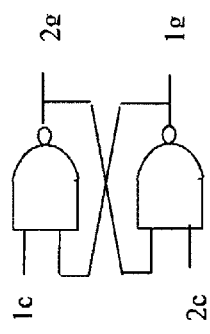
Figure 4J:
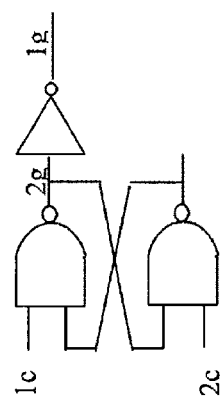

To avoid the settling problem, the new architecture uses the two-bank architecture. For the two-bank architecture, there is the toggle mechanism problem. As shown in the FIG. 4H, the SR latch is adopted for the low speed RC/IC resonator in kilo Hertz range. It has the symmetry property in architecture and half duty cycle. As shown in FIG. 4I, the SR latch input (Ic signal) is to turn off the switch (2g signal) of the other bank to charge first then turn on its own switch (Ig signal) to discharge the voltage of its own bank, and vice versa. This SR latch mechanism is only valid for the slow frequency RC/IC oscillator. It cannot be used for the high frequency operation. For the high frequency RC/IC oscillator, the switch signal sequence is no more valid. This switching process is relying on the delay which is sensitive to the process variation. Even worse, the circuit has the hang up in the undetermined state in high-speed clock operation. The switching signal may overlap and make the oscillator to hang up and stop to oscillate. So, as shown in FIG. 4J, in the conventional high frequency RC/IC oscillator, it uses an inverter to substitute for the SR latch mechanism to walk around the SR hang-up problem in the undetermined state. However, this add-on inverter to SR latch solution loses the symmetry of mechanism and loses the half duty cycle clock property as shown in FIG. 4K.

To make the technology breakthrough, we come back to the fundamental property and essential characteristics of the bank-bank switch. As shown in FIG. 4L, the bank-bank switching mechanism is divided to be the toggling mechanism and the synchronizing mechanism. The SR latch has the two mechanism messed together and induces new uncertainties to hang up the RC/IC oscillator. In the new architecture of FIG. 4L, the toggling mechanism and synchronizing mechanism are separated from each other. There is no uncertainty that the RC/IC oscillator will not be hang up. Furthermore, the synchronization needs only to synchronize with one bank signal of these two bank-bank switching signals. On the contrary, the SR latch needs two signals in the synchronization process.

Figure 4M:
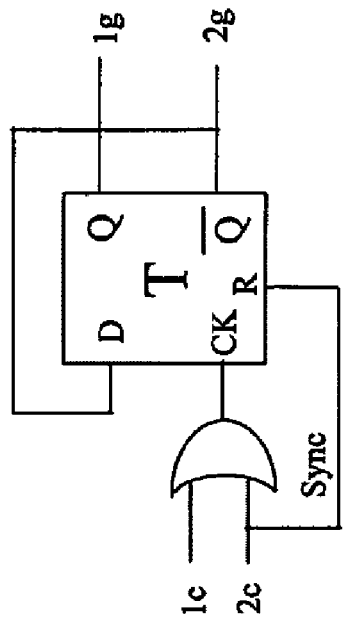
Figure 4O:
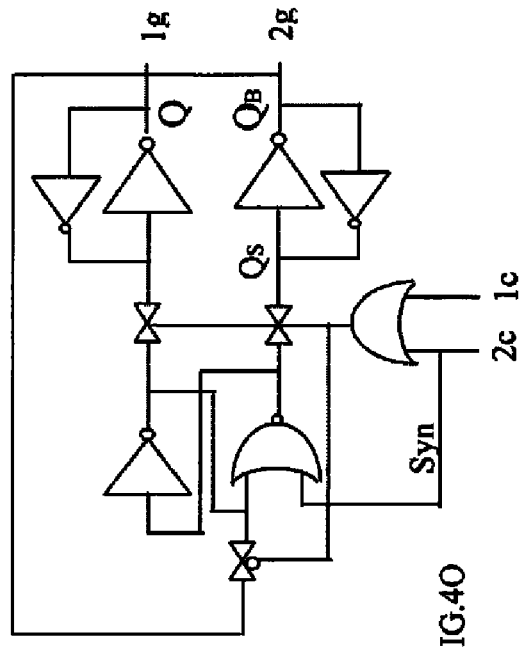
Figure 4L:
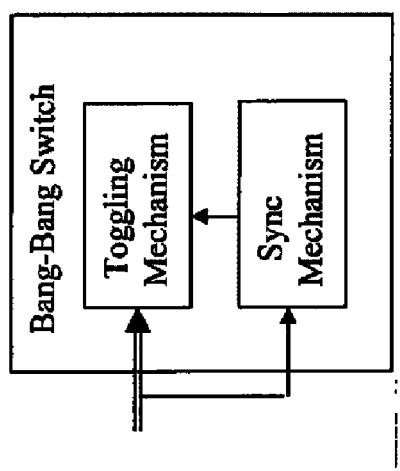
Figure 4N:
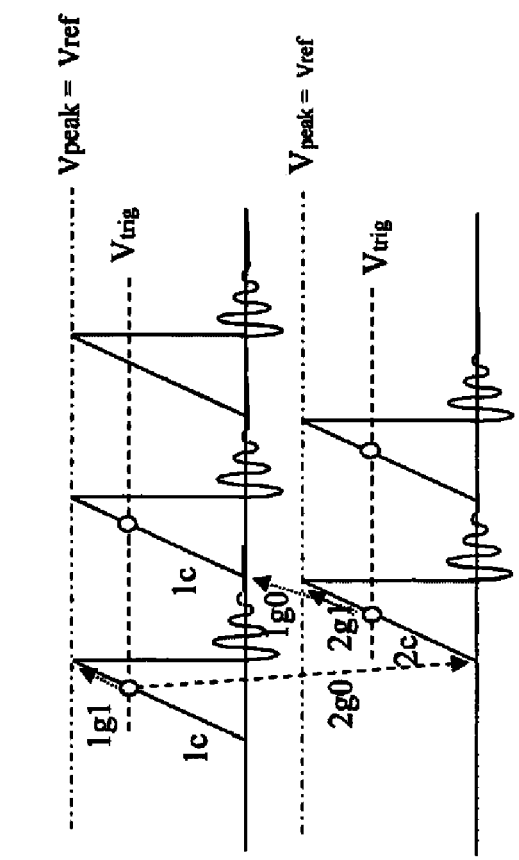

As shown in FIG. 4M, it is the RTL level circuit implementation of the synchronization toggling mechanism in FIG. 4L. In this innovative synchronization toggling mechanism, it is noted that the switching on of one bank and the switching off of the other bank are switching simultaneously. The conventional SR latch is switching off the other bank to charge up first, then switch on its own bank to discharge its own voltage. It has to hold its own voltage to make sure the other bank being switched off to start the charge up process. As shown in FIG. 4N, the waveform of the synchronization toggling mechanism shows this simultaneous parallel process. FIG. 4O shows the gate level circuit implementation of the synchronization toggling mechanism. In the new innovative synchronization toggling mechanism, the switching on and switching off processes are switched at the same time. It is even much different form the traditional FIFO structure. In the traditional FIFO, the output signal QB is the inverting signal of Q. However, in the innovative synchronization toggling mechanism, the output signal QB is the inverting signal of QS. The synchronization toggling mechanism is the hybrid of the partial SR latch and the toggling mechanism. However, the partial SR latch is for single signal synchronization. The toggling mechanism is to have the switch to toggle in two banks. There are two stages. All the switching signal process is handled in the level-sensitive first stage. The first stage has the plenty time of Tperiod to settle down the states. It is more like to take time to fill the bullet in the gun. However, the second stage is edge-sensitive process. As soon as the trigger signal is triggered, the toggling switch process is fired immediately. It is more like to fire the gun with the trigger. That is the reason why the synchronization toggling mechanism is suitable for the high frequency clock operation. The loop delay of the SR latch in the conventional RC/IC clock is completely eliminated in the innovative new architecture of the synchronization toggling mechanism. Once the switching processes happen, there is no way to cancel of these switching processes. The conventional SR latch is a sequential process. The synchronization toggling mechanism is simultaneous parallel process. So, there is no need to hold of one switching process for the other process to make sure the switch of the other bank has already started the switching process.

As shown in FIG. 4P and FIG. 4B, to keep the constant clock period, in the RC/IC oscillator, both the (C Vref) and Iref have to be kept to be constant. However, as the Vc varies, (1) the charging current Iref might vary, as the voltage Vc varies and (2) due to the charge sharing, the effective capacitor Cc actually is not a constant, either. In other words, both the variance of Cc and Iref are varying over the variance of Vc. To have the constant clock period over PVT (process, voltage and temperature), we have to keep the Iref and the effective Cc to be constant over voltage variance of Vc first.

As shown in FIG. 4P, the parametric capacitor Cparam at Vp node will contribute the variance of the capacitor Cc. Due to the charge sharing between the nodes Vp and Vc, it causes the nonlinear charging curve of Cc at Vc node as shown in FIG. 4B. As Vc is at the low voltage, the charge of Vparam at Vp is transferred to the Cc due to charge sharing. The slope of Vc rising curve is steeper. As Vc is at the high voltage, the charging current Iref charges both the Cc and Cparam. The slope of Vc rising curve is slower. So, we need to eliminate the capacitor effect of the Cparam. As the derivation as follows, we need to keep Vp to be constant, that the charge of Cparam will not share with Cc and the charging current Iref will not charge the Cparam.

$$T = CVpeak/Iref$$

$$C = (Cparam\ \Delta Vp + Cc\Delta Vc)/\Delta Vc = Cparam\ (\Delta Vp/\Delta Vc) + Cc$$

If $\Delta Vp = 0$ then $C = Cc$:

To have $\Delta Vp=0$, i.e., Vp=const, we must design circuit to keep Vp to be constant. As shown in FIG. 4P, there are two dual purpose to keep the voltage Vp to be constant. The first is eliminate the charging share between the nodes Vp and Vc. The second is to keep Iref to be constant over the voltage variance of Vc.

The variance of Vc from the lowest voltage to the peak voltage Vpeak is highly dynamic process. In this dynamic variance process to keep the two factors of charging current Iref to be constant and the Vc varies linearly, we need to have two controlling mechanisms. As shown in FIG. 4P, the dynamic variance of Vc will be fed back to the current source to dynamically adjust the biasing voltage Vbp. From the constant biasing voltage Vbn to generate the constant Iref for the dynamic load variance of Vc. FIG. 4P shows the dynamic current biasing circuit. The biasing voltage Vbn and the Vrefo is to generate the constant biasing current Iref. To generate the constant biasing current Iref, there are two dynamic biasing voltages Vbp and Vbpc. The dynamic biasing voltages Vbp and Vbpc is to keep the Iref=−Irefo=constant.

Figure 4Q:
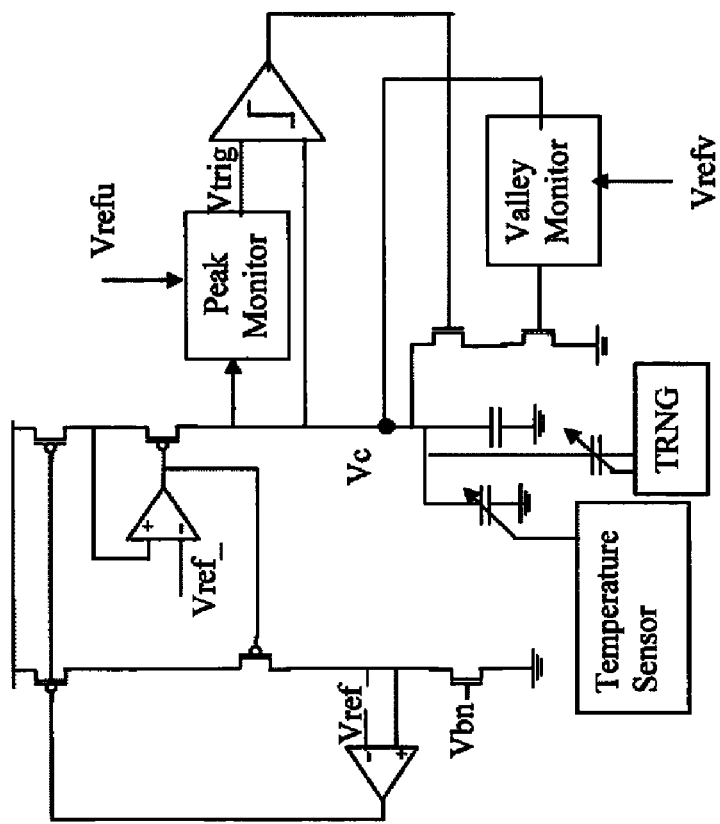
Figure 4P:
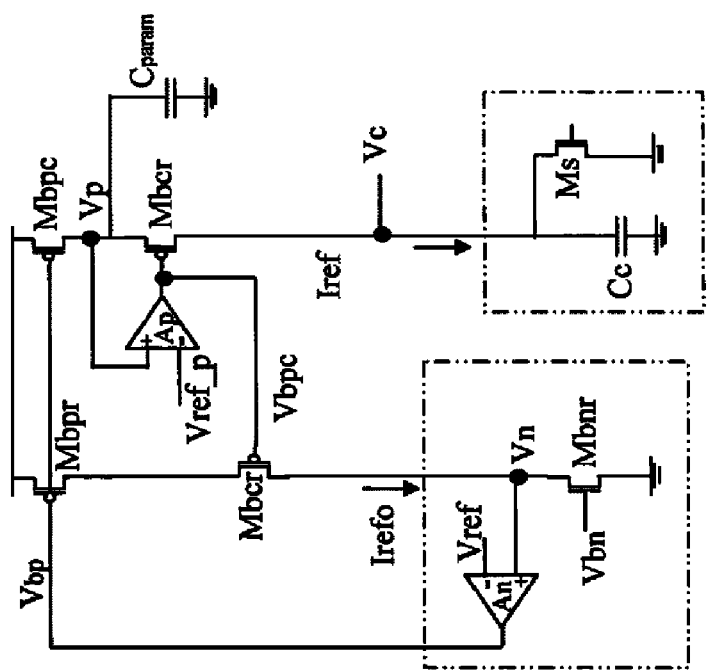

Combining FIG. 4G with FIG. 4P, the basic architecture of the circuit configuration of the RC/IC oscillator is as shown in FIG. 4Q. The Peak Monitor monitors the peak of the node voltage Vc. According to the peak value of Vc and the setting value Vrefu, the peak monitor generates a triggering voltage Vtrig. As the node voltage Vc is larger than the triggering voltage Vtrig, the feedback loop starts to run and discharge the node Vc. The Valley Monitor will monitor the valley voltage of the node Vc to keep the valley voltage of Vc to be the constant Vrefy.

To have the temperature compensation for the variation of capacitor, it can use the self-compensated RC as shown in FIG. 2B and FIG. 2D. There are the trimming bits being set up by the temperature sensor for the minor deviation after the RC self-compensation. For the self-compensation in RC/IC oscillator, the self-compensated R will be compensated in the bandgap reference. The self-compensated C is in the RC/IC oscillator. To have the spread spectrum effect on the clock, the True Random Number Generator is added to make the minor modification of the oscillation frequency of the RC/IC clock.

Figure 4R:
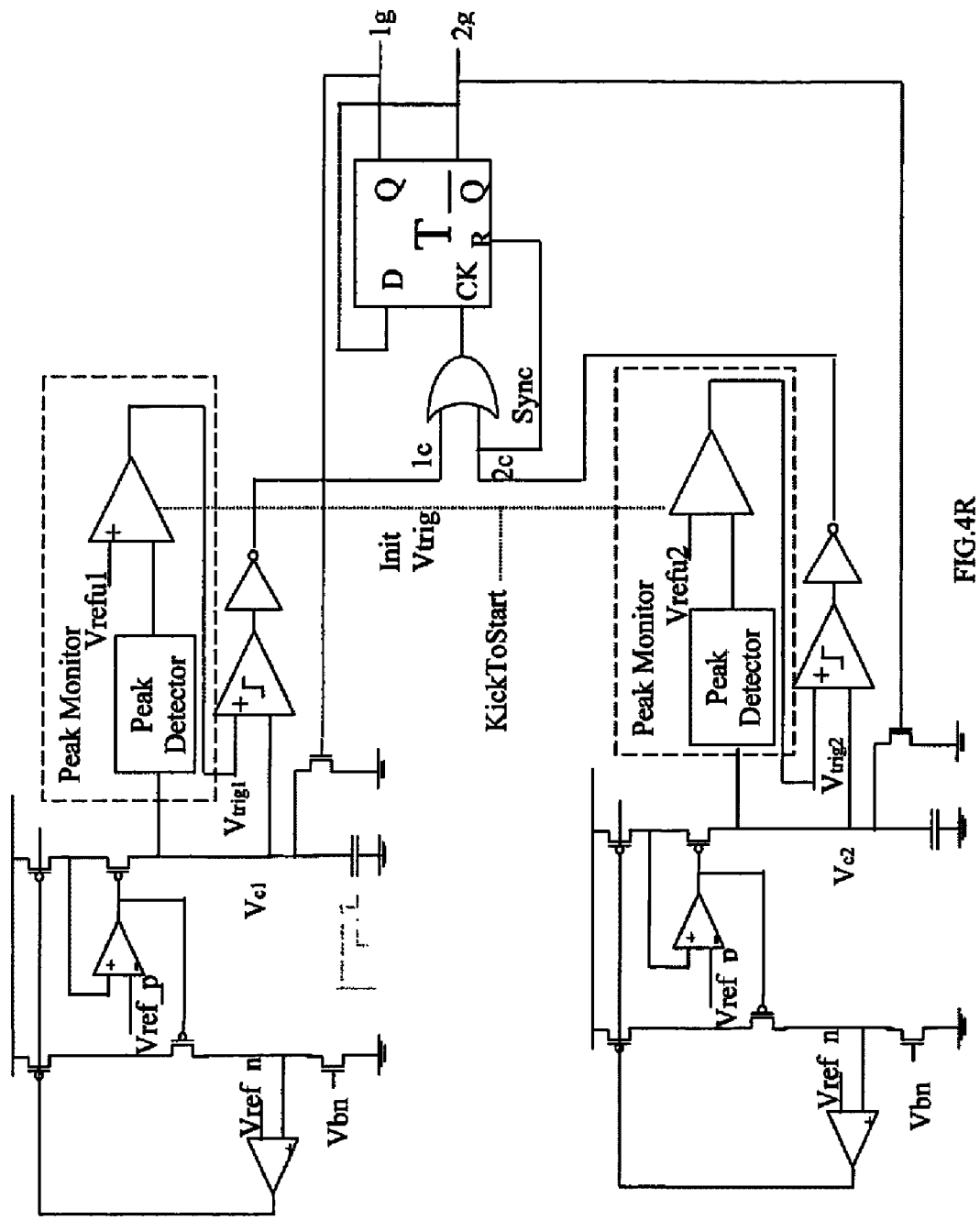
Figure 4S:
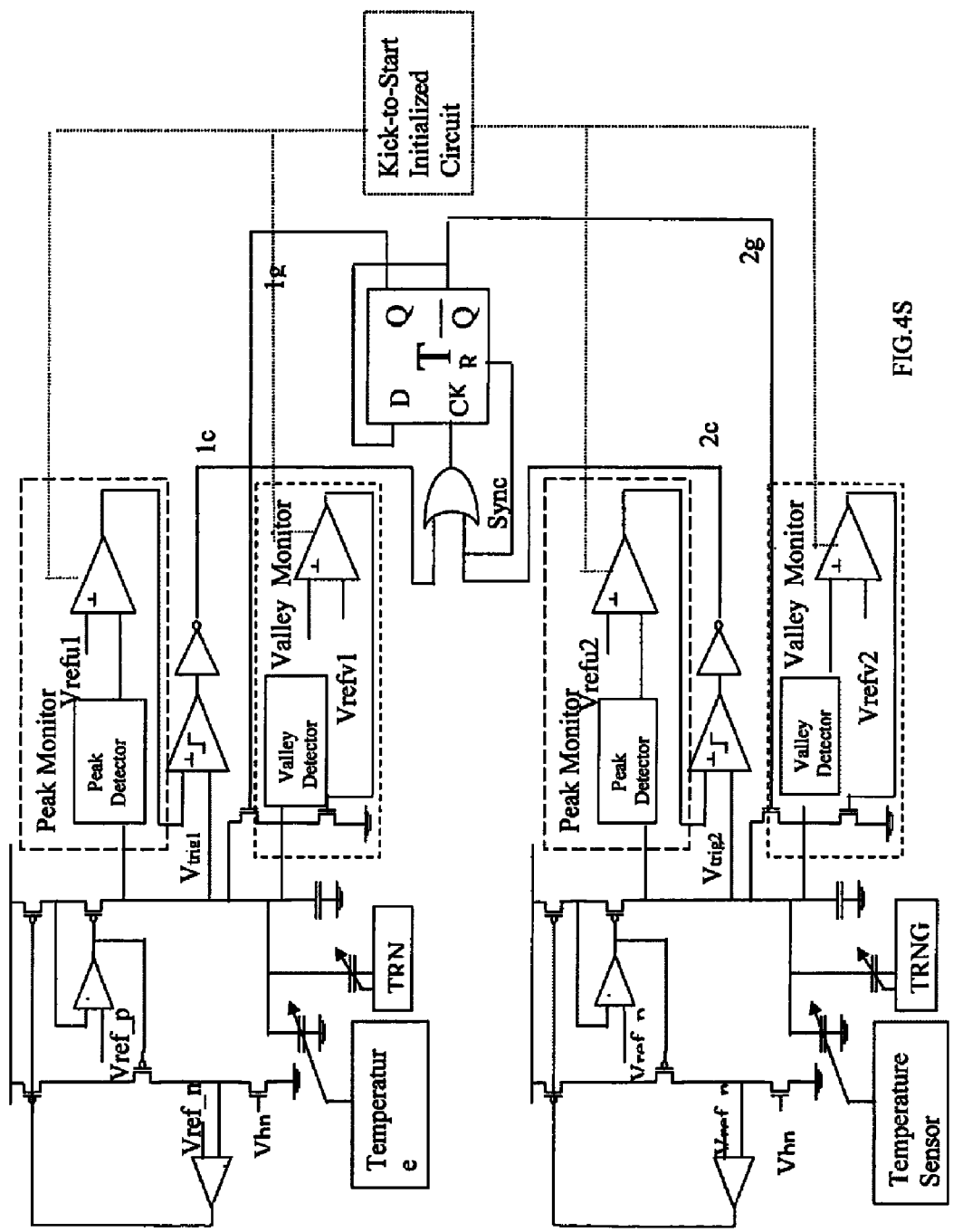

Combining FIG. 4E, FIG. 4G, FIG. 4M and FIG. 4Q, the basic RC/IC clockgen is shown in FIG. 4R. For RC/IC oscillator, there is kick-to-start initialize circuit. The kick-to-start initialize circuit will set the node voltage of Vc1 at Vreful, the voltage of node Vc2 to be zero, the Vtrig1 and Vtrig2 are set to be Vtrig. The new architecture will start as the conventional RC/IC resonator does. Then it will be released to operate in the new RC/IC resonator having the adaptive triggering voltage Vtrig1 and Vtrig2 to compensate for the PVT variation of the feedback loop. In FIG. 4R, the valley voltage is set to be ground to simplify the circuit configuration for being easy to understand. In FIG. 4S, it is the final complete circuit of the RC/IC resonator. The valley voltage can be set to some voltage above the ground to filter out the substrate noise, etc. The valley monitor circuit, etc is the conjugate symmetry to the peak monitor circuit.

The conventional LDVR has the OPAMP in the feedback-closed loop is 3-stages. The output capacitor is included as the stability analysis in the 3-stages OPAMP. It is impossible to make the 3-stages OPAMP feedback loop to be stable in any case to satisfy the versatile requirements, such as in-rush current, over-voltage protection, minimum slew rate, etc. The conventional LDVR just fails to meet the specifications.

Furthermore, there are the rush-in current and over-voltage protection problems in the transient process and power up process in the traditional LDVR. They will cause the latch-up problem of the chip. For the large capacitive load C, $I=C(dV/dt)$, there is large rush-in current if we have no control over V. Consequently, according to $V=L(dI/dt)$ of the inductance L of the bonding wire and pin, the problem of the over voltage protection V and the rush-in current I are highly correlated with each other. Unfortunately, the big capacitor is at the pin, and the over voltage is at the pad. The big capacitor cannot help to solve the overvoltage problem. Even worse, the over voltage at the pad will induce the latch up problem of the chip. For the battery powered chip, as long as the chip is in latch up, there is not enough power to pull the chip out of the latch up condition. The battery power will be drained very fast.

The capless low drop voltage regulator (LDVR) doesn't need the capacitor to stabilize the voltage regulator at any load conditions of the capacitor load, current load and satisfying the ramping up requirements. It can meet the loading requirements from zero current and/or zero capacitance to the maximum rated current and/or maximum capacitance.

Figures 5A, 5B:
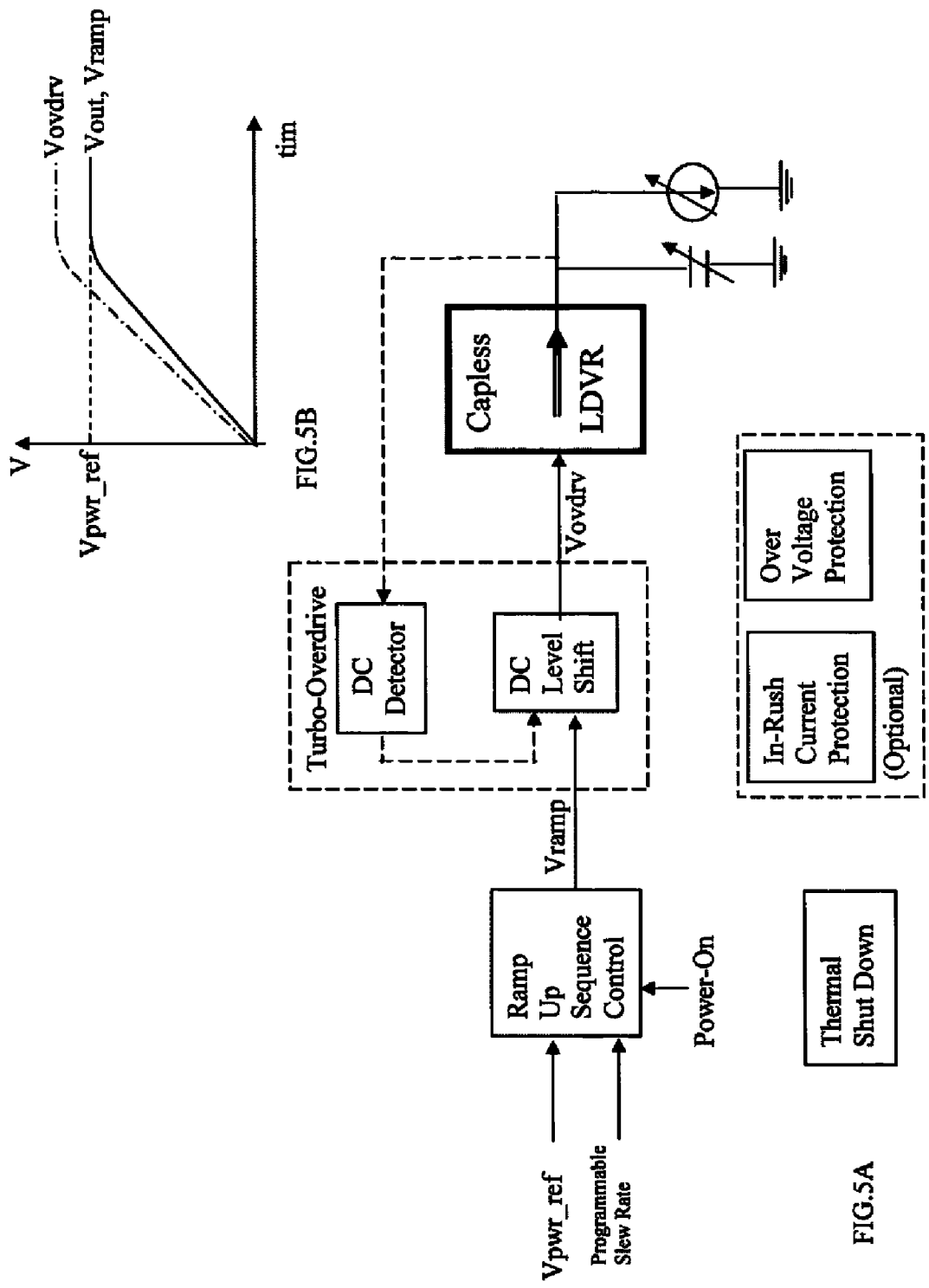
FIG. 5 (A) is the architecture of the capless LDVR; (B) is the ramping curve of the capless LDVR; (C) is the circuit of the capless LDVR; (D) is the slew rate control circuit; (E) is the modified driver circuit of the capless LDVR having the large PSRR and anti-ESD-latch capability; (F) is the conventional LDVR which has the intrinsic stability problem; (G) is the conventional LDVR being modified with the Capless LDVR circuit design technology; (H) is the circuit of the capless PID control circuit; (I) the load adaptive hybrid capless LDVR being made of the digital LDVR and analog capless LDVR; (J) is the load regulation on the digital control LDVR; (K) is the difference generator with the peak and valley detector.
Figure 5C:
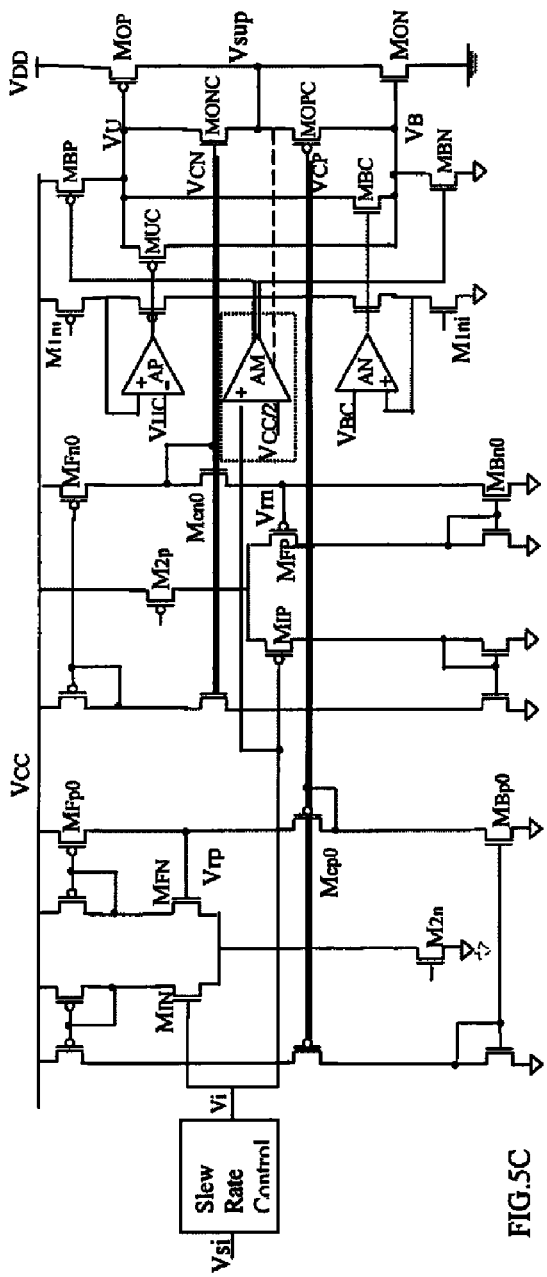

As show in FIG. 5A, we adopt the hierarchical architecture for the capless LDVR. There is no feedback loop. In the core of the capless LDVR, all the control is feed forward. As shown in FIG. 5C, all the feedback loop is local and only single stage. The single stage is unconditionally stable that the capless LDVR is unconditional stable. There are several local feedback loops in cascade. Each loop has ultra-high speed to stabilize the output load regulation and the line regulation of the individual loops. As shown in FIG. 5A and FIG. 5B, for the long chain of the cascading loops, we need to check the deviation between the input of the first local loop (Vpwr_ref) and the output of the last local loop (Vout). For the power supply, the input of the first loop is constant or the reference voltage or the very slow ramp-up voltage. So, the feedback loop of the power supply is DC style voltage. All the fast response is left for the local feedback loop to take care. For the long chain feedback from the output of the last stage loop to the input of the first stage local loop, it is only the DC type average of the output level. The fast response of the output load regulation and line regulation are left to the local loop. With such kind approach, we divide the control loop to be two level hierarchical control. The high level is the global DC level control loop and the low level is the local loops. This is referred to be hierarchical LDVR.

As shown in FIG. 5B, for the light load, the output voltage of the last stage is equal to the input voltage of the first stage. However, for the heavy load, the output voltage of the last stage has a small deviation to the input voltage of the first stage. To compensate the small deviation, we can raise up the input voltage level of the first stage. So, there is a DC level shift to modify the voltage level of the input voltage to have the load adaptive adjusting capability.

For the capless LDVR as shown in FIG. 3B, there is the build-in over-voltage-protection capability. Furthermore, the output of the capless LDVR has the direct image of the input voltage capability. So we can control the input voltage ramp up slew rate to control the output voltage ramp up slew rate without any stability problem. For the other conventional LDVRs, they don't have such capability due to the stability of the LDVRs. With the feedback loop control of the conventional LDVRs, all the LDVRs should have the capability to control the output slew rate with the control of the input slew rate. However, due to the stability, the conventional LDVRs cannot have the slew rate control capability. As long as the conventional LDVRs don't work at the designed working condition of the reference voltage, the conventional LDVR becomes unstable. Even worse, such kind constraint of the working condition at the fixed operating point causes the rush-in current due to $I=C(dVo/dt)$ with Vo=Vi=Vref at t=0. At the power up, the Vo jumps from 0 to Vref instantly. So, all the rush-in current and over voltage protection problems are due to the poor circuit design stability problem of the conventional LDVRs.

Figure 5E:
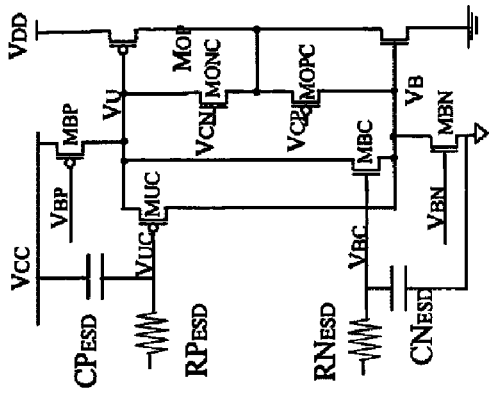
Figure 5D:
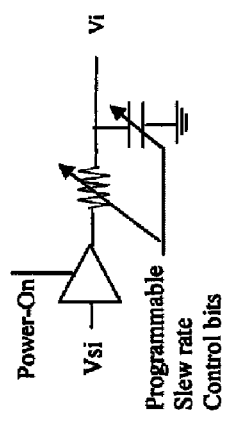

Since the capless LVDR in FIG. 5B has the unconditional stability capability for all the voltage level and the output voltage can trace the input voltage, as shown in FIG. 5A, there is a ramp up sequence control. As the LDVR is powered on, the LDVR will follow the preset ramp up slew rate to bring up the Vo to the target power supply voltage. As shown in FIG. 5D, the ramp up voltage can be as simple as one RC low pass filter. Changing the programmable slew rate control bits to change the value R or C, we can change the slew rate of the output power supply voltage.

Why the capless LVDR is such kind superior to the conventional LDVRs? It is the push-pull clamping output voltage power supply. The output voltage Vo is divided to be 3 voltage ranges: (1) upper range: from Vdd to (Vdd−Vth,n); (2) middle range: from (Vdd−Vth,n) to (Vgnd+Vthp); (3) low range: from (Vgnd+Vthp) to Vgnd. The voltage Vrp, Vm and Vsup have the same source follower relation that in the middle range, Vsup=Vrp=Vrn=Vi. However, even the clamping voltages VCP and VCN have the full voltage, the source follower voltage Vsup still has the voltage range from (Vdd−Vth,n) to (Vgnd+Vthp) to be the middle range operation. However, the LDVR is low drop to be less than 200 mV to operate in the upper range. We need to expand the working range from the high efficiency middle range to the upper range. Furthermore, to have the ramping up capability to solve the in-rushing current and over-voltage protection problem we need to work in the low range, too.

To work in the upper range, the capless LDVR has the other circuit to have the full-range operating capabilities. The upper range circuit components are MBP, MUC, MBN, MONC and MON. The voltage VU is biased at the voltage VU=VUC>Vdd−Vthp that MOP is shut off.

As shown in FIG. 5C, to work in the upper range, Vi>VCC/2. The amplifier means AM compare the Vi with VCC/2 to decide the operation range is in the upper range and generating the biasing voltage such that the current flows through MBN is larger than the current flowing through MBP. So the Vu voltage is pulled down to turn on the output device MOP. As the output voltage Vsup>Vi, MOPC is turned on and a lot of current injects into the node VB that the voltage is raised up to turn off the device MBC a little bit and the voltage VU is raised up to turn off the out put device MOP a little bit. With this feedback mechanism, the Vsup=Vi.

Being Similar, to work in the lower range, the capless LDVR has the other circuit to have the full-range operating capabilities. The lower range circuit components are MBP, MBC MBN, MOPC and MOP. The voltage VB is biased at the voltage VB=VBC Vth,n that MON is shut off.

To work in the lower range, Vi VCC/2. The amplifier means AM compare the Vi with VCC/2 to decide the operation range is in the lower range and generating the biasing voltage such that the current flows through MBP is larger than the current flowing through MBN. So the VB voltage is charged up to turn on the output device MON. As the output voltage Vsup<Vi, MONC is turned on and a lot of current flowing out of the node VU that the voltage decreases to turn off the device MUC a little bit and the voltage VB is drop down to turn off the out put device MON a little bit. With this feedback mechanism, the Vsup=Vi.

The power supply circuit is very large device. As they are tested in the HBM (Human Body Mode), the ground voltage drops negative voltage, if the VB node voltage still high, a lot current will drain to the substrate and causes the chip to latch up. To protect the chip in the ESD test, we need the modify the capless LDVR as shown in FIG. 5E. The RNESD and CNESD are added. As the ground is pulled downward instantly, the node voltage VBC also decreases to follow the ground that the VB follows the ground and there is no current injecting into the substrate. The latch up problem in the ESD test is cleaned out with the capacitor CNesD. Similarly, the RPesD and CPesD are added to clean out the ESD test causing latch up problem at the Vdd pin.

Figures 5F, 5G, 5H:
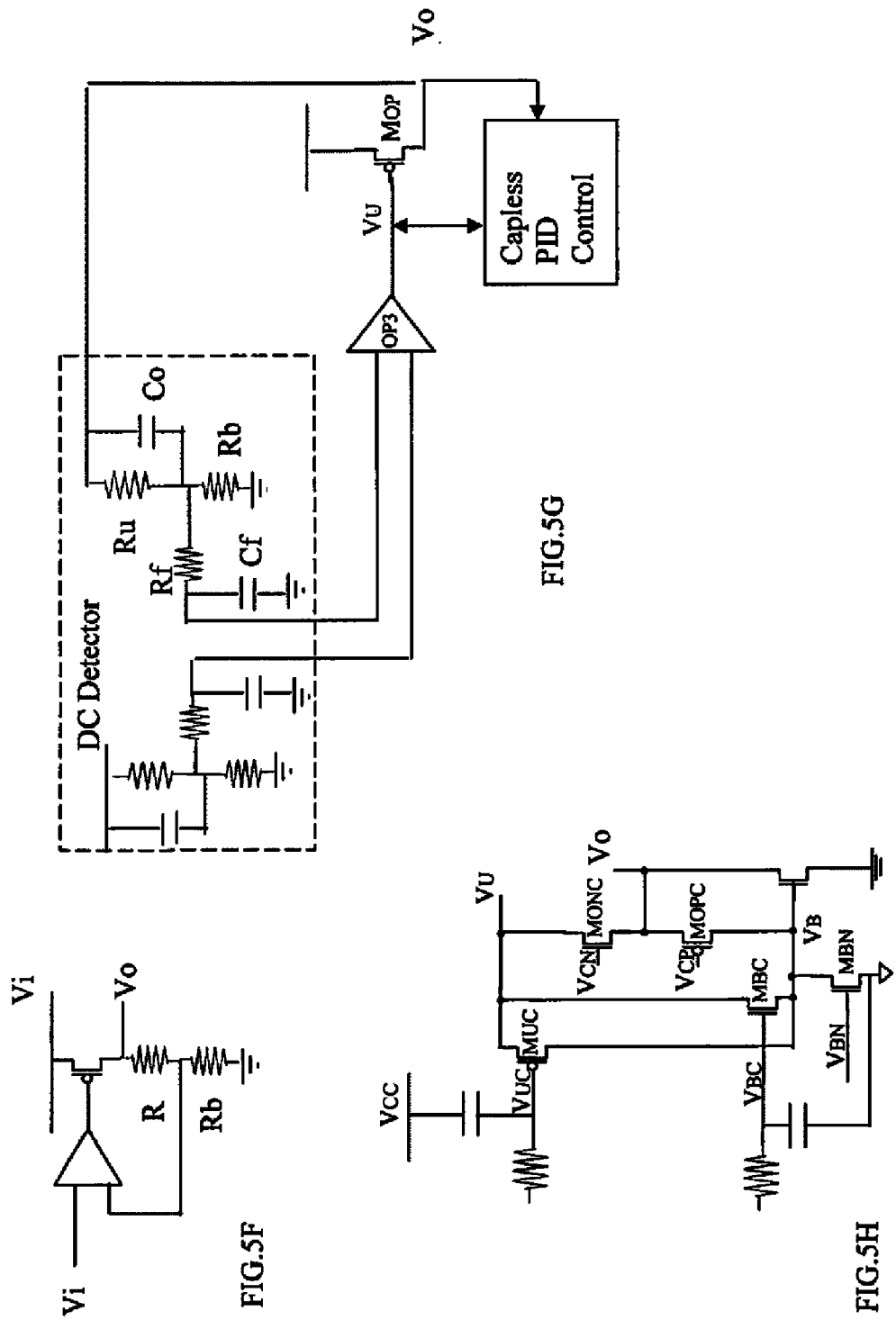

The techniques developed for the capless LDVR can be applied on the conventional LDVRs to modify the conventional LDVRs to be the capfree LDVR. A shown in FIG. 5F, it is the circuit configuration of the conventional LDVR. As shown in FIG. 5A and FIG. 5G, the input side has the DC Detector and the output MOP is compensate with the capless PID control. The DC detector is the low pass filter having one zero and one pole. The zero is made of Co and Rb and the pole is made of Rf and Cf. The zero is to short the strong AC component to the ground. The filter is to clean out the high frequency component of the Vsup. As shown in FIG. 5H, the capless LDVR driver section serves as the Capless PID Control.

Furthermore, to reduce the switching noise and driving power, the hybrid LDVR made of the digital LDVR and analog LDVR is developed as shown in FIG. 5I. As shown in FIG. 5J, the digital LDVR is for the DC level of power supply; the analog LDVR is for the AC variance of the power supply. With this kind approach, the LDVR driving circuit is only for the least significant bits small power supply. The main significant bits power supply is supplied by the digital power. The digital power doesn't need to switch that a lot of switching control power is saved. The analog LDVR is just supply the AC type current and make the power voltage variance is smaller than the specified.

Figure 6B:
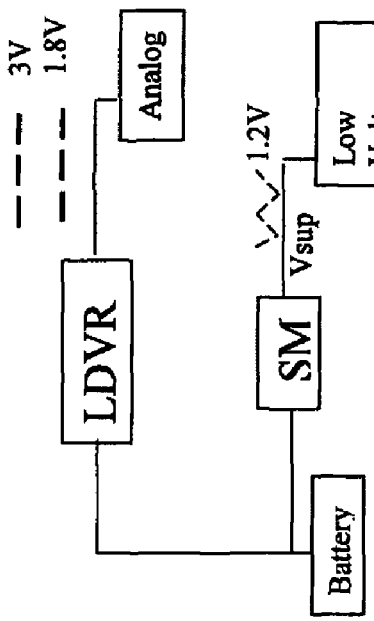
FIG. 6 is the Indless SM; (A) is the conventional PMU architecture for the board/system level power supply; (B) is the architecture for the battery PMU (Power Management Unit); (C) is the PMU-X design and analysis on the power swing of SM for different switch noise and switch power efficiency; (D) is the power plan for the dual mode of the capless SM with digital SM and the analog hybrid SM☐ (E) is the waveforms of PWM, PFM and PHM; (F) is the core mechanism of PWM (Pulse Width Modulation); (G) is the core mechanism to implement the PFM (Pulse Frequency Modulation): (H) is the core mechanism to implement the PHM (Pulse Hybrid Modulation) and the driver for Indless SM; (I) is the difference amplifier and the varying frequency resonator in current control oscillator mode; (J) is the difference amplifier and the varying frequency resonator in voltage control oscillator mode; (K) is the illustrative waveform example of the PHM; (L) is the switch delay for the minimum modulation pulse width of PHM; (M) is the hybrid SM of the digital PHM and analog PHM; (N) is the difference generator; (O) is the PMU architecture of the conventional board; (P) is the PMU architecture of the battery PMU; (Q) is the power up sequence of battery PMU; (R) is the supply voltage level generator of the high voltage; (S)(T)(U) shows the unified PMU with configurable circuit for the high voltage PHM, capless LDVR and low voltage PHM; (S) is the modified high voltage PHM to be the capless LDVR; (T) is the capless LDVR serving as the high voltage PHM; (U) is the modified version of the high voltage PHM or capless LDVR to be the low voltage PHM; (V) the timing waveform to wake-up the CML of fiber optics input buffer; (W) is the difference amplifier to wake-up the CML of fiber optics input buffer.
Figure 6D:
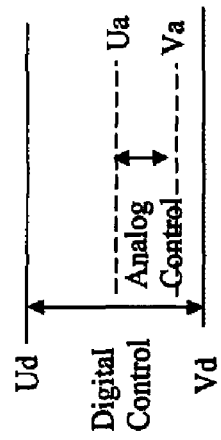
Figure 6A:
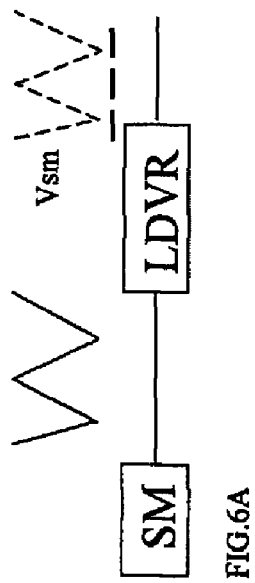
Figure 6C:
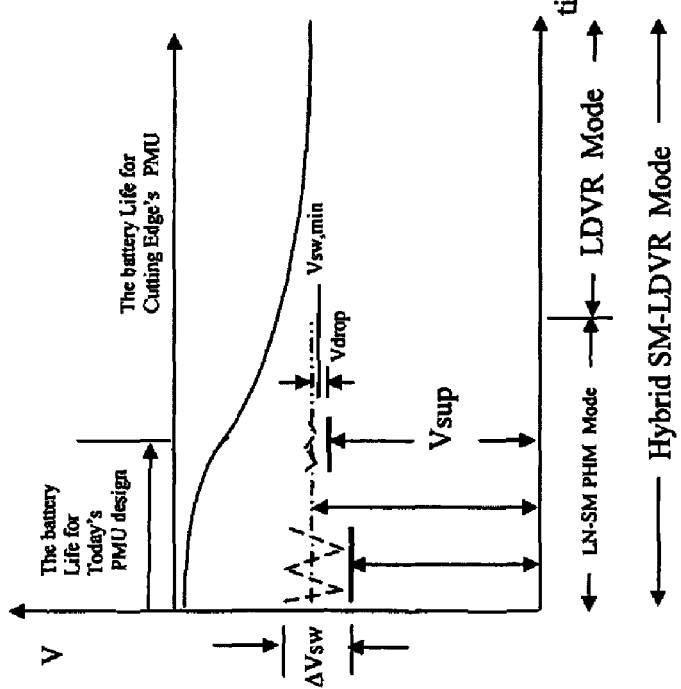

However, the LDVR's efficiency is E=Vsup/Vdd. As Vdd >>Vsup, the efficiency is pretty low. Now the digital circuit is 1.2V. The battery power is about 4V. The efficiency for battery PMU is 30% only. However, the portable device design is ask for the low power design to extend the battery life. How to increase the PMU efficiency becomes the first important issue. So the conventional on-board PMU architecture as shown in FIG. 6A is replaced with the battery PMU as shown in FIG. 6B. The digital circuit is operated at the voltage 1.2V with the large switch noise. The argument is the digital circuit itself has large switch noise so the switch noise of the Switch Mode (SM) power supply doesn't have impact on the performance digital circuit. So, the digital circuit can use the SM directly. However,today analog circuit design has drop to 1.8V. The anti-power noise analog circuit having very large PSRR has developed successfully. Can we connect the SM to then analog circuit? It implies that we have to consider both the efficiency and noise for the SM. As shown in FIG. 6C and FIG. 6D, we consider the both the noise and power efficiency in the PMU design. Actually, with the global system view, reduce the switch noise can increase the system power efficiency with the proper trade-off design. For SM, the load modulation on the Vsw,min causes the loss of power efficiency. As shown in FIG. 6C, the power loss due to the SM (switch mode) power noise of the output waveform $$Vsup = Vsw, min - Vdrop$$

(Vsup+ΔVsw)*Isup is the power consumption; (ΔVsw*Isup/2) is the extra power loss to reduce the power efficiency.

Furthermore, there are 3M design methodology, Mixed Signal, Mixed Voltage, Mixed Power, for the TSOC design. The Mixed Signal is to mix the digital circuit and analog/RF/sensor circuit on the same chip. Mixed Voltage is to have the multiple voltage levels on the same chip, such as V=1.2, 3, 5, 10 and the POS (power-on-sequence), PDS (power-down-sequence) become design issues. Mixed Power is to mix the drive circuit and the control circuit on the same chip. The PMU is 3M design. However, for the cutting edge battery PMU has another tough challenge to extend the battery life ×3 times or more than the today's PMU. The design style of today's PMU is still the old-fashioned on-board system design. The cutting edge PMU design is 3M-3H design PMU. The 3H is the three-hybrids.

The 3H is the Hybrid of PWM and PFM, the Hybrid of SM and LDVR and the Hybrid of digital PMU and analog PMU.

PWM (Pulse Width Modulation) is the switch mode with constant frequency and varying duty. PFM (Pulse Frequency Modulation) is the switch mode with varying frequency and constant duty period. PWM Design is specific load target and the target range is pretty narrow! PWM has the PFM effect at light load however it loses efficiency due to the constant frequency. PWM is not suitable for the wide dynamic load variation, such as the cellular phone!

To use all the battery power efficiently, the PMU is "dynamic load adaptive" to change its configurations and it is scalable in the configuration according to the load and battery condition. The hybrid of the digital and analog can reduce the switching loss, etc and keep the efficiency of PMU. As shown in FIG. 6C, the hybrid of the SM and LDVR is to extend the battery usage life. As the battery voltage drops and the switch loss makes the SM is no more gain over the LDVR in power efficiency, the hybrid SM-LDVR will change to the LDVR mode. The hybrid LN-SM is the hybrid Low Noise Switching Mode of the PWM (Pulse Width Modulation) and PFM (Pulse Frequency Mode) to be the PHM (Pulse Hybrid Mode).

Referring to FIG. 6C, FIG. 6D, FIG. 6E and FIG. 6F, the PWM_l is the pulse width modulation at light load; the PWM_h is the pulse width modulation at heavy load. The waveform of the switch mode power buck converter is operated with the PWM (Pulse Width Modulation) mode. The duty cycle is defined to be the switch-on time being divided by the clock period. As the load is heavy, the switching on time is longer and the duty cycle is larger. The power injection into Vsup is more. As the load is light, the switching on time is shorter and the duty cycle is smaller. The power injection into Vsup is less. However, to switch on and switch off, both switch energy losses are the same. So, the power efficiency for PWM is reduced as the load becomes small.

Referring to FIG. 6C, FIG. 6D, FIG. 6E and FIG. 6G, the PFM is designed for the light load. Several clock cycle, a constant finite impulse is the switch on signal to drive the drive circuit. The number of switching times is reduced that the switch loss is reduced at light load. However, for the heavy load, its switching loss is high and efficiency becomes low.

PWM and PFM is at two extreme modes. What is the optimum switching frequency and what is the optimum mode at that frequency? What is the way to adjust the frequency to adapt to the dynamic change of the load? Furthermore, either PWM or PFM, the design principle only considers the power efficiency and it doesn't consider the switching noise. From the global system viewpoint, the design principle is wrong. Referring to FIG. 6C, the user consider the voltage of the power supply is the minimum of the power supply. It forces the uses to have the target supply voltage set to be the high value. It even causes the global system to lose the power efficiency. Especially for the cutting edge Battery-PMU-X design, all the mixed signal analog circuit has the anti-power-noise design. As shown in FIG. 6T and FIG. 6U, the switch mode power supply can supply the analog circuit directly and the SM will be configured to be LDVR in the final battery-life stage to have the extended battery life. So, the cutting-edge Battery-PMU-X design needs to consider both the power efficiency and the switch noise at the same time to find out the optimum operating conditions for the global optimum solution. It is the PHM design.

Figure 6H:
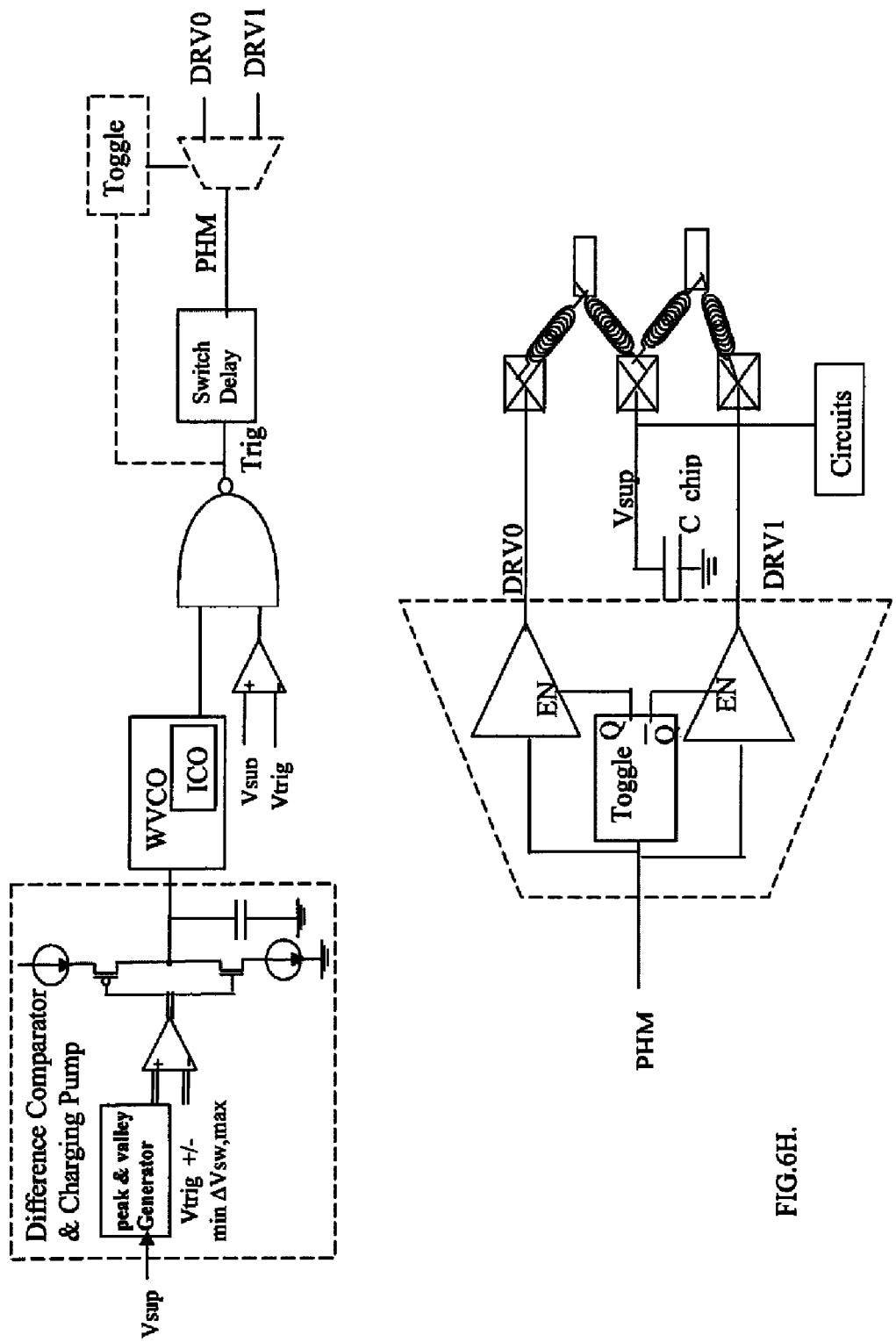

As shown in FIG. 6E and FIG. 6H, the PHM (Pulse Hybrid Modulation) considers both the power efficiency and switching noise to have the global optimum system operation to adapt the dynamic change of the loading condition. As shown FIG. 6E, as the clock frequency increases, the switch amplitude decreases. However, the clock frequency increases doesn't increase the switching loss as the PWM does. We use the multi-phase driver shuffling techniques to keep the switching loss to be the same even we increasing the clock frequency to minimize the amplitude variation. In other words, the essential characteristics of the fantastic design of PHM modulation is to deliver the same power have the same switching loss which is independent of the amplitude of the switch noise.

As shown in FIG. 6E and FIG. 6H, the multi-phase clock has the scheme to be m=2, Clk=m Clk×2 to illustrative the principle. The clock frequency is double to be ×2. However, we divide the drive to be two halves. In each clock, we switch on the one half driver. So, the switch loss is 2×(½)=1, i.e., the switch loss is the same as the switch loss with the minimum clock frequency having the maximum amplitude variation. However, the amplitude variation is reduced by half. The same principle can be extend to be the clock frequency is multiple ×m. the switch·loss is m×(1/m)=1, i.e., the switch loss is the same as the PWM type switch loss with the minimum clock frequency having the maximum amplitude variation. In other words, the power efficiency can be as high as 96% or more. But the switching noise is reduced to be 1/m. The clock frequency is boosted up m times to have m phase. For the high frequency switch, we can adopt the bonding wire to be the inductor to be the Indless SM.

As shown in FIG. 6H, it is an Indless SM having m=2. The inductance is the bonding wire. The damping capacitance C_chip is the on-chip capacitance or bonding capacitor. There is no external pin needed. The switch on signal PHM drives two driving buffers which are enabled by the toggling output signal Q alternatively. Each time, only one half the output driver of the Indless SM being activated. This architecture can be easily extended to be m=2n architecture. For m=2n, there is 2**(n−1) pairs of the drivers have the node Vsup connected together.

Figure 6I:
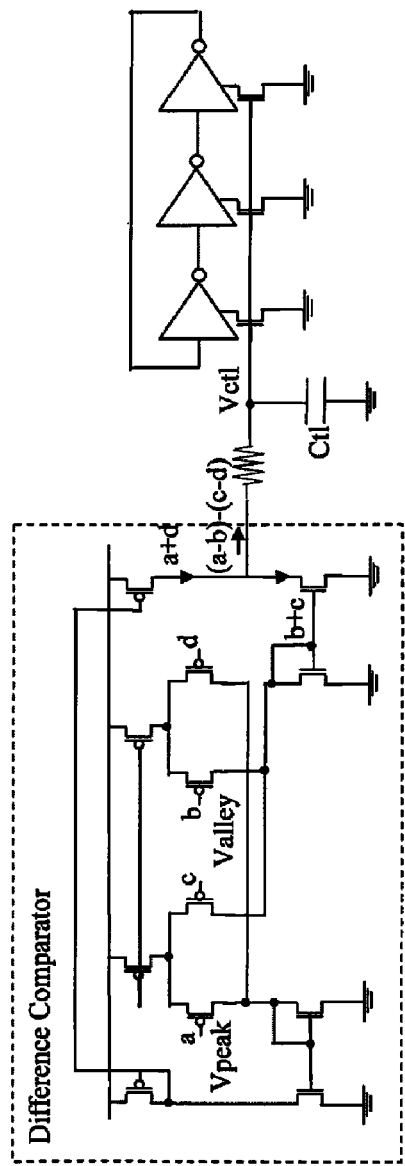
Figure 6J:
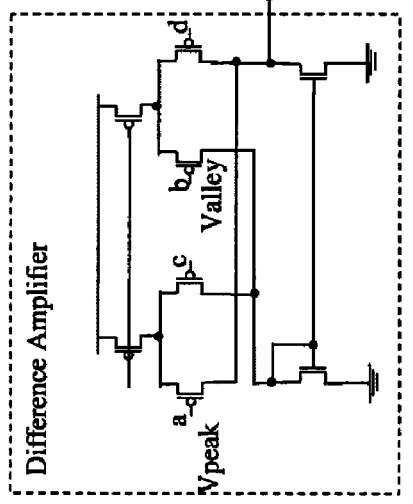
Figure 6K:
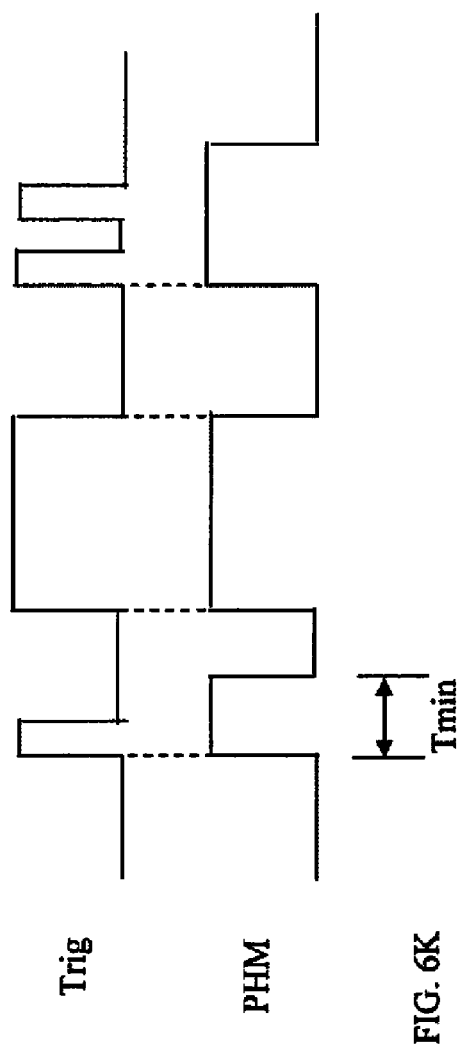

As shown in the FIG. 6H, FIG. 6I, FIG. 6J and FIG. 6L, it is the architecture and the circuit configuration of the PHM. FIG. 6H is to illustrate the concepts and principles of the PHM. FIG. 6I and FIG. 6J are the illustrative alternative design example of the PHM core circuit. The fundamental principle of PHM is (1) using the target voltage Vsup, min=Vsw=Vref to control charging or not; if Vsup, min=Vsw<Vref, then the PHM is triggered; (2) if the amplitude of Vsup, ΔVsup=(Vpeak−Valley), is large than the specified voltage difference ΔVref, increases the clock frequency until the amplitude of Vsup, ΔVsup=<ΔVref. As shown in FIG. 5K, the ΔVsup generator can be implemented with peak envelope generator and the valley envelope generator.

The clock frequency is generated from the Wide VCO (WVCO), the Wide frequency range Voltage Control Oscillator. The WVCO can be implemented with ICO, current controlled oscillator, to have the wide clock frequency range.

As shown in FIG. 6I is the current mode difference amplifier type varying frequency clock generator. The Vpeak is the envelop of peak of the Vsup; the Valley is the valley of the Vsup. The difference comparator makes the comparison of ΔVsup and ΔVref. As ΔVsup>ΔVref, the current charges up the low pass filter to increase the clock frequency. As ΔVsup<ΔVref, the current discharge the low pass filter to decrease the clock frequency. As shown in FIG. 6J is the voltage mode difference amplifier type varying frequency clock generator.

Figure 6L:
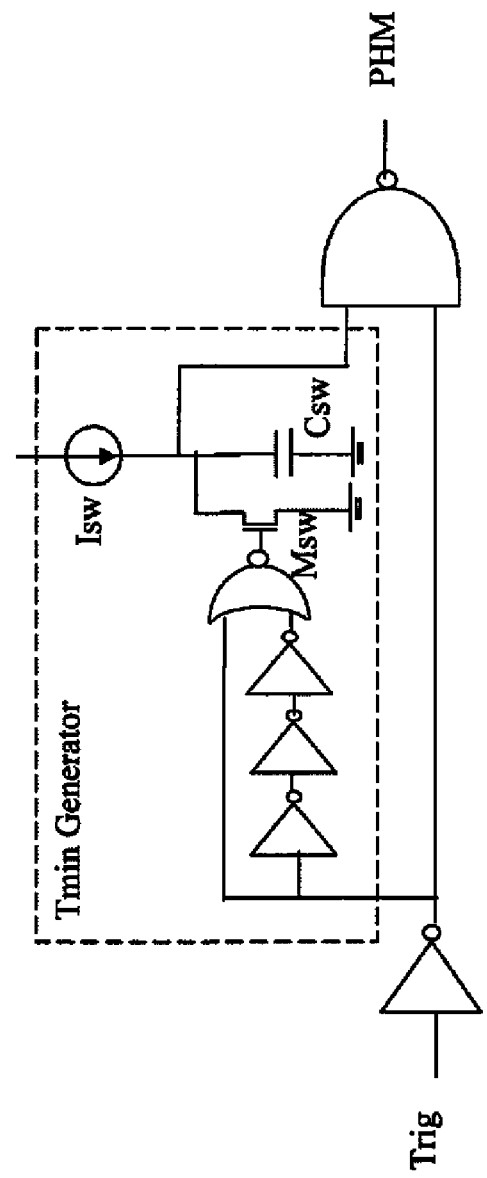

To turn on the driver, there is a minimum switching on time Tmin. This minimum pulse time Tminis equivalent to the finite pulse time in the PFM scheme. It is the minimum time needed to driver the output driver of the SM power supply. As shown in'~FIG. 6H, FIG.~K and FIG. 6L, the switch delay block generates a impulse which has a minimum finite period pulse. If the switch on time of Trig is larger than the minimum finite Tmin, then the switch on time of the PHM is the same as the input trigger signal Trig. If the switch on time of Trig is less than the minimum finite Tmin, then the switch on time of the PHM is the switch on signal having the switch-on period to be Tmin. Referring to FIG. 6L, at the rising edge of Trig, the PHM will generate a rising edge. The Tmin generator will generate the pulse having the negative pulse width Tmin. The negative pulse width Tmin is the charging up time of Csw with Isw. At the rising of Trig, the discharging device Msw will discharge the capacitor Csw instantly. Then the charging current Isw starts to charge up the Csw to count for the minimum pulse time. With this switch delay module, we can make the dynamic load adaptive switch between the PWM and PFM modes.

Figures 6M, 6N:
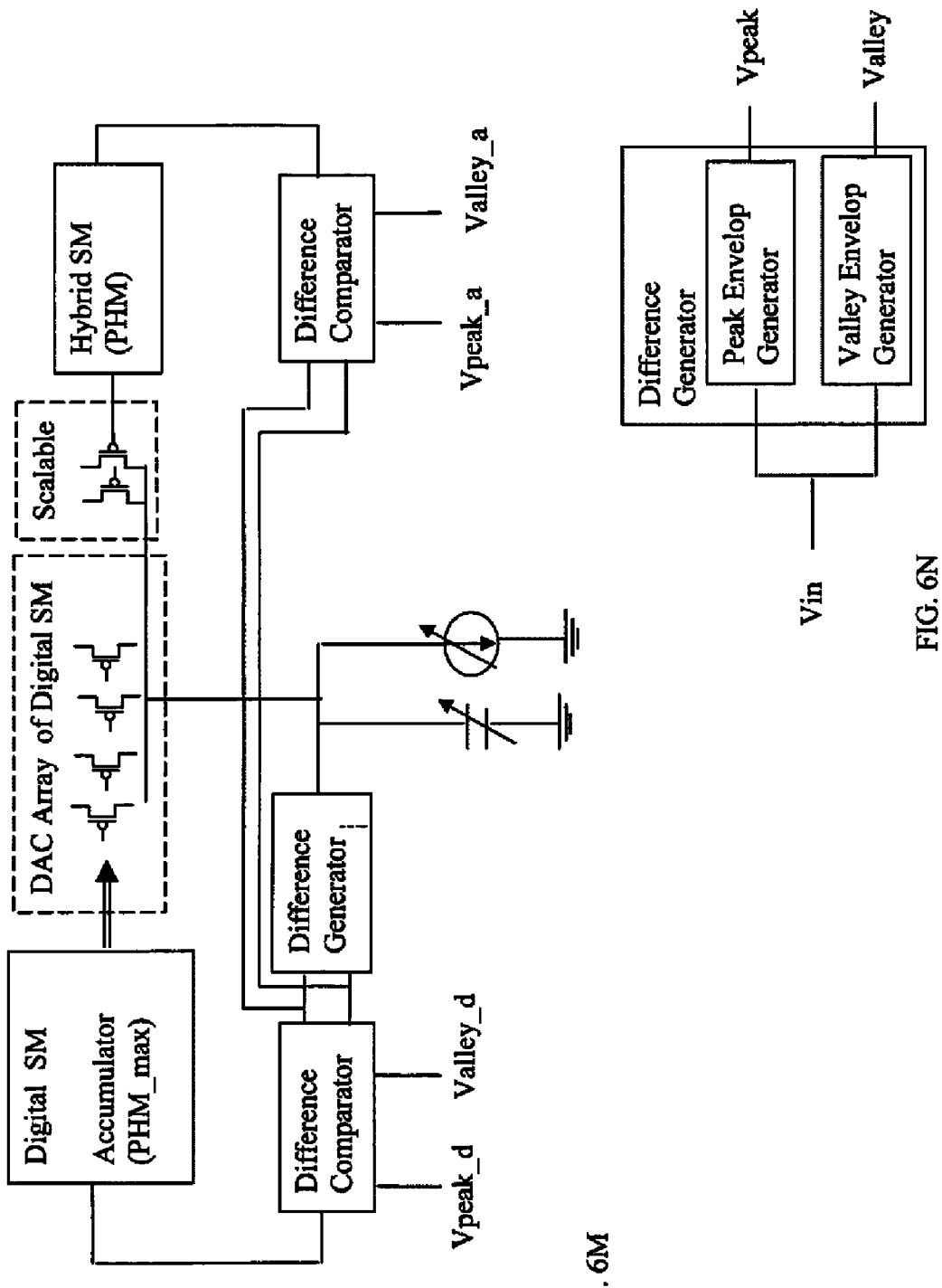
Figure 6T:
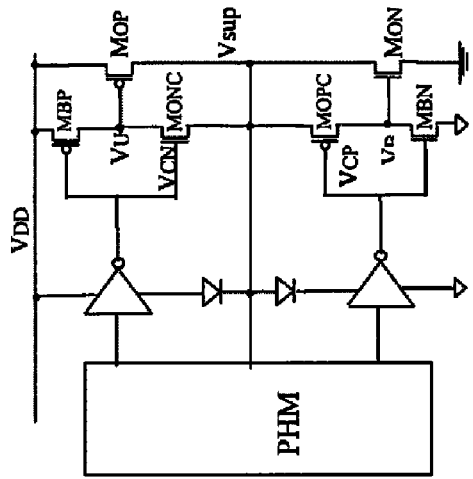
Figure 6U:
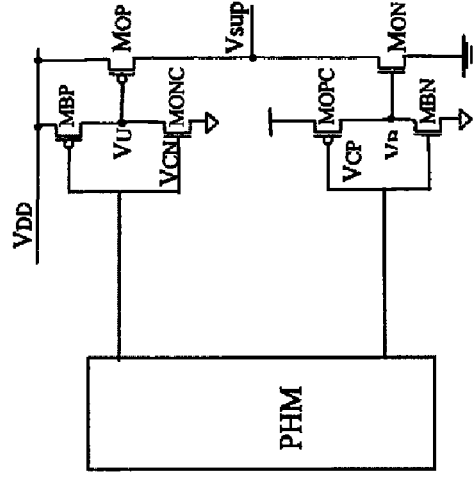

As shown in FIG. 6M, to increase the power efficiency, the hybrid SM made of the digital SM and analog PHM can be applied to the SM power supply. The digital SM will use the Vpeak_d and Valley_d to decide the minimum number of the switches needed to drive the load. Then the analog PHM will use the Vpeak_a and Valley_a to find out the minimum scalable switches to supply the SM power supply. It is noted that the pure digital SM has the stability problem due to the longer delay of digital control loop. The analog PHM is unconditional stable. In this hybrid scheme, the digital SM becomes an open loop and the analog PHM takes over to handle the stability of the feedback control. So, the hybrid SM of digital SM and analog SM has the stability, power efficiency and minimum amplitude variation to be the best SM power supply. With this hybrid scheme, it will make the SM to work in the highest power efficiency with the minimum amplitude variance of power supply. Furthermore, as shown in FIG. 6T and FIG. 5E, it is noted that the Capless LDVR and PHM can share the same output driver stage to be unified power supply Buck regulator SMLDVR-switch mode low drop voltage regulator.

Figure 6R:
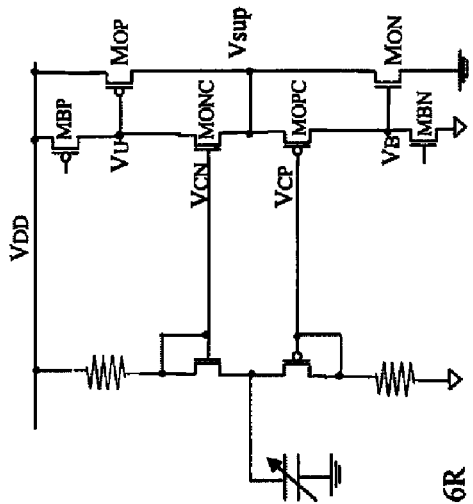
Figure 6S:
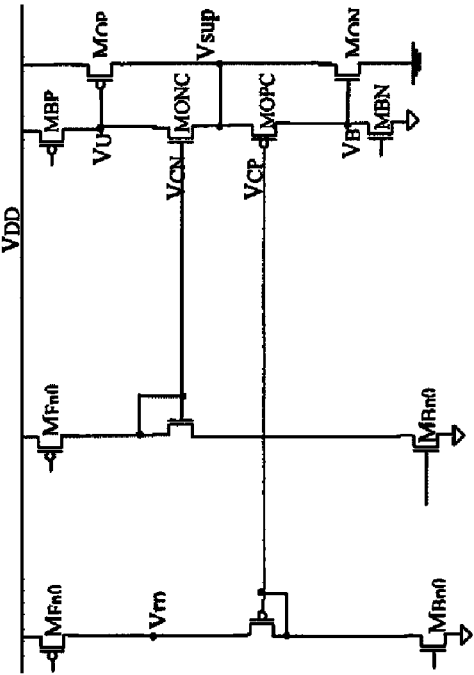

FIG. 6O shows the architecture of the Battery charging circuit for Battery PMU. FIG. 6P is the architecture of the power supply for Battery PMU. FIG. 6Q is the power-on sequence for the Battery PMU. For the portable cellular phone, etc, made of low voltage devices, the battery voltage is high voltage. We need to have the high voltage PMU design. The process has the high voltage device and low voltage device. For the high voltage PMU circuit, we use high voltage devices. As shown in FIG. 5C, FIG. 5D and FIG. 6R, FIG. 6R is the ramp up for the input voltage of the high voltage power supply for Vsup. As shown in FIG. 5C, and FIG. 6S, it is the clamping circuit of the high voltage PMU circuit. It is further noted the high voltage Capless and PHM can share the same output driver stage to be Buck regulator of LDVR. As shown in FIG. 5C, FIG. 6T and FIG. 6U, with the configurable circuit design, the PHM and LDVR can be unified to have the Battery-PMU-X design of FIG. 6C.

Figures 6V, 6W:
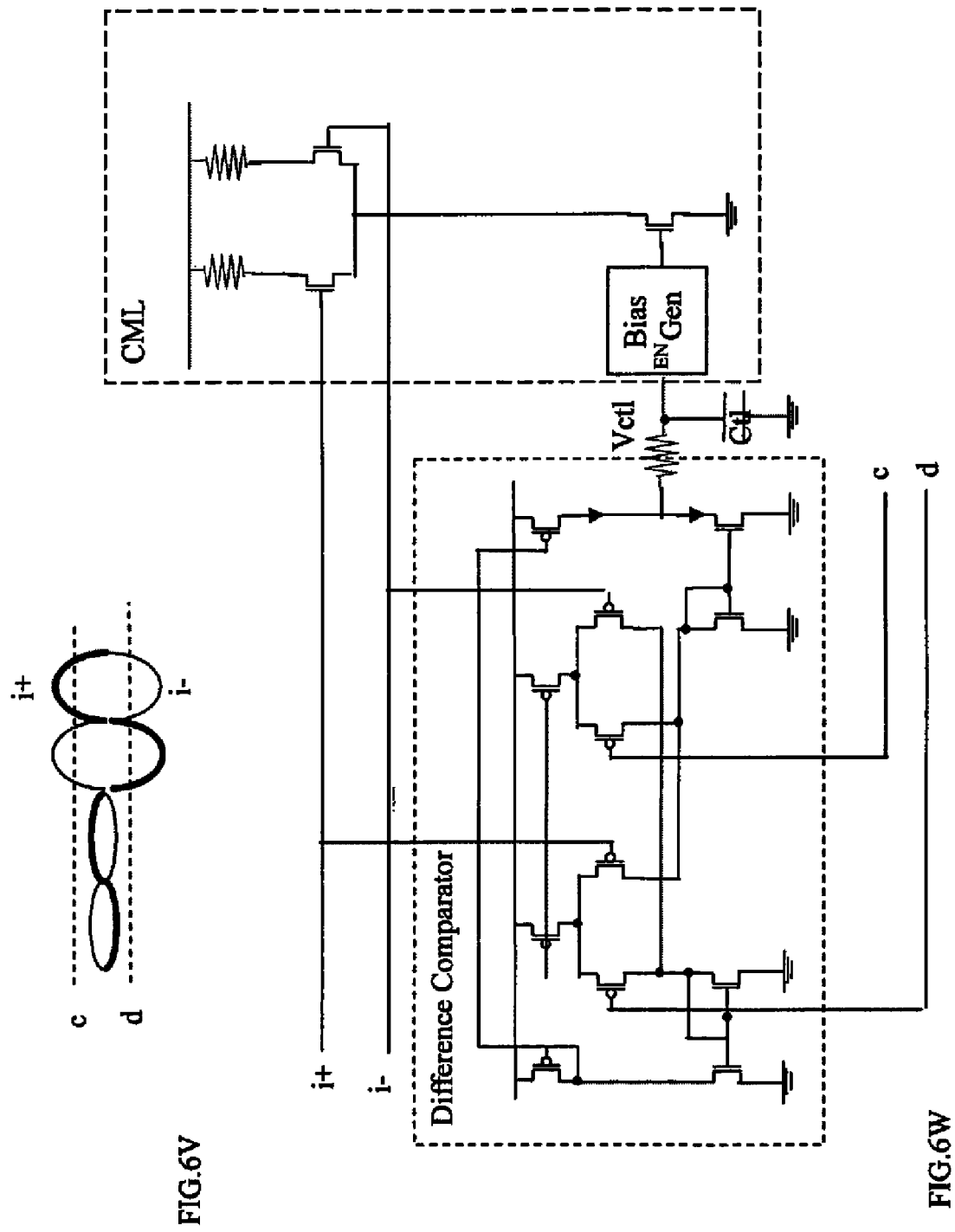

Today's PMU has such poor design is due to the former designer doesn't know the difference comparator that they cannot use the difference amplifier to control the amplitude variations of the power supply. As shown in FIG. 6J, FIG. 6V and FIG. 6W, the difference comparator has the application in many different designs. The high speed Fiber Optics uses the CML inputs. The CML consumes a lot of power. As there is no signal comes in, the input CML needs to disable to save power. The difference amplifier/comparator serves as the wake-up circuit for the CML input buffer of the Fiber Optics. As shown in FIG. 6V and FIG. 6W, as the differential pair of input signal i+ and i−is large than the specified difference level |c−d|, the bias generator circuit will be activated to wake up the CML input signal to work normally.

In communication theory, the white noise is a random noise. The true random noise generator (TRNG) is to generate a number having the spectrum of the white noise. The hardware random noise generator adopts the avalanching diode high voltage breakdown process. It needs the high voltage and it cannot be integrated with the CMOS chip. Our invention is to generate the TRNG with the low voltage CMOS randomized chaos circuit. The randomized chaos circuit is to randomize the chaos with the hierarchical design of the randomized circuit over the chaos circuit.

Figure 7A:
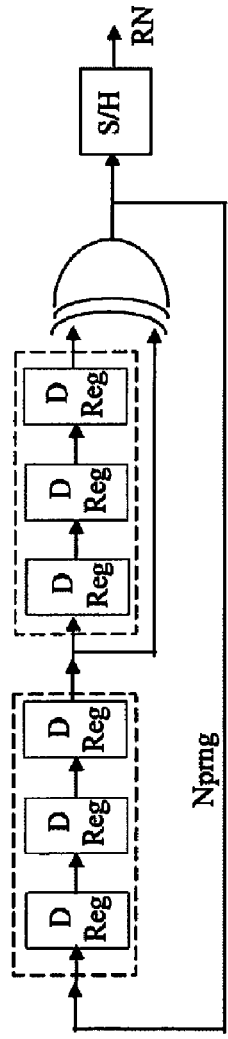
FIG. 7 is the TRNG (True Random Number Generator); (A) is the conventional PRNG (Pseudo Random Number Generator) with the left shift digital register; (B) is the basic TRNG (True Random Number Generator) with the ring-shift analog inverter; (C) is the HTRNG (Hierarchical True Random Number Generator) having the recursive of the basic TRNG; (D) is the illustrative picture of the concept of the randomized chaos; (E) is the result of the phase plotting trace of the randomized chaos; (F) is the phase diagram of the X1 and X2 in FIG. 7B having no chaos condition; (G) is the phase diagram of X1 and X2 in FIG. 7B having the chaos condition; (H) is the frequency band of signal; (I) is the frequency spectrum of white noise; (J) is the sampling S/H effect; (K) is the white noises spectrum of the random number; (L) is the architecture for the addition of the random number noise to the circuit noise through the AC coupling in FIG. 7B and FIG. 7C; (M) is the circuit configuration for the addition of the random number noise to the circuit noise through the AC coupling in FIG. 7B and FIG. 7C; (N) is the left shift type analog register in ring oscillator; (O) is the voltage mode analog register; (P) is the current mode analog register; (Q) is the example of the basic circuit configuration of the True Random Noise Generator made of the left shift analog register.
Figure 7B:
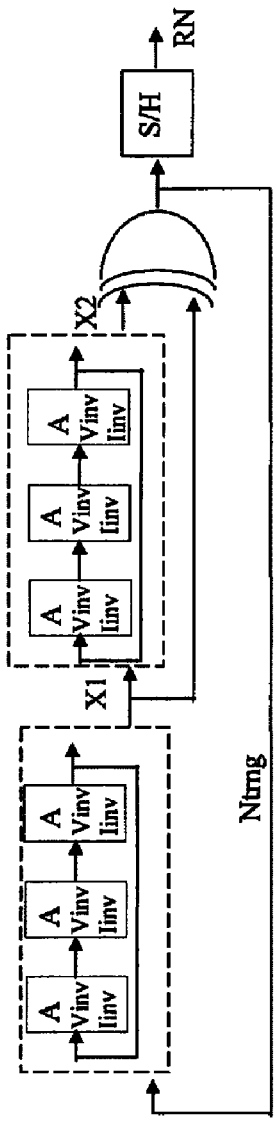
Figure 7C:
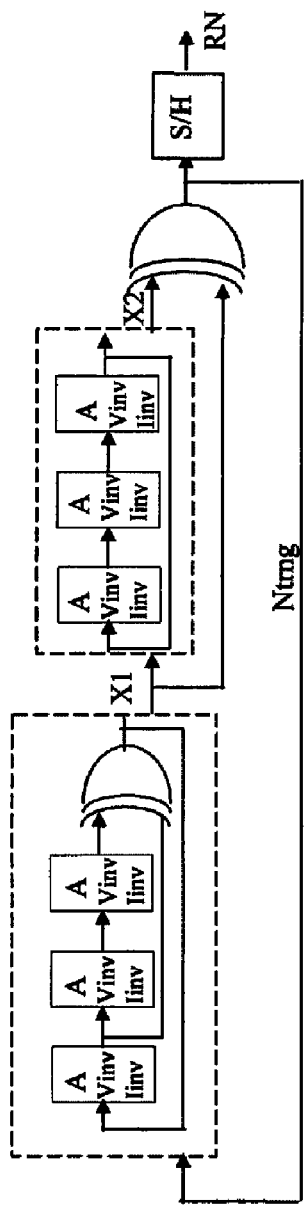
Figure 7E:
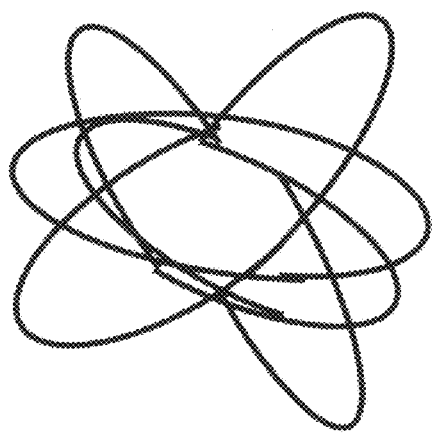

As shown in FIG. 7A, the conventional PRNG (Pseudo Random Number Generator) is made of two segments of shift register SR and one XOR gate. The PRNG is a uniformly distributed mechanism to have the uniform distribution over a domain/space. Qualitatively, the PRNG has the memory to keep what it has the distribution and trying to generate new data which has not distributed yet. The XOR gate is to generate a data which is not existed in the already distributed domain. The two segments of SR keeps the memory of previous already distributed domain/space information.

However, the domain of the PRNG (Pseudo Random Number Generator) is limited to be 2**N where the N is the number of registers. The PRNG makes the randomized uniform distribution in the finite space in discrete time domain. Eventually, the finite domain will run out the resource that the PRNG has to repeat the old patterns again. That is the reason why the digital type random number generator to be pseudo random generator.

The PRNG has the fundamental Random Number Generator (RNG) mechanism. As shown in FIG. 7B, to make the RNG to be the TRNG, the Random Number Generator (RNG) mechanism has to operate as the analog signal processor in the infinite space in the continuous time domain. The space is analog signal that it has the infinite space. For the N analog stage, the (infinite)**N states are infinite space. In FIG. 7B and FIG. 7C, the random number signal Ntrng feedbacks to the analog type shift register. FIG. 7D shows the analog style feedback of the random signal Ntrng. The analog signal are continuously varying in time domain. The time domain are continuous to be infinitely small to be infinite domain. As shown in FIG. 7C, the RNG mechanism can be implemented hierarchically and recursively. With the feedback of the chaos, the noise is generated by the chaos circuit itself, too. With the infinite domain and time space, the chaos doesn't have the limit of the pseudo-periodic behavior of the conventional chaos circuit.

As shown in the FIG. 7D, in the phase diagram, the solid line is the attractor of chaos circuit. The attractor of chaos is characterized by the repetitive traces of curves. In time domain, the chaos is characterized by the pseudo-periodic waveform. For the random noise generator, both the periodic and pseudo-periodic curve cannot be used as the random noise generator. It has to be the randomized chaos to be Randomized Chaos circuit. It has to be the combination of the chaos circuit and randomized Circuit. As shown in FIG. 7B, the ring oscillator including the noises source is equivalent to the chaos circuit; the left-shift register circuit including the XOR gate and feedback is the randomized circuit. The randomized circuit drives the chaotic circuit to make the randomized chaos for the RNG (Randomized Number Generator).

Figure 7G:
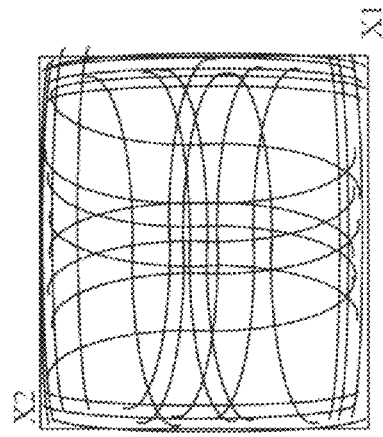
Figure 7D:
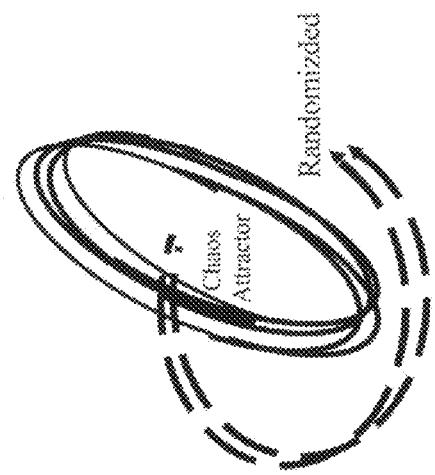
Figure 7F:
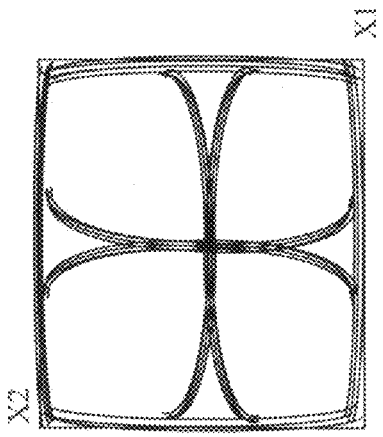

As shown by the dotted line in FIG. 7D, the randomized signal is applied to the chaos circuit. As shown in FIG. 7E, the curve traces of the chaotic circuit rotates on the phase diagram as the random circuit applies the randomized signal on the chaotic circuit. As shown FIG. 7F, the trace of curves is the circuit without the feedback of the randomized Ntrng. The curve shows the attractor of chaos circuit. As shown in FIG. 7H, the spectrum is a narrow bandwidth of the pseudo-periodic oscillations. As shown in FIG. 7G, as the randomized signal Ntrng applying on the chaos circuit, the trace of the curve seldom repeat itself. The phase diagram uniformly weaved on the phase diagram.

As shown in FIG. 7I, the spectrum of the randomized chaos is a broad bandwidth of the TRNG randomized oscillations. As shown in the FIG. 7J, it is the spectrum of the S/H in FIG. 7A, FIG. 7B and FIG. 7C to have the discrete repetitive delta function in frequency the FIG. 7I and FIG. 7J. The sample and hold of the broad noise spectrum of the randomized chaos in FIG. 7I becomes the TRNG having the infinite noise spectrum of the white noise as shown in FIG. 7K. This is the fundamental principle of the randomized chaos generating the true random noise. In the real application, the hierarchically recursive randomized chaos will be adopted to have any different combinatory applications.

Figure 7M:
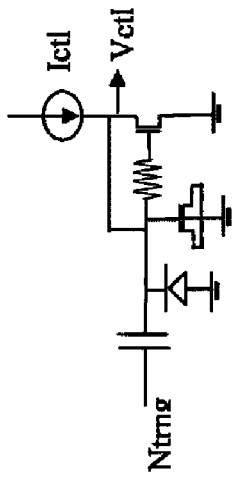
Figure 7L:
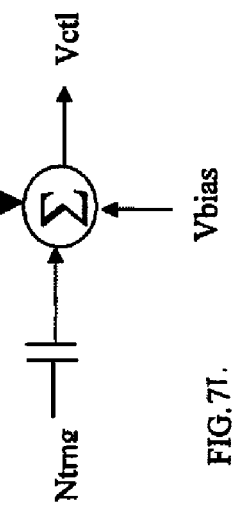

As shown in FIG. 7L, the random signal Ntrng is AC coupling on the biasing voltage generator to generate the Vctl controlling voltage for the analog type shift register. As shown in FIG. 7M, it is the implementation of the AC coupling of the Ntrng noise interface circuit. The other type noises of quantize noise Nquantize, ground noise Nground, thermal noise Nthermal, diode noise Ndiode, bipolar noise Nbiploar, MOS noise Nmos will add on the bias voltage, too.

Figure 7N:
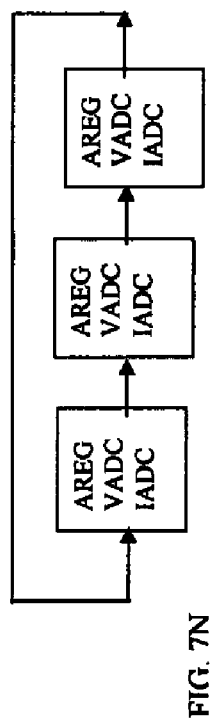

There are many different kinds of the analog type shift registers. In FIG. 7B and FIG. 7C, the analog shift register is similar to the VCO type circuit being made of the inverters. However, as shown in FIG. 7N, the analog shift registers can be made of the voltage type ADC or current type ADC. The noise generated by the ADC is the quantized noise in the analog to digital conversion processes.

Figure 7P:
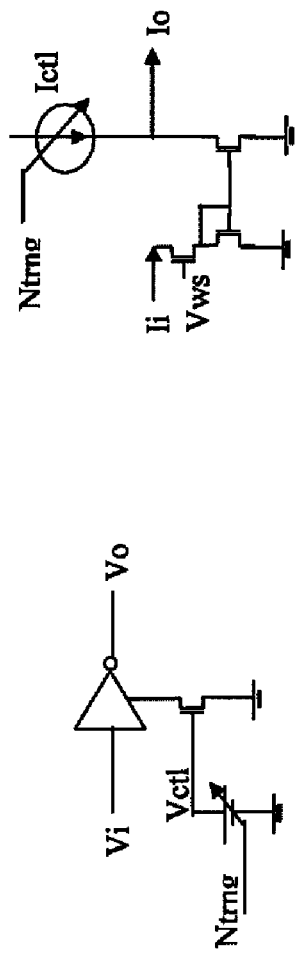
Figure 7O:
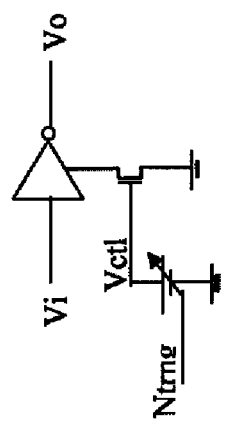
Figure 70:
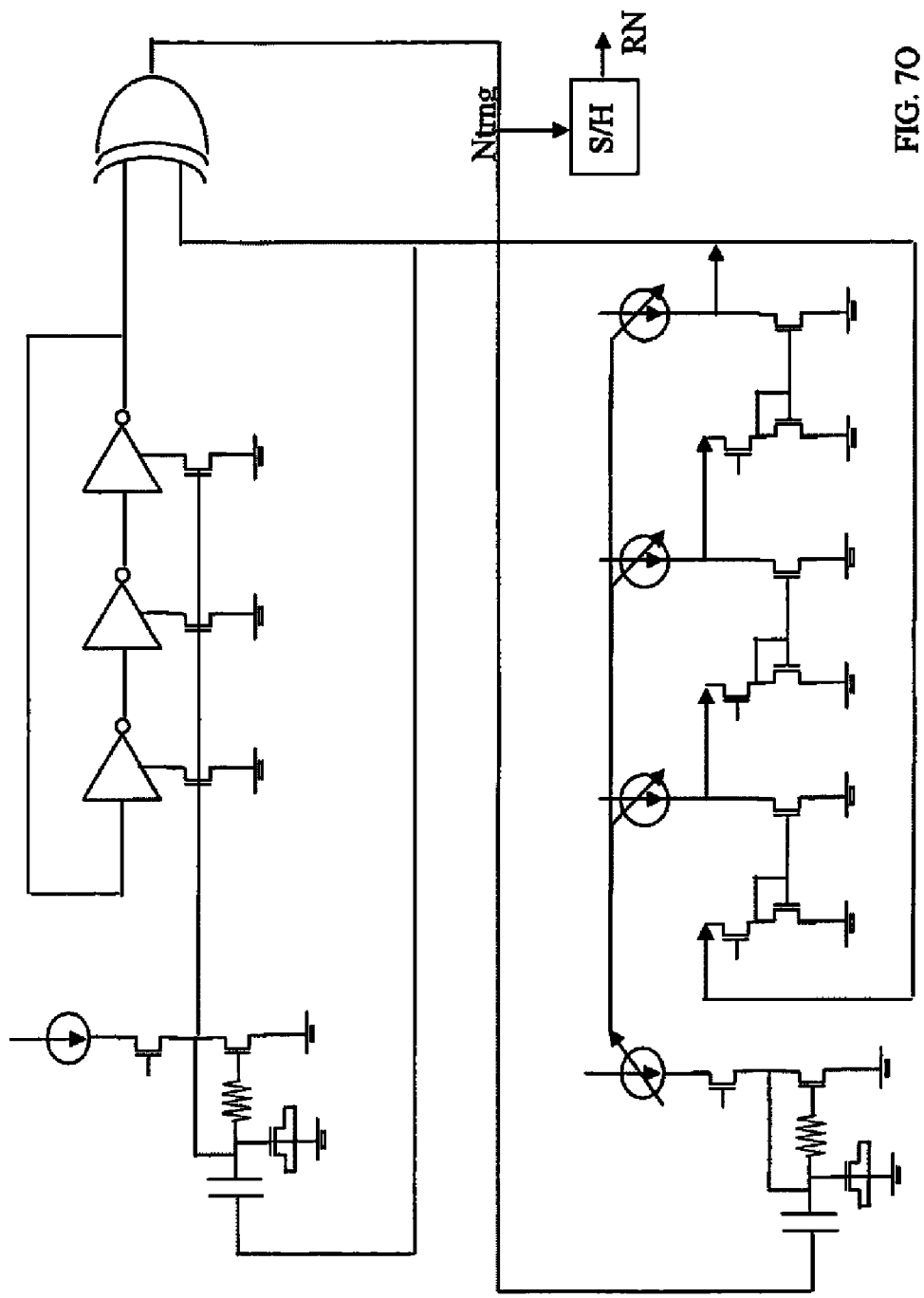

As shown in FIG. 7O, it is the voltage type analog shift register. The Ntrng noise induces the variance of Vctl to inject the noise into the voltage type analog shift register. As shown in FIG. 7P, it is the current type analog shift register. The Ntrng noise induces the variance of Ictl to inject the noise into the current type analog shift register.

FIG. 7Q is one example to illustrate the TRNG with the hierarchically randomized chaos circuit. It has the similar architecture as shown in FIG. 7B. There are two analog type shift registers having the infinite voltage states and in continuous time domain. One analog type shift registers is voltage type shift register. Another analog type shift registers is current type shift register. The output of current type shift register is fed into the voltage type shift register with the AC coupling. The output of current type shift register and the output of voltage type shift register XOR together to be the Ntrng signal and feedback to the current type shift register. The Ntrng is the randomized signal and send back to the analog type register to have the uniformly distributed in the infinite voltage state and continuous time domain to have the white noise type random, number.

Figure 8A:
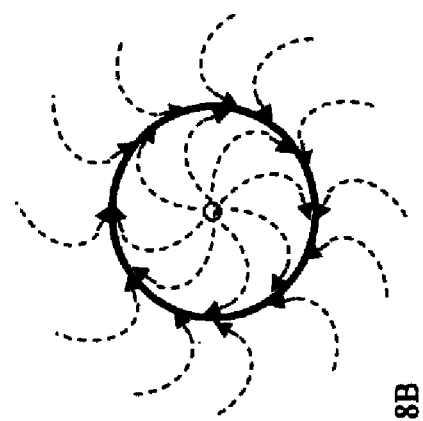
FIG. 8 is the first true comparator in all the world; (A) is the jumping behavior in the true comparator; (B) is the limit cycles phenomena on the phase plot for the jumping phenomena; (C) the universal architecture for the true comparator; (D) is the specialized OPAMP for the true comparator which has the jumping behavior.
Figure 8B:
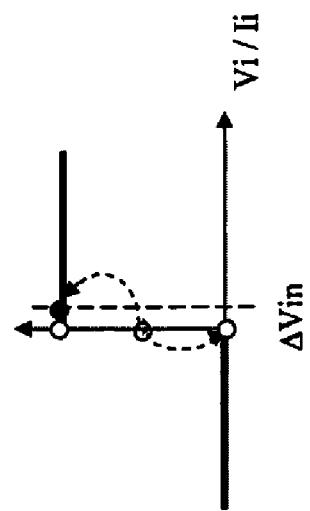

In the 4-Less TSOC design, we use a lot of comparators. However, so far, there is no true comparator. As shown in FIG. 8A, the true comparator has the jumping behavior. The equilibrium point at the origin is an unstable equilibrium. There is a jumping up and jumping down process at the equilibrium point. It is a jumping from the analog signal to digital signal interface process. If there is no such kind jumping process, it is not a true comparator. As shown in FIG. 8B, the comparator 1-D jumping process phase plot is similar to the 2-D phase diagram. Inside the limit cycle, it is the unstable equilibrium point and the trace spirals out and terminate at the limit cycle. So far, it uses the high gain OPAMP to emulate the comparator. However, the OPAMP is stable and continuous at the equivalent point and might be unstable at the extreme points. The comparator is discontinuous and unstable at the equilibrium point and unstable at the extreme points of 0 or 1 state. It is just reverse the properties of comparator. The comparator is unstable at the equilibrium point and stable at the extreme points of 0 or 1 state. So it is a fundamental mistake to use the high gain OPAMP to substitute for the comparator.

Figure 8D:
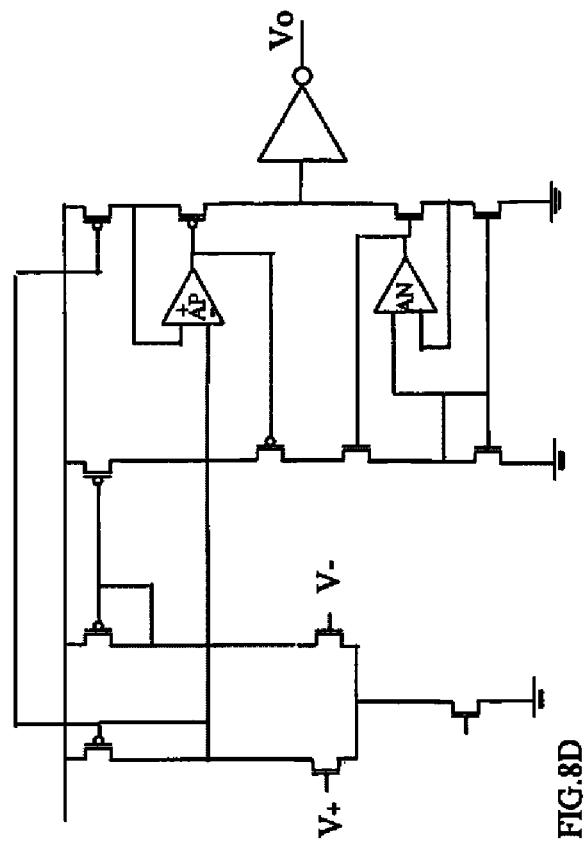
Figure 8C:
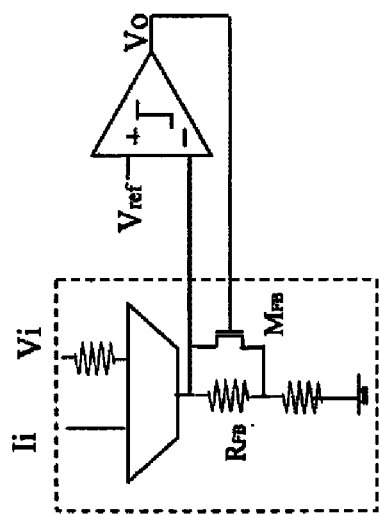

FIG. 8C and FIG. 8D shows the first TRUE comparator in all the world. The gain boost amplifiers AN and AP make the equilibrium point to be unstable to have the jumping process of the comparator. The feedback device MF8 and resistor RFB make the comparator to be stable at the extreme points of state 0 and state 1. The general architecture of the comparator in FIG. 8C makes the comparator can be shared in many signals of the current type signals or voltage type signals. The share of the comparator is very important for the many sensors system to share the common resources.

Figure 9B:
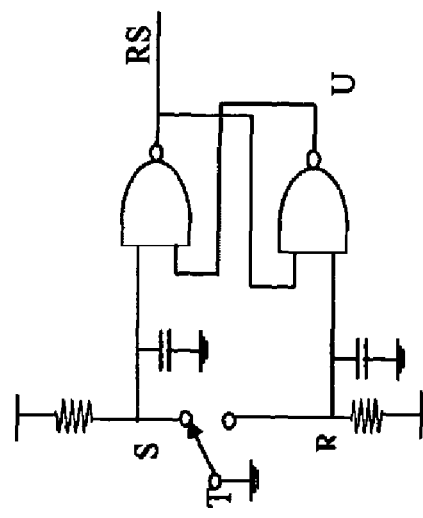
FIG. 9 is the electronic debouncing switch; (A) is the conventional mechanical toggle pseudo-debouncing switch; (B) is the mechanical double-throw pseudo-debouncing switch; (C) is the circuit of the electronic capless true debouncing switch; (D) is the switch behavior of the capless electronic true-debouncing switch.
Figure 9D:
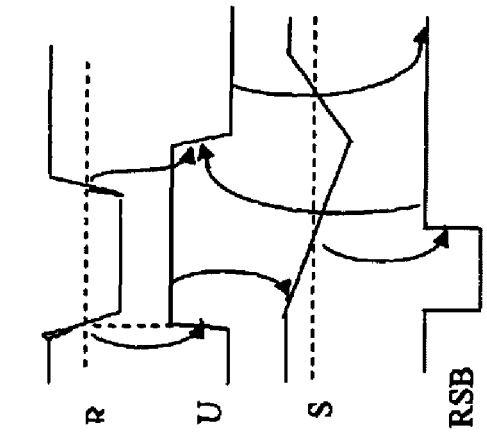
Figure 9A:
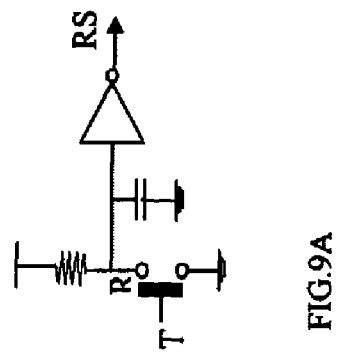
Figure 9C:
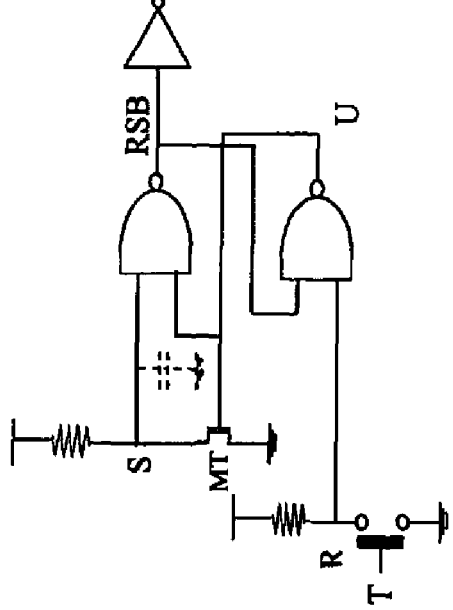

To reset the SOC, we need the perfect de-bouncing switch. FIG. 9C shows the first capless debounce switching circuit. As shown in FIG. 9A, the mechanical toggle switch T will generate spark flash. It has only one capacitor to damping out the spark. The capacitor must be large and it becomes the on-board capacitor. However, the inductance of the package of the capacitor will reduce the de-bouncing effect of the capacitor. FIG. 9B shows the two-state switch de-bouncing circuit. The double-throw switch needs two on-board capacitors. However, the essential problem of the mechanical switch is still there. FIG. 9C shows the capless debouncing circuit. The mechanical toggle switch T triggers the electronic switch MT. The electronic switch MT has no disconnection that there is no spark. So the capless debouncing circuit converts the mechanical switch to be electronic switch to get rid of the spark. There is no spark that there is no need for the on-board capacitor. FIG. 9D shows the switch timing waveform of the capless debouncing toggling switch.

The USB switch is one of the most important PMU (Power Management Unit). The USB can supply the power. However, there are multiple USB devices. Each USB device might have its own supply power or it receive the power from outside. To arbitrate which power will be adopted, there is a need for smart USB switch to make the arbitration automatically.

Figures 10A, 10B:
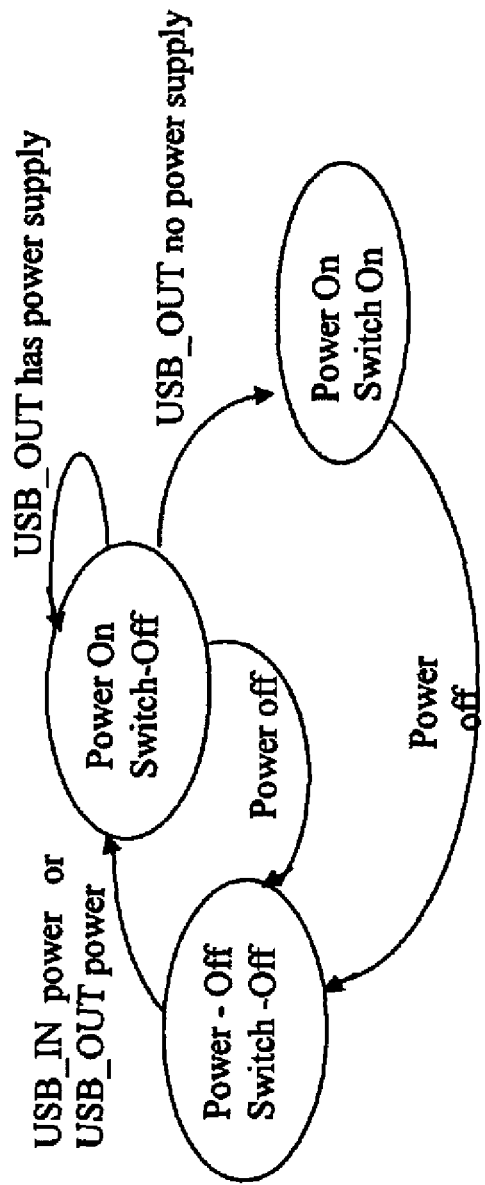
FIG. 10 (A) is the pseudo-truth-table of the USB smart switch; (B) is the pseudo-state-diagram of the USB smart switch; (C) the architecture and circuit configuration of the USB smart switch; (D) the schematic of the circuit of the USB smart switch.

As shown in FIG. 10A, it is the smart USB switch power table for the relation between the USB IN init power and USB OUT init. The smart USB switch principle is to save the external power if there is a local power on the SB OUT side. However, the power on transient process is unpredictable and varies a lot. The ramp up slew rates of USB IN and USB OUT can be much different. The voltage levels of USB_IN and USB_OUT are much different in the transient process. Even there is the supply power on the USB_OUT side, however, the ramp up slew rate of USB_OUT is slow. It might make the wrong decision to open the switch SW_p. As the switch SW_p is turned on, both USB_IN and USB_OUT have power. It is impossible to make the decision of which side has power to be the power supply. All the decision has to make at the beginning of power on and the switch is still turned off at that time.

FIG. 10B is the power state diagram. It is different from the logic state diagram. The power state has the power off state. As the power is off, there is no logic state. No power, no logic state. However, the power state still has one power off state. So the power state cannot implemented with the logic state circuit. FIG. 10C is the architecture of the smart USB switch. The PMOS switch has the floating well. At beginning, the PMOS switch is off. Either USB_IN or USB_OUT has the power, the floating well of SW_p will be charged up. The Slow Power Up Detector, Rising Detect and FF will be powered up. If there is power on the USB_OUT, the fast PwrUp/PwrDn detector is 1, otherwise it is 0 state. The state will lock in the FF as the Slow Power Up Detector is powered up and generates a rising edge pulse. The lock state will decide whether the SW_p is on or off. FIG. 10D is the detailed circuit of the smart USB switch. As the power goes away, the Fast PwrUp/PwrDn Detector will issues a signal to discharge the Slow Power Up Detector and the FF will turn off the PMOS switch before the power has gone away. As the Slow Power Up Detector is discharged, the PMOS switch SW_p is switched off at the same time.

For SOC design, the digital circuit has the POR (Power On Reset) signal to reset all the FF (Flip-Flop) to the initial states condition. Similarly, for the analog/mixed signal circuit such as pipeline ADC and algorithmic ADC, etc, it has to set the initial phase clock, etc to avoid the short of the circuit, etc. The APOR is the analog power on reset signal to indicate the analog bandgap reference Vbg and Ibg are at the correct values and the APOR should be generated at the rising edge of Vbg_OK signal.

Figure 11C:
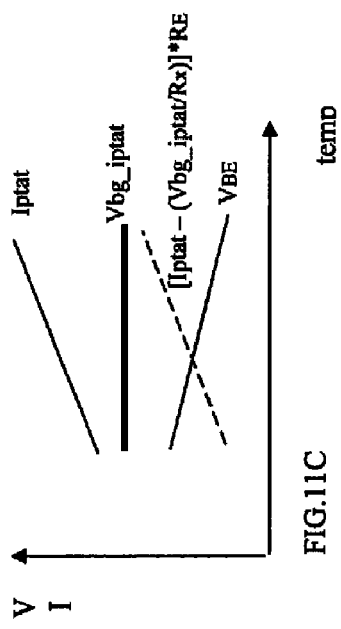
FIG. 11 is the bandgap reference Vbg, Ibg and Vbg_ok; (A) the bandgap reference circuit; (B) the schematic of the circuit of Vbg_ok; (C) is the working principle of the sub threshold bandgap voltage Vbg_iptat; (D) is the working principle of the Vbg_OK.
Figure 11B:
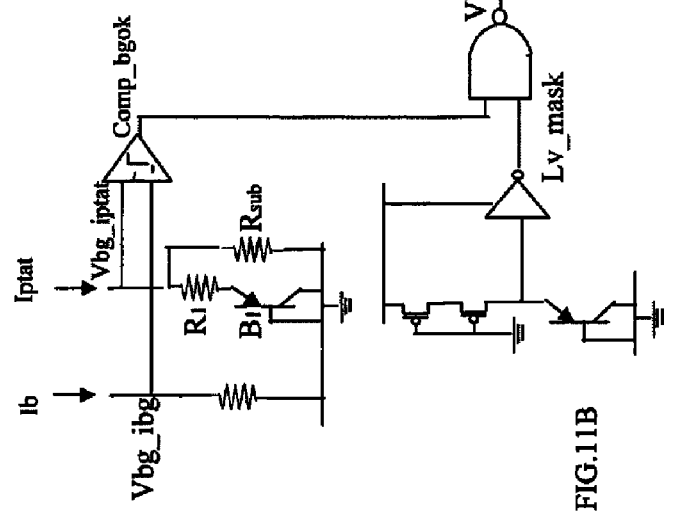
Figure 11A:
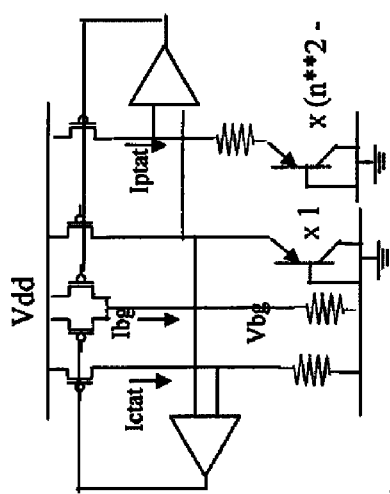

As shown in FIG. 11A, the Iptat is generated by the conventional bandgap reference circuit. The Ictat is generated with (VBE/R). As shown in FIG. 11C and FIG. 11E, the sub-threshold bandgap reference voltage Vbg_iptat is generated with the Iptat injecting in the series connection of R 1 and B1 in parallel with the sub-threshold resistor Rsub. The principle of the sub-threshold Vbg_iptat is as shown in FIG. C. Assuming the Vbg_iptat is constant over temperature, the current flowing through Rsub is (Vbg_iptat/Rsub) to be a DC constant. So the current Iptat is reduced by a constant DC value. It is the principle of the sub-threshold Vbg_iptat as follows.

[(Iptat−Iptat_dc)*R+VBE]
=Vbg_iptat<<Vbg=Iptat*R+VBE where VBE is the bipolar base-emitter voltage.

Figure 11D:
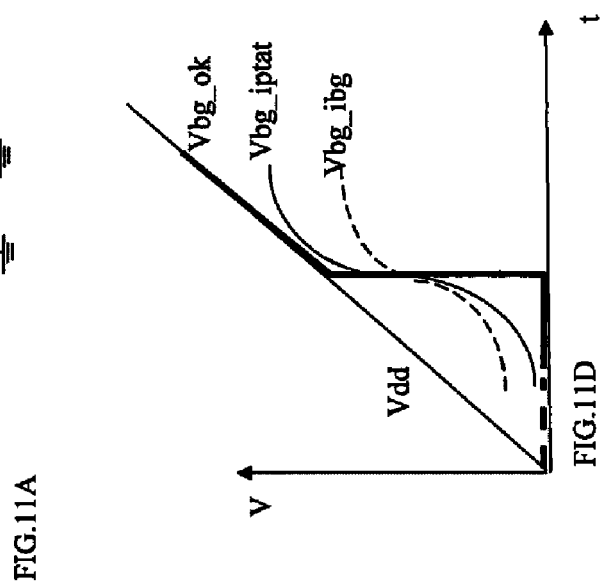
Figure 12B:
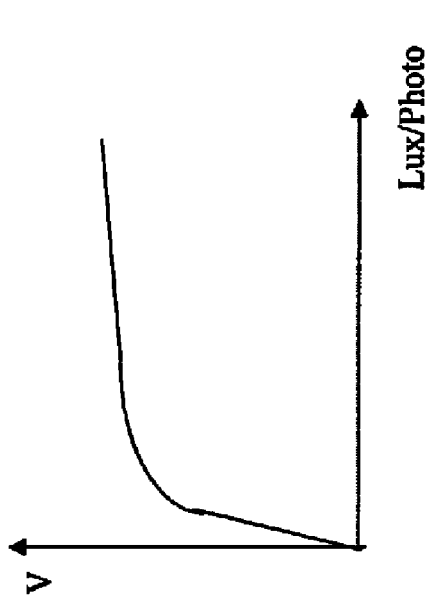
FIG. 12 (A) is the high dynamic range APS; (B) the characteristic curve of the high dynamic range APS; (C) is the leakage of low voltage MOS; (D) is the still/video/surveillance triple mode camera in the surveillance mode to have the wide dynamic range; (E) is the pipeline of the bit line read and parallel integration ADC conversion; (F) is the sampling of bit line for reset signal and holding for ADC conversion for integrated signal; (G) is the sampling of bit line for the integrated signal and holding for ADC conversion for reset signal; (H) is the digital correlated double sampling; (I) is the pipeline for the counting and read out pipelined parallel operation; (J) is the architecture for the still/video/surveillance triple mode camera.
Figure 12D:
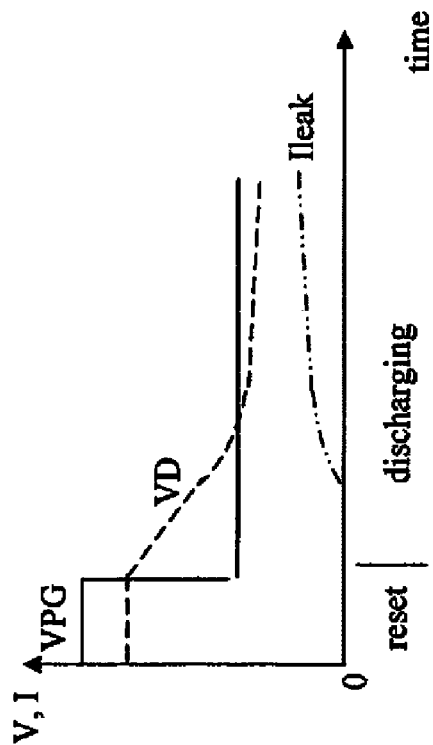
Figure 12A:
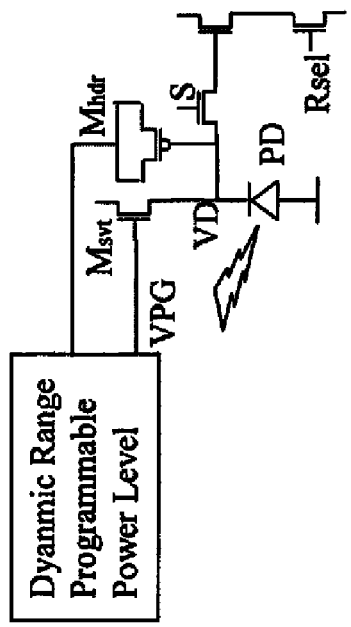
Figure 12C:
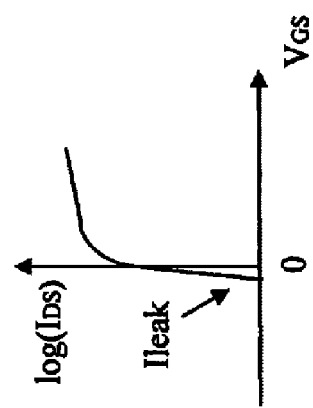

As shown in FIG. 11E, both the Ibg and Iptat can generate the Vbg differently to be Vbg_ibg and Vbg_iptat. Vbg_ibg is derived from Ibg; Vbg_iptat is derived from Iptat. Both Vbg_ibg and Vbg_iptat can be sub-threshold bandgap voltage. However, as shown in FIG. 11D, Vbg_ibg and Vbg_iptat have the different slew rates. We use the different slew rates of Vbg_ibg and Vbg_iptat to generate the Vbg_ok with a comparator to generate the Comp_bgok signal. The Comp_bgok signal is masked with the Lv_mask signal for the Vdd still at the extreme low voltage to generate the ideal Vbg_ok signal for the whole Vdd, spanning from 0 volt to normal operation voltage. As shown in FIG. 11E, at the rising edge of Vdd_OK, the analog APOR is generated. Since Vbg_ibg and Vbg_iptat is PVT independent, APOR is independent of the PVT variation, too. The SOC needs to detect the extreme environmental conditions. So the camera is Triple-Modes Camera. The triple modes are surveillance camera mode, video camera mode and still camera mode. To have the surveillance camera mode, the APS (Active Pixel Sensor) needs to have the large dynamic range as shown in FIG. 12B. To have the large dynamic range, as shown in FIG. 12A, the Msvt uses the low threshold voltage (Vth) device which has the leakage current as shown in FIG. 12C and the capacitor Mhdr is made of the PMOS. As shown in FIG. 12A, as the light shines on the photo diode PD, the voltage VD discharges. The PMOS device Mhdr turns on and the capacitance increases as the VD voltages drops. It increase the dynamic range. Furthermore, as shown in FIG. 12C and FIG. 12D, as VD voltages drops, the VGS increases from the turn-off negative voltage to leaking voltage state. The VD voltage drops very slowly as the leakage occurs and the dynamic range is very large. It is noted that the reset voltage and the substrate voltage of PMOS might be programmed to be different voltage levels that the dynamic range can be programmed.

FIG. 12J is the architecture of the Triple-mode camera which has the APS array, parallel ADC array and the Counter Array. To speed up the operation of the Triple-Mode Camera, all the signal flows are pipelined design. As shown in FIG. 12E, FIG. 12F and FIG. 12G, the sampling operation of the bit line charging for the capacitor C1 and C2; the holding operation is for the parallel integrating ADC conversion.

As shown in FIG. 12G, FIG. 12H and FIG. 12J, the counter starts to count as the ADC operation begins. The counting number is converted to voltage with DAC. At the same time, the counter array also starts to count down as shown in FIG. 12H. As the ramp up DAC voltage is larger than the APS reset voltage, the comparator issues Stop_e or Stop_o command to stop the down count. At the same time, as shown in FIG. 12G, the bit line charges the capacitor C2 with the integrated signal read out voltage.

Then as shown in FIG. 12F, FIG. 12H and FIG. 12J, the counter starts to count up as the ADC operation begins. The counting number is converted to voltage with DAC. At the same time, the counter array also starts to count up as shown in FIG. 12H. As the ramp up DAC voltage is larger than the APS integrated signal voltage, the comparator issues Stop_e or Stop_o command to stop the up count. At the same time, as shown in FIG. 12F, the bit line charges the capacitor C1 with the reset voltage.

Furthermore, the camera can have the multiple sampling times option to increase the dynamic range. Using the T_globalcounter to count the total time, the count down only count once, later count up many times and the counting time uses the T_globalcounter times.

It is noted that to save the energy and reduce the chip noise, in the count down process, we can use a global Down_counter as shown by the dotted block in FIG. 12J. As the comparer triggers the stop or stopped signal, the register array Ro or Re of the counter array is loaded with the global count value into its register array. As shown in FIG. 12I and FIG. 12J, the pipeline of counter array is divided to be odd bank Ro and even bank Re. The counting array and reading out array are swapping alternatively. Since the counter array has a lot switching noise, the reading out array adopts the current mode sense amplifier.

The count down and count up is one way to implement the CDS (Correlative Double Sampling). The CDS principle can be applied to many different applications. As shown in FIG. 13 is an injecting plastic tube in SOC system. Just like the passive RFID (Radio Frequency Identification) tag does, as shown in FIG. 13A, the antenna 14at pumping up the voltage convert the RF energy to the electric energy, going through the diode 14dio and store on the capacitor 14cap. As the voltage is pumped up to be able switch on the switch device 14sw, the pump engine starts to pump. The injection tube 14tub might be clogged that the plastic tube 14tub will expand a little. To detect the minor expansion of the plastic tube 14tub, the LED light 14led shines on the mini-reflective mirror 14r. As the plastic tube 14tub expands, the mirror 14r moves to the position 14re. The reflected light of the LED 14led is no more shines on the sensor 14s, the light intensity is reduced that the output voltage of the sensor 14s is reduced, too. However, the system works in the open environment. The ambient light 14a shines on the sensor 14s, too. As shown in 13A, the ambient light intensity 14ai varies a lot. It is impossible to use the conventional measurement. It must use the CDS (Correlated Double Sampling). As shown in FIG. 13B, the sensor 14s samples the data twice successfully in a short period. At the second sampling time S2, the LED will light. The difference 14d of these two sample is the LED light strength. Comparing the difference 14d with the standard calibration table, we can decide whether the plastic tube 14tub is clogged and how much the plastic tube 14tub clog is. This SOC system has many other applications. For example, a patient has the blood pressure measurement wearing on the arm. The insulin pump 14pump wears on the waist. The blood pressure can issue the RF signal to trigger on the pump 14pump with the wireless trigger.

Figure 14A:
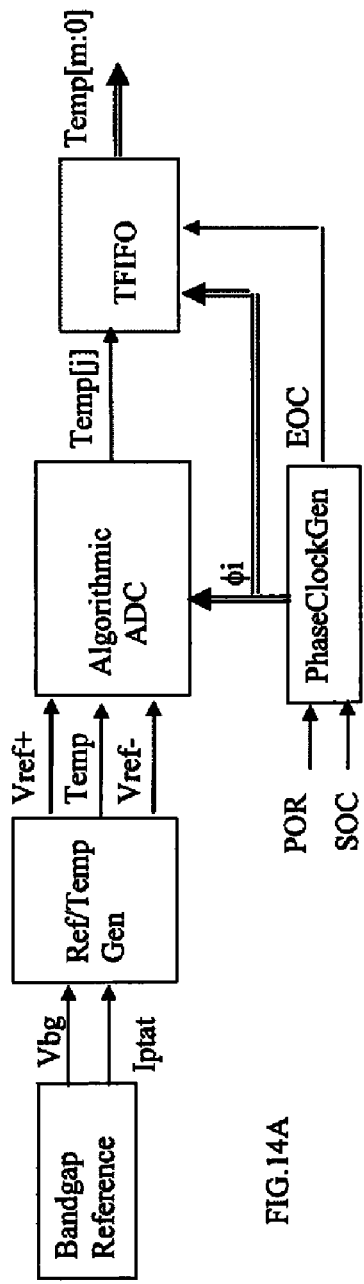
FIG. 14 is the digital temperature sensor for the temperature compensation in PVTANH design; (A) is the analog signal process of the architecture of the digital temperature sensor for the temperature compensation; (B) is the waveform of the timing diagram of the digital temperature sensor; (C) is the multi-phase clock generator of the digital temperature sensor; (D) is the SPC (Serial to Parallel Conversion) circuit for the algorithmic ADC or pipeline ADC.
Figure 14B:
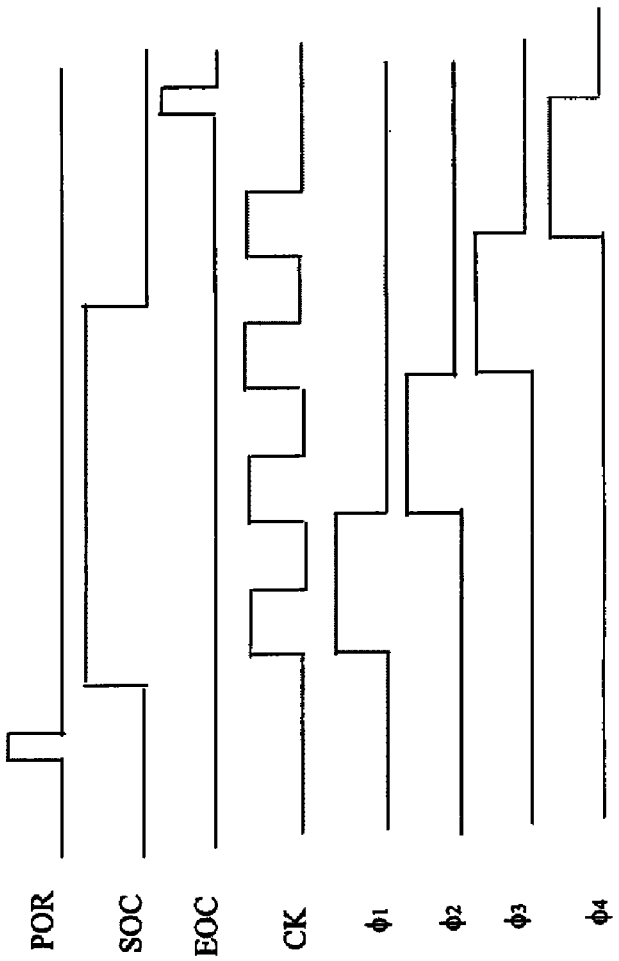
Figure 14C:
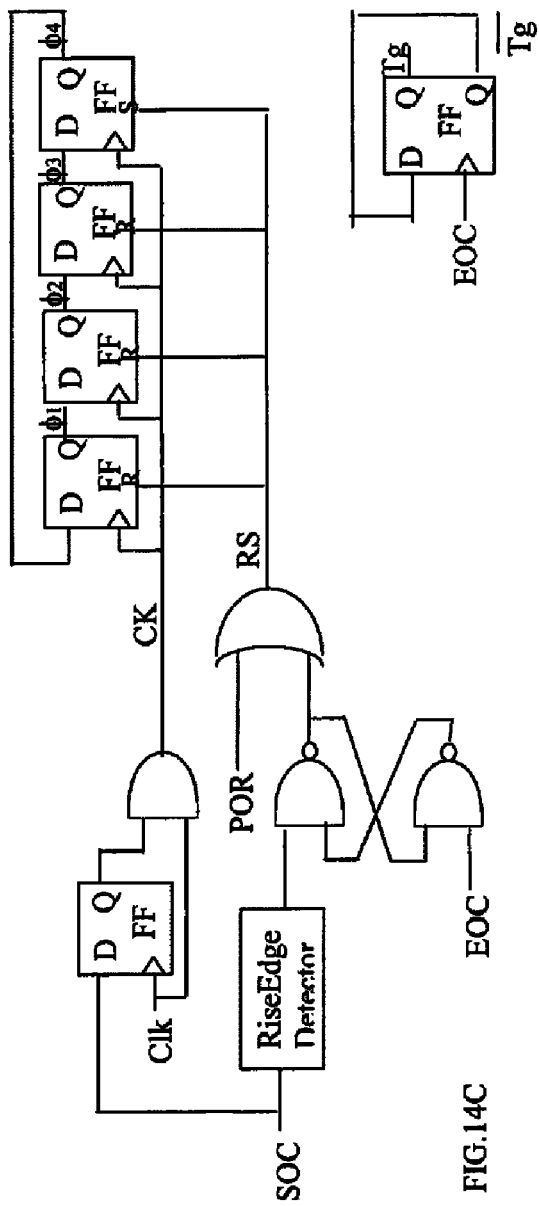
Figure 14D:
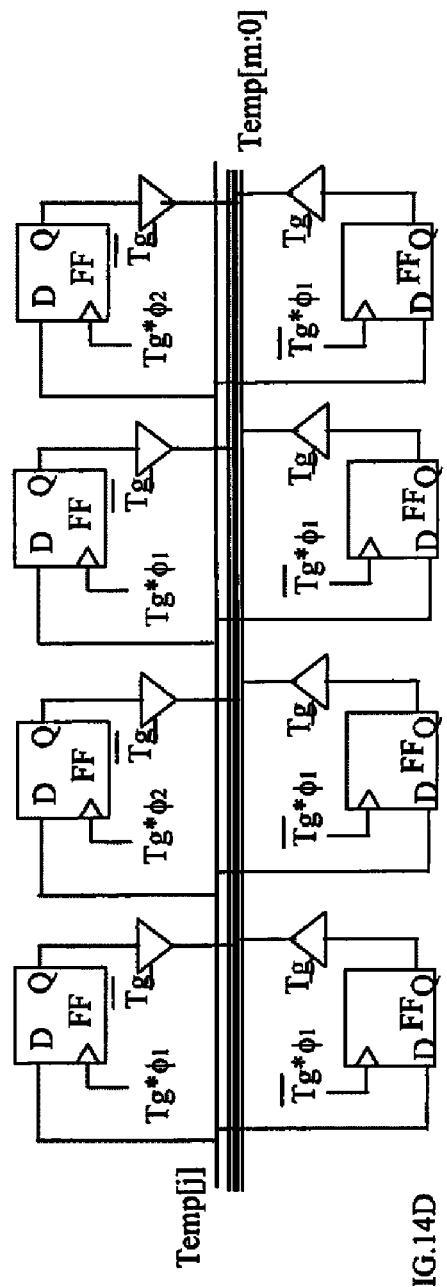

For the PVTANH design of TSOC, the temperature compensation is very important. For the nonlinear temperature compensation, we need to convert the analog voltage of the temperature measurement to the digital form. As shown in FIG. 14A, it is the on-chip temperature calibration. From the bandgap reference, we have the Vbg and Iptat. From the Vbg, we generate the vref+ and Vref− voltages. From Iptat, we generate the Temp which is the voltage representing the temperature. The Algorithmic ADC has the minimum chip area. As shown in FIG. 14A and FIG. 14D, to have the continuously update temperature and minimizing the switching noise, the serial data is converted to the parallel data with the TFIFO of toggling FIFO. As shown in FIG. 14A and FIG. 14C, the algorithmic ADC and toggling FIFO are driven with the phase clock generator PhaseClockGen. As shown in FIG. 14B is the timing waveform of the phase clock generator PhaseClockGen. The POR (Power On Reset) or SOC (Start Of Conversion) will reset the clock phases ~b1, ~2, dp3 and dp4. As long as a ADC conversion starts, this conversion will not stop until the currently executed ADC conversion finishes. As the ADC finishes, EOC (End Of Conversion) signal will be generated.

In toggling FIFO, the phase clock serves as the pointer to load the data directly into the register of its corresponding bit. One FIFO is engaged with the ADC and the other FIFO has the data been ready to read out any time. These two FIFOs toggling and swapping to changing the role of conversion and reading out. So, the most updated digital temperature is ready anytime.

While the invention has been particularly shown and described with reference to the preferred embodiments thereof, it will be understood by those skilled in the art that various changes in form and details may be made therein without departing from the spirit and scope of the invention.

The invention claimed is:

1. A Smart Mobile Sensor (SMS) of Service-Of-Community (SOC) apparatus comprises a mobile integrated unit which comprises a sensing an detecting means for sensing and detecting disasters, a monitoring and controlling means for monitoring and controlling disasters and a communicating and commanding means to notify and take action for the disasters;

wherein said sensing and detecting means senses and detects a disaster and sends information based on said disaster to said monitoring and controlling means and said communicating and commanding means;

said monitoring and controlling means and said communicating and commanding means are integrated in said integrated unit and said sensing and detecting means are directly connected to said monitoring and controlling means, and said communicating and commanding means act without need of human intervention;

said monitoring and controlling means receives information from the sensing and detecting means, and said sensing and detecting means sends information based on monitoring of said disasters to said communicating and commanding means; wherein said monitoring and controlling means activates a first set of devices according a first procedure;

after said communicating and commanding means receives a detected information, said communicating and commanding means communicates to an emergency location with a second set of devices according to a second preset procedure to warn the emergency location of said disaster;

said emergency location inspects and monitors information and sends commands to communicating and commanding means to pass commands to said monitoring an controlling means to take proper action;

wherein said sensing and detecting means, monitoring and controlling means, communicating and commanding means, are integrated in an integrated mobile unit;

further the sensing means, the detecting means, the monitoring means, the controlling means, the communicating means and the commanding means, are controlled by an oscillating circuit;

wherein the oscillating circuit comprises: an LC oscillator having common mode and amplitude control;

a common mode voltage detector for detecting a common mode voltage of oscillation of the LC oscillator with a first feedback control signal to control a charging current of said LC oscillator;

an amplitude voltage detector for detecting an amplitude voltage of oscillation of said LC oscillator with a second feedback control voltage to control discharge current of said LC oscillator;

wherein the common mode voltage detector comprises a peak voltage detector for detecting a peak voltage of said LC oscillator circuit, and using s first comparator for generating the first feedback control signal based on a comparison between said peak voltage and a peak reference voltage; and wherein the amplitude voltage detector comprises a valley voltage detector for detecting a valley voltage of said LC oscillator circuit, and using a second comparator for generating the second feedback control signal based on a comparison between said valley voltage and a valley reference voltage.

2. A SMS of SOC apparatus according to claim 1, wherein communicating and commanding means further comprises and auto-dial means, recording means and GPS device, wherein said GPS device indentifies a position of said disaster, and recording means stores a pre-recorded message, said communicating and commanding means use auto-dialing means to send the pre-recorded message together with the position of the disaster to said communicating and commanding means to broadcast to emergency locations.

3. A SMS of SOC apparatus according to claim 1 wherein said communicating and commanding means can be a phone, a wireless device, or an alarm device.

4. A SMS of SOC apparatus according to claim 1 wherein said monitoring and controlling means comprises a video camera.

5. A SMS of SOC apparatus according to claim 1, further comprising a plurality of supporting circuits to support the SOC apparatus.

6. A SMS of SOC apparatus according to claim 5 wherein the support circuits further comprise an RC oscillator:
- said RC oscillator having bang-bang operation with a first comparator comparing a voltage of a first capacitor an a second comparator which compares a voltage of a second capacitor, the first and second comparator operating alternatively;
- said bang-bang operation having the first capacitor charging with current injection and the second capacitor with a voltage holding at low voltage:
- said first or second comparators having a low voltage with a low current supply to save power when the other of first or second comparator is not in operation.

7. A SMS of SOC apparatus according to claim 5 further comprising a planar inductor.

8. An SMS of SOC apparatus according to claim 4 wherein the video camera further comprises a high dynamic range pixel cell:
- said high dynamic range pixel cell having a photo diode means for linear range operation and a first MOS device having leakage current and a second MOS device varying capacitance for nonlinear and saturation range operation;
- as the light shines on said photo diode, a stored pixel voltage discharges linearly, and turns on said second MOS device; and
- said discharged stored pixel voltage increases the capacitance of the second MOS device which causes the second MOS device to be the nonlinear which increases the dynamic range.

9. A SMS of SOC apparatus according to claim 8 wherein the video camera comprises a plurality of analog to digital converters (ADC) for correlation double sampling;
- wherein the plurality of ADC are connected in parallel;
- an digital to analog converter (DAC) counter connected to said plurality of ADC to convert an output of said ADC;
- wherein upon receiving a pixel voltage the ADC counts downward, and upon receiving a reset pixel voltage counts upward;
- wherein a difference between counting downward and counting upward being a light intensity of said pixel.

10. A SMS of SOC apparatus according to claim 9 of wherein said video camera further comprises first and second register files and a sensing amplifier:
- wherein the ADC writes into the first register file and the sensing amplifier reads current from the second register file;
- said first and second register files being alternatively written to and read during operation of said video camera.

11. A SMS of SOC apparatus according to claim 5 of which further comprising a Low Drop Voltage Regulator (LDVR):
- said LDVR comprising a push-pull switching output stage, a clamping output stage, a switching biasing stage, a clamping voltage generator, and a switching biasing generator;
- said push-pull switching output stage pushing and pulling an output;
- said clamping output stage clamping an output voltage of said output;
- according to an input voltage, said clamping voltage generator generating clamping voltages applied to said clamping output stage to clamp said output voltage of said output;
- said switching biasing stage generating biasing currents for said clamping output stage;
- said switching biasing generator controlling said switching biasing stage to generate said biasing currents for said clamping output stage.

12. A SMS of SOC apparatus according to claim 5 further comprising a pulse hybrid modulator (PHM):
- said PHM outputting a voltage variance to control a modulation frequency of a switch mode power supply;
- a PHM controller which measures a peak value and a valley value of an output voltage;
- wherein a difference of said peak value and valley value being said output voltage variance;
- comparing said output voltage variance with a plurality of reference voltages;
- wherein if said output voltage variance is larger than said reference voltages, a clock frequency of said PHM increases;
- and wherein if said output voltage variance is smaller than said reference voltages, a clock frequency of said PHM decreases.

* * * * *